(12) United States Patent  
Nakamura

(10) Patent No.: US 8,164,191 B2  
(45) Date of Patent: Apr. 24, 2012

(54) SEMICONDUCTOR DEVICE

(75) Inventor: Hirofumi Nakamura, Tokyo (JP)

(73) Assignee: Zycube Co., Ltd., Tokyo (JP)

(*) Notice: Subject to any disclaimer, the term of this patent is extended or adjusted under 35 U.S.C. 154(b) by 655 days.

(21) Appl. No.: 12/394,911

(22) Filed: Feb. 27, 2009

(65) Prior Publication Data  
US 2009/0256260 A1 Oct. 15, 2009

(30) Foreign Application Priority Data  
Feb. 27, 2008 (JP) ................................. 2008-046061

(51) Int. Cl.  
H01L 23/52 (2006.01)
(52) U.S. Cl. ............ 257/758; 257/431; 257/E23.141
(58) Field of Classification Search ............ 257/758, 257/E23.141, 431, 45, E29.324  
See application file for complete search history.

(56) References Cited

U.S. PATENT DOCUMENTS  
7,646,539 B2 * 1/2010 Itoi et al. ............... 359/619

FOREIGN PATENT DOCUMENTS  
JP 2006-128648 A 5/2006  
JP 2007-165496 A 6/2007

* cited by examiner

Primary Examiner — Roy Potter  
(74) Attorney, Agent, or Firm — Griffin & Szipl, P.C.

(57) ABSTRACT

A semiconductor device including a semiconductor element and a functional member fixed thereto with an adhesive film is provided, where the performance or reliability degradation due to moisture entered by way of the adhesive film itself or the interfaces between the adhesive film and members adjacent thereto can be suppressed with a simple structure. The semiconductor element has an active region for realizing a predetermined function, formed on a surface of the element. The functional member has a predetermined function and is fixed on a surface side of the semiconductor element with the adhesive film. A metal film covers a region including at least all outer side faces of the semiconductor element, all outer side faces of the adhesive film, an interface between the adhesive film and the semiconductor element, and an interface between the adhesive film and the functional member.

35 Claims, 42 Drawing Sheets

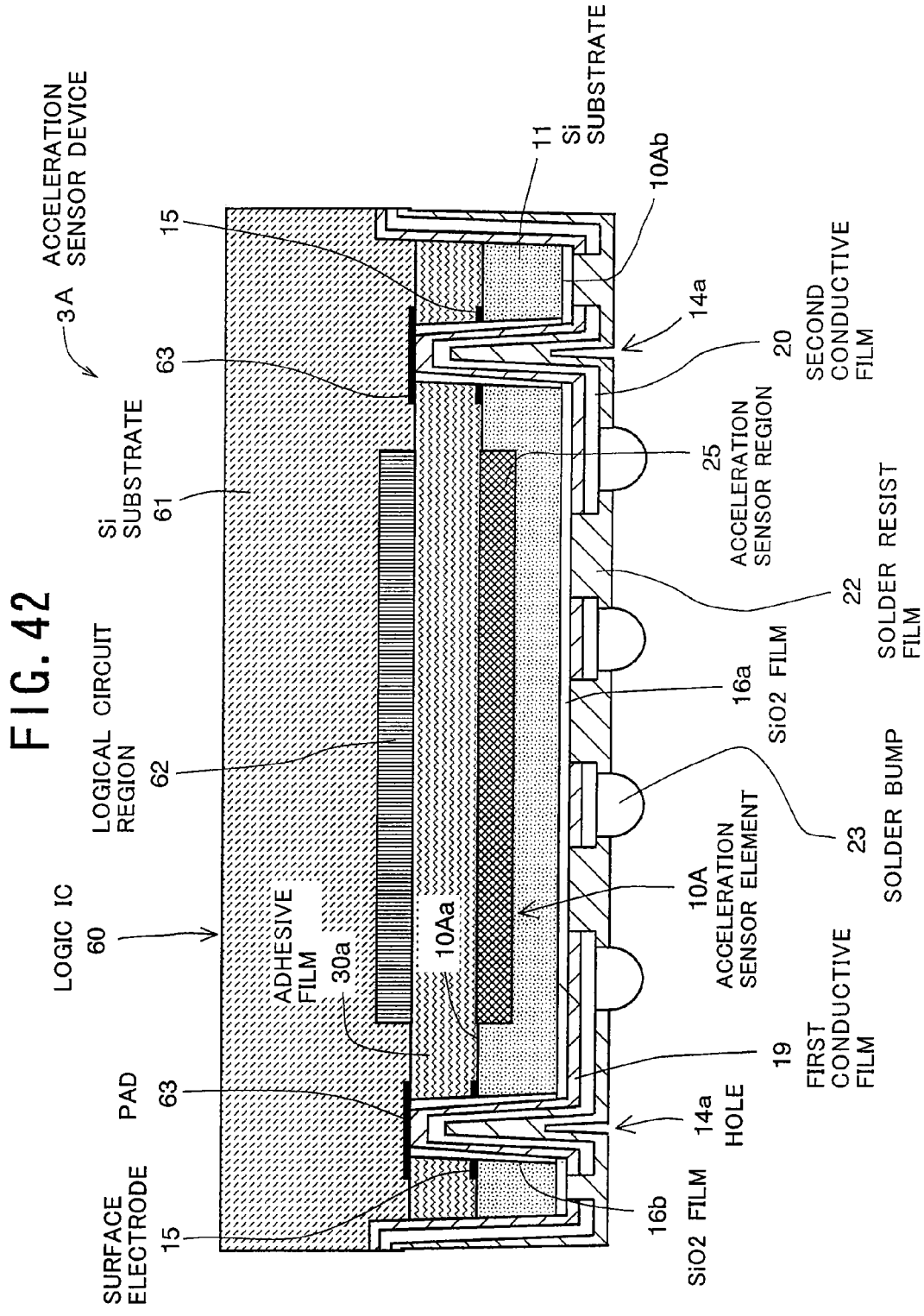

SEMICONDUCTOR DEVICE

This application claims priority from Japanese Patent Application No. 2008-046061, filed Feb. 27, 2008, the entire disclosure of which is incorporated herein by reference.

BACKGROUND OF THE INVENTION

1. Field of the Invention

The present invention relates to a semiconductor device and more particularly, to a semiconductor device including a semiconductor element and a functional member (e.g., a semiconductor element, a transparent cover, and so on) fixed to the semiconductor element with an adhesive film.

2. Description of the Related Art

In recent years, the solid-state image pickup device has been being miniaturized and highly functionalized furthermore. In connection with this, more and more solid-state image pickup devices have been mounted on portable equipment, such as cellular phones and portable computers, and automobiles. In this way, the application field of the solid-state image pickup device is spreading still more.

In general, the solid-state image pickup device has a structure comprising a chip-shaped solid-state image pickup element, a chip-shaped cover (for example, a protection cover such as a glass cover) through which light transmits (in other words, transparent or translucent), and a Chip-Size Package (CSP) that encapsulates or encloses the image pickup element and the cover, wherein incident light passing through the cover is irradiated to the light-receiving areas of the image pickup element. The electrodes of the image pickup element are electrically connected to external electrodes provided on the package. The electric signals generated by the image pickup element in response to the incident light are lead to the outside of the image pickup device by way of the external electrodes.

The solid-state image pickup device is divided into two types. One of the types is the cavity type that comprises a minute gap (i.e., a cavity or an air gap) between the image pickup surface of the solid-state image pickup element and the cover. The other is the cavity-less type that does not comprise the cavity.

The solid-state image pickup device with the cavity has an advantage that the incident light is not affected by the refractive index of the cavity. However, this device has a disadvantage that the package including the cover (or the cavity) needs to be sealed hermetically, and that there is a possibility that the hermeticity degrades due to expansion and contraction of the gas existing in the cavity.

Unlike this, the solid-state image pickup device without the cavity (i.e., the cavity-less type solid-state image pickup device) needs not the above-described hermetic seal. However, this device requires attention to selection of a material placed between the image pickup surface and the cover (which may be termed an intermediate material). For example, it is necessary that the refractive index of the intermediate material is made as low as possible to bring it nearer to the refractive index (=1) of the air. In addition, to prevent the breakage of this device caused by the differences among the thermal expansion coefficients of the intermediate material, silicon and/or silicon dioxide that constitutes the image pickup element, and the transparent cover, it is necessary to consider the thermal expansion coefficient of the intermediate material, and the adhesion property or strength between the intermediate material and the cover. Moreover, if the hygroscopic property of the intermediate material is high, the image pickup element is likely to be affected badly by the moisture, which means that attention needs to be paid to the hygroscopic property.

By the way, the solid-state image pickup device with the hermetic-sealed cavity may comprise external electrodes on the back (i.e., the surface opposite to the cover) of the image pickup element. The electrical interconnection between these external electrodes and the electrodes formed on the surface of the chip-shaped image pickup element is often carried out using buried interconnection lines that penetrate through the silicon substrate of the image pickup element from its surface to its back. It is usual that the adhesion of the transparent cover (i.e., the protection member) to the surface of the image pickup element is performed using an adhesive made of synthetic resin.

A solid-stage image pickup device as a related-art technique relevant to the present invention is disclosed in the Patent Document 1 (the Japanese Non-Examined Patent Publication No. 2006-128648) published in 2006. This solid-state image pickup device comprises a wafer-level sensor body including sensor bodies arranged thereon with a dicing area; a corridor-shaped sealing frame placed in the an outside region of an active surface of each of the sensor bodies; and a wafer-size protecting material fixed to the wafer-level sensor body in such a way as to be opposed to the active surfaces of the respective sensor bodies by way of gaps. Each of the sensor bodies comprises terminals formed on an opposite surface of the active surface thereof and connected electrically thereto by way of penetrating vias. (See claim 1, FIGS. 1 to 2, and Paragraphs 0012 to 0016.)

When the wafer-level image pickup device of the Patent Document 1 is divided in the dicing area in such a way that the respective sensor bodies are separated from each other, chip-shaped image pickup devices are fabricated. With this chip-shaped image pickup device, as described above, the electrical connection between the electrodes formed on the surface of the chip-shaped image pickup device and the external electrodes formed on the back thereof is realized using the penetrating vias (i.e., buried interconnection lines) that penetrate through the chip-shaped image pickup device from its surface to its back. In addition, the adhesion of the sealing frame (i.e., cover) to the surface of the image pickup device is carried out using the sealing frame itself which is made of synthetic resin.

A sensor package as another related-art technique relevant to the present invention is disclosed in the Patent Document 2 (the Japanese Non-Examined Patent Publication No. 2007-165496) published in 2007. This sensor package comprises a sensor body having an active surface, a protecting material superposed on the sensor body to be in surface contact therewith in a periphery of the active surface in such a way that a gap is formed between the protecting material and the active surface; a connecting member fixed to the sensor body and the protecting material, on a side face of a stack of the sensor body and the protecting material, in such a way as to span over the sensor body and the protecting material, thereby hermetically sealing the gap; a minute penetrating hole formed to reach a part of the protecting material, which is opposed to the gap; and a blocking member located in the minute penetrating hole. (See claim 1, FIGS. 1 to 3, and Paragraphs 0009 to 0016.)

With the sensor package of the Patent Document 2, as described above, the electrical connection between the electrodes formed on the surface of the chip-shaped solid-state image pickup element and the external electrodes formed on the back thereof is performed by using the penetrating vias (i.e., buried interconnection lines) that penetrate through the image pickup element from its surface to its back. However, the fixing of the protecting material (i.e., cover) to the surface of the image pickup element is performed by using the connecting member fixed to the sensor body and the protecting material in such a way as to span over them on the side face of the stack. Therefore, the sensor package of the Patent Document 2 has a different structure from the above-described structure. This connecting member has a multilayer structure comprising a metal layer (e.g., a Au/Ti layer) formed on the side face of the stack, and a brazing material layer (e.g., a Sn—Au alloy layer), where any adhesive made of synthetic resin is not used.

With the hermetic-sealed solid-state image pickup device having the above-described structure, there is a problem that the moisture existing in the air enters gradually the inside of the cavity by way of the adhesive made of synthetic resin and as a result, the image-pickup performance degradation occurs because of the phenomenon that the cover and/or the image pickup surface is/are fogged or clouded due to the moisture thus entered.

To solve this problem, a metallic connecting member like the connecting member disclosed in the Patent Document 2 may be used. In this case, however, there arises a difficulty that not only the fabrication process steps are increased and complicated but also the fabrication cost is raised. Furthermore, because such the metallic connecting member is formed on the side face of the stack of the image pickup element and the protecting member (i.e., cover), this connecting member cannot be made by using the fabrication process steps that fabricate many solid-state image pickup devices in a lump where the covers are attached to the solid-state image pickup elements in a wafer level (i.e., on a wafer) and thereafter, the stack of the image pickup elements and the covers in a wafer level is divided into pieces by dicing, resulting in the solid-state image pickup devices. The said metallic connecting member needs to be formed after the image pickup elements on the wafer are separated by dicing. Thus, there is another difficulty that the fabrication process steps are highly disadvantageous.

The above-described difficulties or problems may occur not only in the solid-state image pickup devices but also any other types of the semiconductor device that comprises a semiconductor element and a functional member (e.g., another semiconductor element with a different function from the image pickup function, a transparent cover, and so on) fixed to the said semiconductor element with an adhesive film. This is because if moisture enters the inside of the cavity, the insulation property of the semiconductor device deteriorates, raising a problem of reliability decrease.

Moreover, even with the cavity-less semiconductor device, moisture may enter the inside of the semiconductor device by way of the adhesive film itself or the interface between the adhesive film and the member adjacent thereto. In this case, the reliability may degrade due to the moisture thus entered. Therefore, there is a possibility that the above-described problem relating to the reliability occurs in the cavity-less semiconductor device also.

SUMMARY OF THE INVENTION

The present invention was created in consideration of such the circumstances as above.

An object of the present invention is to provide a semiconductor device comprising a semiconductor element and a functional member (e.g., another semiconductor element with a different function, a transparent cover, and so on) fixed to the said semiconductor element with an adhesive film, where the performance or reliability degradation due to moisture entered by way of the adhesive film itself or the interfaces between the adhesive film and members adjacent thereto can be suppressed with a simple structure.

Another object of the present invention is to provide a semiconductor device that can be fabricated in such a way that almost no process step is added to the conventional fabrication process steps of a semiconductor device of this type in the wafer level and almost no change is applied thereto.

The above objects together with others not specifically mentioned will become clear to those skilled in the art from the following description.

A semiconductor device according to the first aspect of the present invention comprises:

a semiconductor element having an active region for realizing a predetermined function, the active region being formed on a surface of the semiconductor element;

a functional member having a predetermined function, fixed on a surface side of the semiconductor element with an adhesive film; and a metal film covering a region including at least all outer side faces of the semiconductor element, all outer side faces of the adhesive film, an interface between the adhesive film and the semiconductor element, and an interface between the adhesive film and the functional member.

With the semiconductor device according to the first aspect of the present invention, as described above, the semiconductor element and the functional member fixed on the surface side of the semiconductor element with the adhesive film are provided. The metal film covers the region including at least all the outer side faces of the semiconductor element, all the outer side faces of the adhesive film, the interface between the adhesive film and the semiconductor element, and the interface between the adhesive film and the functional member. Therefore, the possibility that moisture existing in the air enters the inside of the semiconductor device by way of the adhesive film itself or the interfaces between the adhesive film and the members adjacent thereto is eliminated. This means that the performance or reliability degradation of the semiconductor device due to the moisture thus entered can be suppressed.

The metal film may be termed the "metal film for moisture entry prevention", because it has the above-described operation.

Moreover, to realize the moisture entry prevention, it is sufficient for the semiconductor device to include the metal film formed in such a way as to cover the region including at least all the outer side faces of the semiconductor element, all the outer side faces of the adhesive film, the interface between the adhesive film and the semiconductor element, and the interface between the adhesive film and the functional member. Therefore, the structure of the semiconductor device is not complicated, in other words, this semiconductor device has a simple structure.

Regarding the fabrication process steps, first, a semiconductor wafer including the semiconductor devices and a functional member wafer for providing the functional members are adhered to be united and then, grooves are formed in the semiconductor wafer from its back in such a way as to reach the inside of the functional member wafer and to be superposed on predetermined scribe lines. Thereafter, a metal film, which is used for forming wiring lines and/or electrodes on the back of the semiconductor element, is formed. This metal film may be termed the "metal film for wiring lines/electrodes". In this step of forming the metal film for wiring lines/electrodes, the metal film for moisture entry prevention can be realized as desired by simply forming the metal film for wiring lines/electrodes so as to extend the insides of the grooves. For this reason, the semiconductor device can be fabricated by simply changing the mask pattern (i.e., shape) for the metal film for wiring lines/electrodes. Accordingly, it is unnecessary to newly add the process step of forming the metal film for moisture entry prevention and to change the materials and processes used for fabricating a semiconductor device of this type.

As described above, in the semiconductor device comprising the semiconductor element and the functional member fixed thereto with the adhesive film, the performance or reliability degradation due to the moisture entered by way of the adhesive film itself or the interfaces between the adhesive film and the members adjacent thereto can be suppressed with a simple structure. Moreover, the said semiconductor device can be fabricated in such a way that almost no process step is added to the conventional fabrication process steps of a semiconductor device of this type in a wafer level and almost no change is applied thereto.

In a preferred embodiment of the semiconductor device according to the first aspect of the present invention, wiring lines or electrodes are formed on a back side of the semiconductor element. The wiring lines or electrodes are electrically connected to the active region of the semiconductor element by way of buried interconnection lines formed in penetrating holes that penetrate through the semiconductor element from its surface to its back. The metal film (which is used for moisture entry prevention) is formed by utilizing a metal film used for forming the wiring lines or electrodes (i.e., the metal film for wiring lines/electrodes).

In another preferred embodiment of the semiconductor device according to the first aspect of the present invention, wiring lines or electrodes are formed on a back side of the semiconductor element. The functional member comprises an active region for realizing a predetermined function. The wiring lines or electrodes are electrically connected to the active region of the functional member by way of buried interconnection lines formed in penetrating holes that penetrate through the semiconductor element and the adhesive film. The metal film (which is used for moisture entry prevention) is formed by utilizing a metal film used for forming the wiring lines or electrodes (i.e., the metal film for wiring lines/electrodes).

In still another preferred embodiment of the semiconductor device according to the first aspect of the present invention, the metal film (for moisture entry prevention) is one selected from the group consisting of a copper (Cu) film, a titanium (Ti) film, a chromium (Cr) film, a tantalum (Ta) film, and a tungsten (W) film. These films may be formed by sputtering or CVD (Chemical Vapor Deposition).

In a further preferred embodiment of the semiconductor device according to the first aspect of the present invention, the metal film (for moisture entry prevention) is one selected from the group consisting of a two-layer film formed by a titanium (Ti) subfilm and a copper (Cu) subfilm (a Ti—Cu two-layer film), a two-layer film formed by a chromium (Cr) subfilm and a copper (Cu) subfilm (a Cr—Cu two-layer film), a two-layer film formed by a tantalum (Ta) subfilm and a copper (Cu) subfilm (a Ta—Cu two-layer film), and a two-layer film formed by a tungsten (W) subfilm and a copper (Cu) subfilm (a W—Cu two-layer film). These subfilms may be formed by sputtering or CVD.

In still further preferred embodiment of the semiconductor device according to the first aspect of the present invention, the metal film (for moisture entry prevention) is one selected from the group consisting of a three-layer film formed by a titanium (Ti) subfilm, a titanium nitride (TiN) subfilm, and a copper (Cu) subfilm (a Ti—TiN—Cu three-layer film); a three-layer film formed by a tantalum (Ta) subfilm, a tantalum nitride (TaN) subfilm, and a copper (Cu) subfilm (a Ta—TaN—Cu three-layer film); and a three-layer film formed by a tungsten (W) subfilm, a tungsten nitride (WN) subfilm, and a copper (Cu) subfilm (a W—WN—Cu three-layer film). These subfilms may be formed by sputtering or CVD.

In a still further preferred embodiment of the semiconductor device according to the first aspect of the present invention, the metal film (for moisture entry prevention) comprises an end portion that extends along the outer side faces of the semiconductor element and the outer side faces of the adhesive film; and the end portion reaches an inside of the functional member.

In a still further preferred embodiment of the semiconductor device according to the first aspect of the present invention, the metal film (for moisture entry prevention) comprises an end portion that extends along the outer side faces of the semiconductor element and the outer side faces of the adhesive film; and the end portion reaches a surface of the functional member located on a side of the semiconductor element but does not reach an inside of the functional member.

In a still further preferred embodiment of the semiconductor device according to the first aspect of the present invention, the metal film (for moisture entry prevention) is in contact with a semiconductor substrate of the semiconductor element on the outer surfaces thereof.

In a still further preferred embodiment of the semiconductor device according to the first aspect of the present invention, an insulating film that covers all the outer faces of the semiconductor element is formed. The metal film (for moisture entry prevention) is placed on the insulating film and is apart from a semiconductor substrate of the semiconductor element on the outer surfaces thereof.

In a still further preferred embodiment of the semiconductor device according to the first aspect of the present invention, a cavity surrounded by the adhesive film is formed between the semiconductor element and the functional member.

In a still further preferred embodiment of the semiconductor device according to the first aspect of the present invention, a gap between the semiconductor element and the functional member is filled with the adhesive film.

In a still further preferred embodiment of the semiconductor device according to the first aspect of the present invention, the semiconductor element is a solid-state image pickup element, and the functional member is a cover through which light passes.

In a still further preferred embodiment of the semiconductor device according to the first aspect of the present invention, the semiconductor element is an acceleration sensor element, and the functional member is a logic Integrated Circuit (IC).

A semiconductor device according to the second aspect of the present invention comprises:

a semiconductor element having an active region for realizing an image pickup function, the active region being formed on a surface of the semiconductor element;

a functional member having a function as a cover through which light passes, the functional member being fixed on a surface side of the semiconductor element with an adhesive film;

wiring lines or electrodes formed on a back side of the semiconductor element;

buried interconnection lines making electrical interconnection between the wiring lines or electrodes and the active region of the semiconductor element, the buried interconnection lines being formed in penetrating holes that penetrate through the semiconductor element from its surface to its back; and a metal film covering a region including at least all outer side faces of the semiconductor element, all outer side faces of the adhesive film, an interface between the adhesive film and the semiconductor element, and an interface between the adhesive film and the functional member;

wherein the metal film is formed by utilizing a metal film used for forming the wiring lines or electrodes.

With the semiconductor device according to the second aspect of the present invention, as described above, the semiconductor element with the image pickup function, the functional member with the cover function fixed on the surface side of the semiconductor element with the adhesive film, the wiring lines or electrodes formed on the back side of the semiconductor element, and the buried interconnection lines for making electrical interconnection between the wiring lines or electrodes and the active region of the semiconductor element are provided, where the buried interconnection lines are formed in the penetrating holes that penetrate through the semiconductor element from its surface to its back are provided. The metal film (which is used for moisture entry prevention) covers the region including at least all the outer side faces of the semiconductor element, all the outer side faces of the adhesive film, the interface between the adhesive film and the semiconductor element, and the interface between the adhesive film and the functional member.

Therefore, the possibility that moisture existing in the air enters the inside of the semiconductor device by way of the adhesive film itself or the interfaces between the adhesive film and the members adjacent thereto is eliminated. This means that the performance or reliability degradation of the semiconductor device due to the moisture thus entered can be suppressed.

Moreover, to realize the moisture entry prevention, it is sufficient for the semiconductor device to include the metal film (for moisture entry prevention) formed in such a way as to cover the region including at least all the outer side faces of the semiconductor element, all the outer side faces of the adhesive film, the interface between the adhesive film and the semiconductor element, and the interface between the adhesive film and the functional member. Therefore, the structure of the semiconductor device is not complicated, in other words, this semiconductor device has a simple structure.

Regarding the fabrication process steps, first, a semiconductor wafer including the semiconductor devices and a functional member wafer for providing the functional members are adhered to be united and then, grooves are formed in the semiconductor wafer from the back thereof in such a way as to reach the inside of the functional member wafer and to be superposed on predetermined scribe lines. Thereafter, a metal film, which is used for forming wiring lines and/or electrodes on the back of the semiconductor device, is formed. In the step of forming the metal film for wiring lines/electrodes, the metal film for moisture entry prevention can be realized as desired by simply forming the metal film for wiring lines/electrodes so as to extend the insides of the grooves. For this reason, the semiconductor device can be fabricated by simply changing the mask pattern (i.e., shape) for the metal film for wiring lines/electrodes. Accordingly, it is unnecessary to newly add the process step of forming the metal film for moisture entry prevention and to change the materials and processes used for fabricating a semiconductor device of this type.

As described above, in the semiconductor device comprising the semiconductor element and the functional member fixed thereto with the adhesive film, the performance or reliability degradation due to the moisture entered by way of the adhesive film itself or the interfaces between the adhesive film and the members adjacent thereto can be suppressed with a simple structure. Moreover, the semiconductor device can be fabricated in such a way that almost no process step is added to the conventional fabrication process steps of a semiconductor device of this type in the wafer level and almost no change is applied thereto.

A semiconductor device according to the third aspect of the present invention comprises:

a semiconductor element having an active region for realizing a predetermined function, the active region being formed on a surface of the semiconductor element;

a functional member having an active region for realizing a predetermined circuit function, the functional member being fixed on a surface side of the semiconductor element with an adhesive film;

wiring lines or electrodes formed on a back side of the semiconductor element;

buried interconnection lines making electrical interconnection between the wiring lines or electrodes and the active region of the functional member, the buried interconnection lines being formed in penetrating holes that penetrate through the semiconductor element and the adhesive film; and a metal film covering a region including at least all outer side faces of the semiconductor element, all outer side faces of the adhesive film, an interface between the adhesive film and the semiconductor element, and an interface between the adhesive film and the functional member;

wherein the metal film is formed by utilizing a metal film used for forming the wiring lines or electrodes.

With the semiconductor device according to the third aspect of the present invention, as described above, the semiconductor element with the predetermined function, the functional member with the predetermined circuit function fixed on the surface side of the semiconductor element with the adhesive film, the wiring lines or electrodes formed on the back side of the semiconductor element, and the buried interconnection lines for making electrical interconnection between the wiring lines or electrodes and the active region of the functional member are provided, where the buried interconnection lines are formed in the penetrating holes that penetrate through the semiconductor element and the adhesive film. The metal film (which is used for moisture entry prevention) covers the region including at least all the outer side faces of the semiconductor element, all the outer side faces of the adhesive film, the interface between the adhesive film and the semiconductor element, and the interface between the adhesive film and the functional member.

Therefore, the possibility that moisture existing in the air enters the inside of the semiconductor device by way of the adhesive film itself or the interface between the adhesive film and the members adjacent thereto is eliminated. This means that the performance or reliability degradation of the semiconductor device due to the moisture thus entered can be suppressed.

Moreover, to realize the moisture entry prevention, it is sufficient for the semiconductor device to include the metal film (for moisture entry prevention) formed in such a way as to cover the region including at least all the outer side faces of the semiconductor element, all the outer side faces of the adhesive film, the interface between the adhesive film and the semiconductor element, and the interface between the adhesive film and the functional member. Therefore, the structure of the semiconductor device is not complicated, in other words, this semiconductor device has a simple structure.

Regarding the fabrication process steps, first, a semiconductor wafer including the semiconductor devices and a functional member wafer for providing the functional members are adhered to be united and then, grooves are formed in the semiconductor wafer from the back thereof in such a way as to reach the inside of the functional member wafer and to be superposed on predetermined scribe lines. Thereafter, a metal film, which is used for forming wiring lines and/or electrodes on the back of the semiconductor device, is formed. In the step of forming the metal film for wiring lines/electrodes, the metal film for moisture entry prevention can be realized as desired by simply forming the metal film for wiring lines/electrodes so as to extend the insides of the grooves. For this reason, the semiconductor device can be fabricated by simply changing the mask pattern (shape) for the metal film for wiring lines/electrodes. Accordingly, it is unnecessary to newly add the process step of forming the metal film for moisture entry prevention and to change the materials and processes used for fabricating a semiconductor device of this type.

As described above, in the semiconductor device comprising the semiconductor element and the functional member fixed thereto with the adhesive film, the performance or reliability degradation due to the moisture entered by way of the adhesive film itself or the interfaces between the adhesive film and the members adjacent thereto can be suppressed with a simple structure. Moreover, the semiconductor device can be fabricated in such a way that almost no process step is added to the conventional fabrication process steps of a semiconductor device of this type in a wafer level and almost no change is applied thereto.

In a preferred embodiment of the semiconductor device according to the second or third aspect of the present invention, the metal film (for moisture entry prevention) is one selected from the group consisting of a copper (Cu) film, a titanium (Ti) film, a chromium (Cr) film, a tantalum (Ta) film, and a tungsten (W) film. These films may be formed by sputtering or CVD.

In another preferred embodiment of the semiconductor device according to the second or third aspect of the present invention, the metal film (for moisture entry prevention) is one selected from the group consisting of a two-layer film formed by a titanium (Ti) subfilm and a copper (Cu) subfilm, a two-layer film formed by a chromium (Cr) subfilm and a copper (Cu) subfilm, a two-layer film formed by a tantalum (Ta) subfilm and a copper (Cu) subfilm, and a two-layer film formed by a tungsten (W) subfilm and a copper (Cu) subfilm. These subfilms may be formed by sputtering or CVD.

In still another preferred embodiment of the semiconductor device according to the second or third aspect of the present invention, the metal film (for moisture entry prevention) is one selected from the group consisting of a three-layer film formed by a titanium (Ti) subfilm, a titanium nitride (TiN) subfilm, and a copper (Cu) subfilm; a three-layer film formed by a tantalum (Ta) subfilm, a tantalum nitride (TaN) subfilm, and a copper (Cu) subfilm; and a three-layer film formed by a tungsten (W) subfilm, a tungsten nitride (WN) subfilm, and a copper (Cu) subfilm. These subfilms may be formed by sputtering or CVD.

In a further preferred embodiment of the semiconductor device according to the second or third aspect of the present invention, the metal film (for moisture entry prevention) comprises an end portion that extends along the outer side faces of the semiconductor element and the outer side faces of the adhesive film; and the end portion reaches an inside of the functional member.

In a still further preferred embodiment of the semiconductor device according to the second or third aspect of the present invention, the metal film (for moisture entry prevention) comprises an end portion that extends along the outer side faces of the semiconductor element and the outer side faces of the adhesive film; and the end portion reaches a surface of the functional member located on a side of the semiconductor element but does not reach an inside of the functional member.

In a still further preferred embodiment of the semiconductor device according to the second or third aspect of the present invention, the metal film (for moisture entry prevention) is in contact with a semiconductor substrate of the semiconductor element on the outer surfaces thereof.

In a still further preferred embodiment of the semiconductor device according to the second or third aspect of the present invention, an insulating film that covers all the outer faces of the semiconductor element is formed. The metal film (for moisture entry prevention) is placed on the insulating film and is apart from a semiconductor substrate of the semiconductor element on the outer surfaces thereof.

In a still further preferred embodiment of the semiconductor device according to the second or third aspect of the present invention, a cavity surrounded by the adhesive film is formed between the semiconductor element and the functional member.

In a still further preferred embodiment of the semiconductor device according to the second or third aspect of the present invention, a gap between the semiconductor element and the functional member is filled with the adhesive film.

In a still further preferred embodiment of the semiconductor device according to the third aspect of the present invention, the semiconductor element is an acceleration sensor element, and the functional member is a logic IC.

BRIEF DESCRIPTION OF THE DRAWINGS

In order that the present invention may be readily carried into effect, it will now be described with reference to the accompanying drawings.

FIG. 42 is a cross-sectional view showing the schematic structure of a semiconductor device (which is configured as an acceleration sensor device) according to the sixth embodiment of the present invention.

DETAILED DESCRIPTION OF THE PREFERRED EMBODIMENTS

Figure 1:
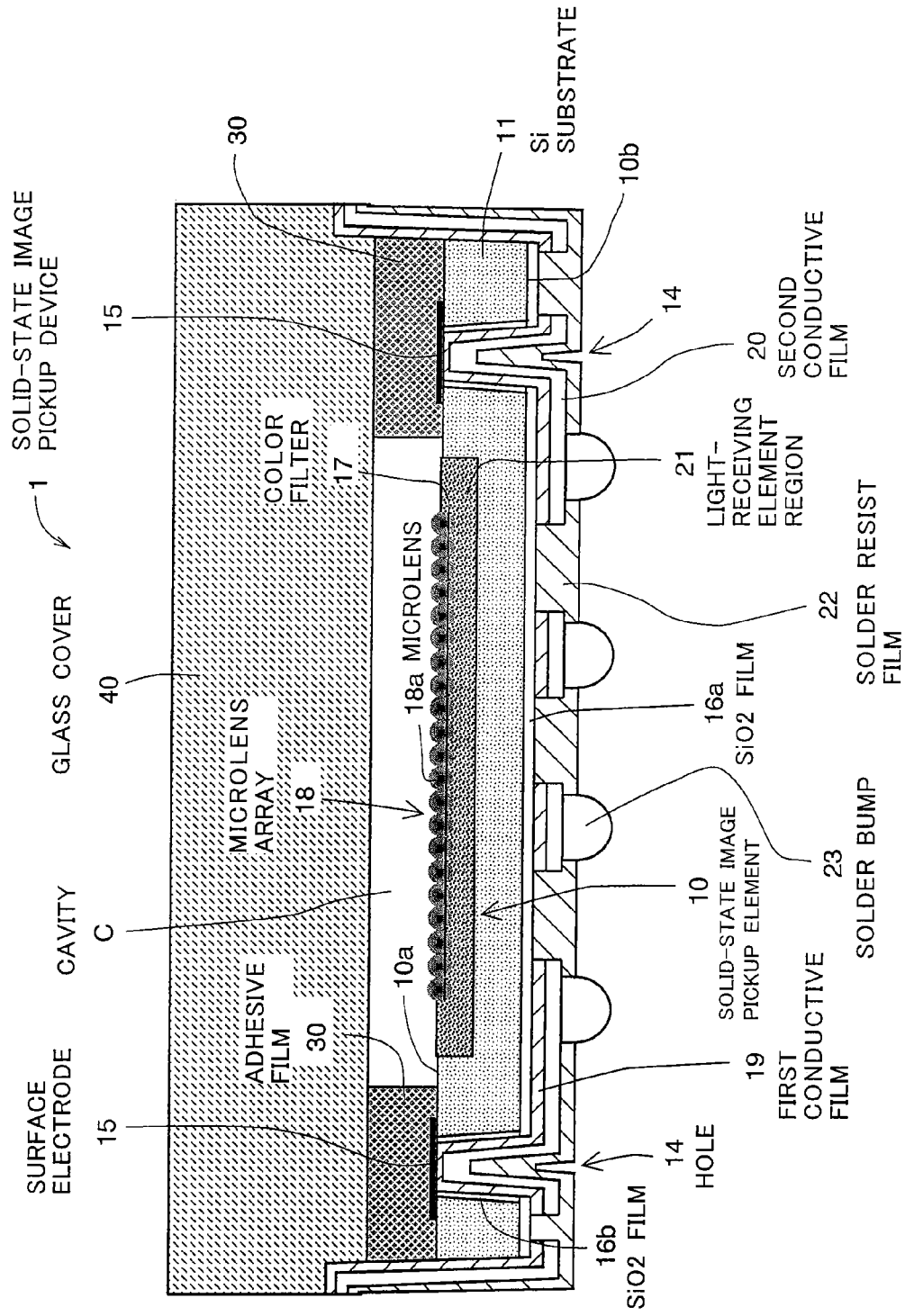
FIG. 1 is a cross-sectional view showing the schematic structure of a semiconductor device (which is configured as a solid-state image pickup device) according to the first embodiment of the present invention.

Preferred embodiments of the present invention will be described in detail below while referring to the drawings attached.

First Embodiment

Figure 2:
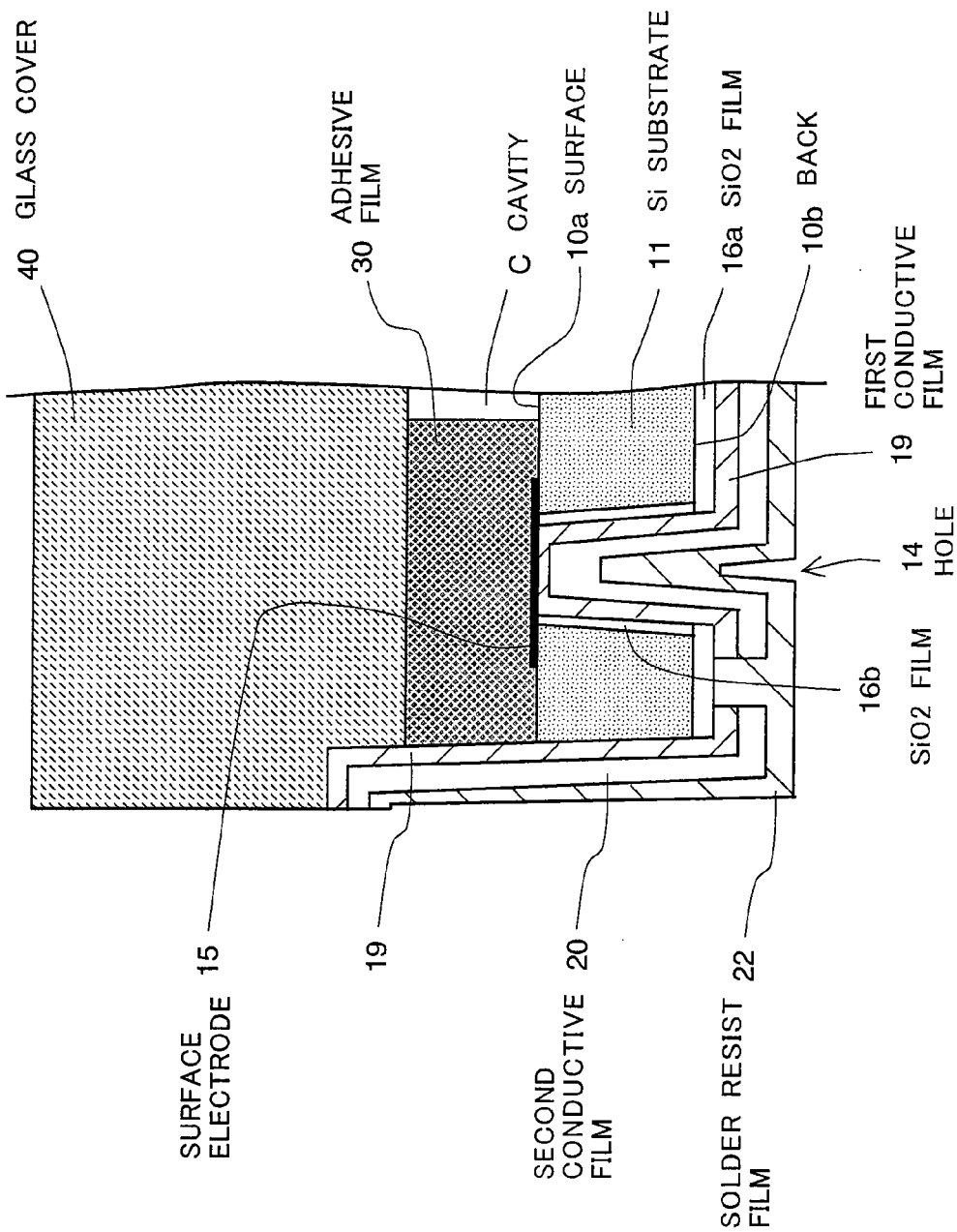
FIG. 2 is a partial, enlarged cross-sectional view of an end of the semiconductor device (solid-state image pickup device) according to the first embodiment of the present invention.
Figure 3:
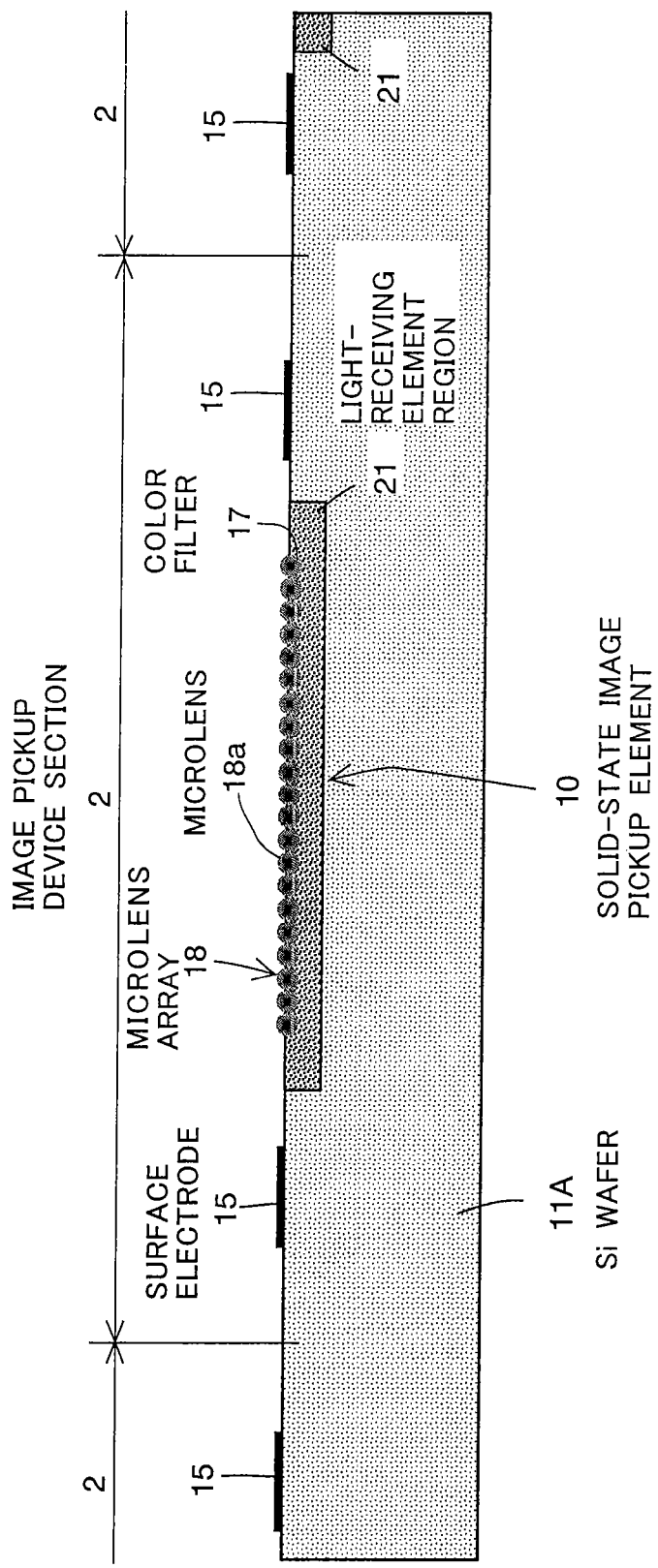
FIG. 3 is a partial cross-sectional view showing the process step of a method of fabricating the semiconductor device (solid-state image pickup device) according to the first embodiment of the present invention.
Figure 18:
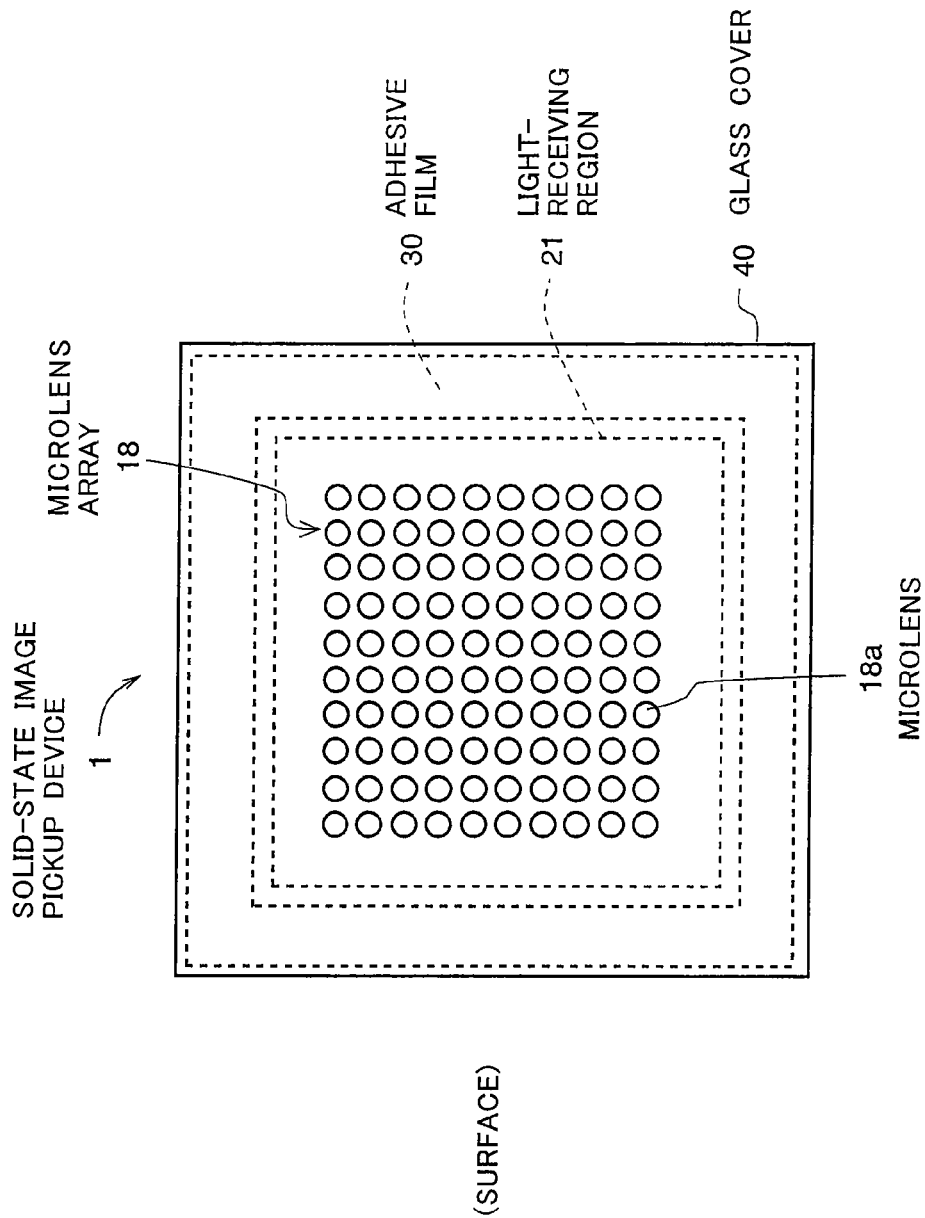
FIG. 18 is a schematic top view of the semiconductor device (solid-state image pickup device) according to the first embodiment of the present invention.
Figure 19:
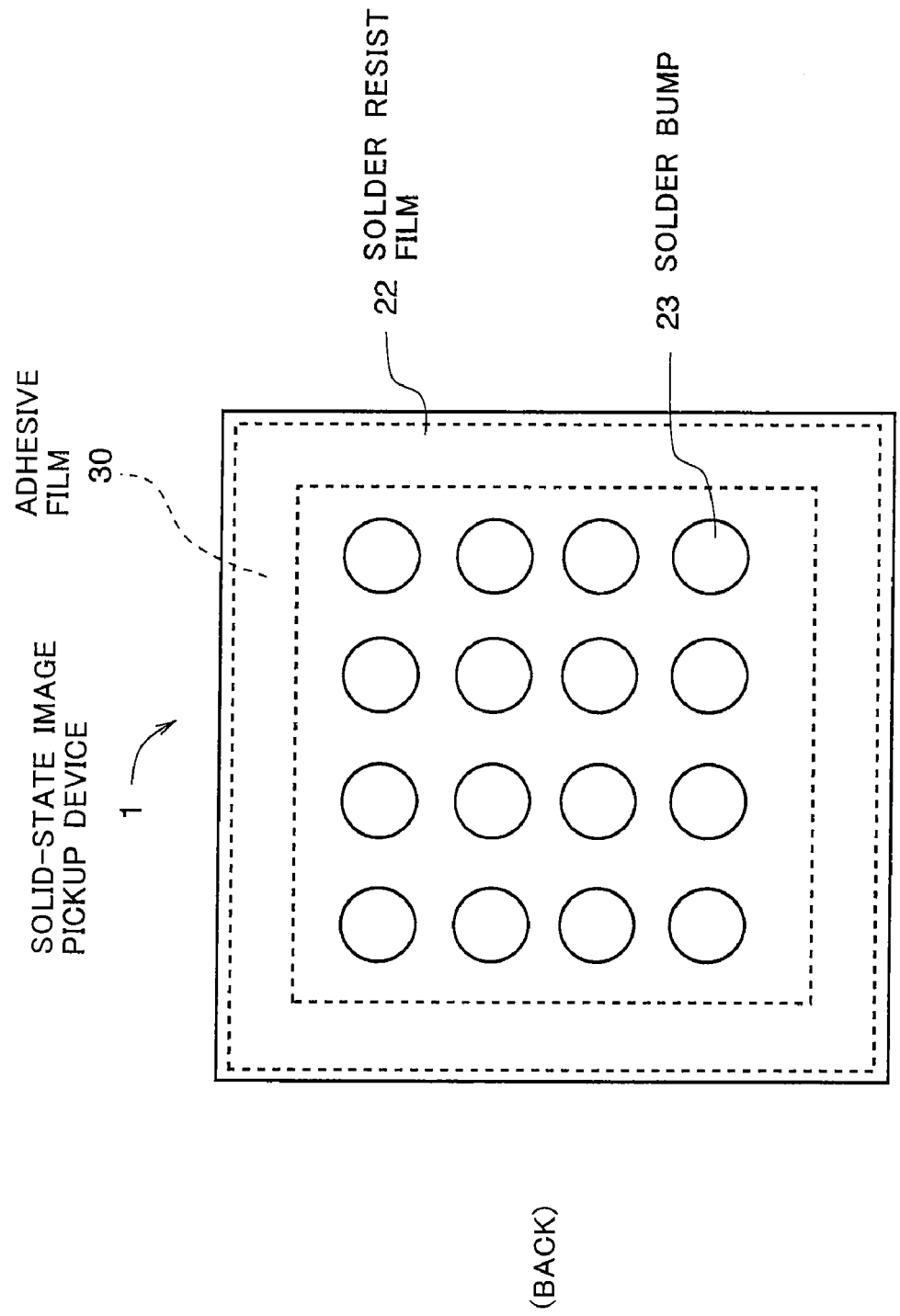
FIG. 19 is a schematic bottom view of the semiconductor device (solid-state image pickup device) according to the first embodiment of the present invention.

FIG. 1 shows the schematic structure of a semiconductor device according to the first embodiment of the present invention and FIG. 2 shows the end portion thereof under magnification. FIGS. 18 and 19 show the top and bottom views of the semiconductor device, respectively. In this embodiment, the semiconductor device is configured as a solid-state image pickup device.

Structure of First Embodiment

As shown in FIG. 1, a solid-state image pickup device 1 according to the first embodiment of the invention comprises a structure that a transparent chip-shaped glass cover 40 as a functional member is stacked on a solid-state image pickup element 10 as a chip-shaped semiconductor element having an image pickup function and fixed thereto. The image pickup element 10 is approximately rectangular plate-shaped. The glass cover 40 also is approximately rectangular plate-shaped, which is approximately equal in size to the image pickup element 10.

The glass cover 40 is a functional member with the function of a transparent cover that covers the surface 10a of the image pickup element 10, and the function of introducing external light into the element 10 through the cover 40.

A rectangular light-receiving region (an active region) 21 is formed in the approximately central part of the surface 10a of the image pickup element 10. An adhesive film 30, which has an approximately rectangular frame-like shape, is formed on the outside of the light-receiving region 21 so as to surround the same region 21. (See FIGS. 18 and 19.) The glass cover 40 is adhered to the surface 10a of the image pickup element 10 with the adhesive film 30. A hermetically sealed cavity (in other words, an air gap) C is formed between the light-receiving region 21 and the cover 40.

The inside of the cavity C may be filled with the air, nitrogen gas, or an inert gas (e.g., argon gas).

The solid-state image pickup element 10 comprises a single-crystal silicon (Si) substrate 11, the surface of which corresponds to the surface 10a of the element 10. The light-receiving region 21 is formed on the surface of the substrate 11. Light-receiving elements (not shown) are formed to be an array in the light-receiving region 21. Micro color filters 17 for three primary colors, red (R), green (G), and blue (B) (which may be for four colors of black and three primary colors) are formed in an array to be superposed on the light-receiving elements in a one-to-one correspondence. Similarly, microlenses 18a are formed in an array be superposed on the micro color filters 17 in a one-to-one correspondence. These microlenses 18a arranged in an array constitute a microlens array 18. The microlens array 18 and the peripheral area of the light-receiving region 21 are exposed in the cavity C.

The combination of the three adjoining light-receiving elements for three primary colors R, G, and B; the red, green, and blue regions of the micro color filters 17 superposed on these light-receiving elements; and the three microlenses 18a superposed on these regions corresponds to a pixel.

Although the microlenses 18a are illustrated in such a way as to be exposed from the surface of the light-receiving region 21 in FIG. 1, the present invention is not limited to this. The microlenses 18a may be covered with an additional film or films through which light passes (e.g., an interlayer insulating film). Moreover, the surface 10a of the solid-state image pickup element 10 except for the light-receiving region 21 is exposed, and the adhesive film 30 is directly adhered onto the surface 10a in FIG. 1; however, the present invention is not limited to this. The surface 10a of the image pickup element 10 except for the light-receiving region 21 may be covered with an additional film or films through which light passes (e.g., an interlayer insulating film, and/or a SOG (Spin-On-Glass) film). In this case, the adhesive film 30 is adhered onto the additional film or films.

The external light from an object that has passed through the glass cover 40 to enter the inside of the solid-state image pickup device 1 (i.e., incident light) is irradiated to the respective light-receiving elements in the light-receiving region 21 by way of the microlens array 18 and the micro color filters 17, and converted to electric signals according to the intensity of light in the respective light-receiving elements. These electric signals are then subjected to predetermined signal processing with an external signal processing circuit (not shown), thereby generating an image of the object. In this way, the image pickup operation of the object is performed.

On the surface 10a of the image pickup element 10, surface electrodes 15 are formed to surround the light-receiving region 21 in the outside area of the light-receiving region 21 (where the outside area is overlapped with the adhesive film 30). The surface electrodes 15 are formed by patterning an appropriate conductive film (e.g., an aluminum film). The surface electrodes 15, which are arranged at predetermined intervals in almost all the outside area with a rectangular frame-like shape, are used for leading the electric signals generated by the light-receiving elements to the outside of the image pickup device 1. Each of the surface electrodes 15 is electrically connected to a corresponding one of the light receiving elements by way of a corresponding one of the leading lines (not shown) formed on the surface 10a of the image pickup device 1. All the surface electrodes 15 are buried in the adhesive film 30. The upper and lower surfaces of the adhesive film 30 are flat.

Since the thickness of the adhesive film 30 is larger than the height of the microlens array 18 measured with reference to the surface 10a of the image pickup element 10, the microlens array 18 is apart from the inner surface of the glass cover 40.

The transparent glass cover 40 is fixed to the flat upper surface of the adhesive film 30. In other words, the cover 40 is adhered to the surface 10a of the image pickup element 10 with the adhesive film 30 and as a result, the cover 40 is united with the element 1. Here, the cover 40 is formed by a glass piece that has been obtained by cutting a transparent borosilicate glass ($B_2O_3/SiO_2$) plate. However, any other glass or material through which light passes may be used for the cover 40.

Any adhesive may be used for the adhesive film 30 if the glass cover 40 can be adhered to the image pickup element 10 with it. For example, an epoxy resin adhesive is used. It is preferred that the adhesive has such a property that the moisture in the air is difficult to penetrate. In this case, it is more preferred that the adhesive has water repellency. Preferably, the adhesive has such a property that light is difficult to pass through, in other words, the adhesive has a low transmittance of light.

Penetrating holes 14, which penetrate through the image pickup element 10 (in other words, the silicon substrate 11) from its surface 10a to its back 10b, are formed just below the respective surface electrodes 15. These holes 14 are provided for electrical connection between the respective surface electrodes 15 and the wiring lines or electrodes formed on the back 10b of the element 10. The inner wall of each surface electrode 15 is covered with a silicon dioxide ($SiO_2$) film 16b. Since the $SiO_2$ film 16b does not exist on the back of each surface electrode 15 in the hole 14, the back of each electrode 15 is exposed. For this reason, a patterned first conductive film 19, which is formed on the back side of the image pickup element 10, is in contact with the respective surface electrodes 15. This means that the patterned first conductive film 19 is electrically connected to the respective surface electrodes 15. The back 10b of the element 10 is covered with a $SiO_2$ film 16a except for the opening mouths of the holes 14. Needless to say, any other insulating film than a $SiO_2$ film, for example, a silicon nitride ($SiN_x$) film, may be used for this purpose.

On the $SiO_2$ film 16a located on the back 10b of the image pickup element 10 (i.e., the silicon substrate 11), the first conductive film 19 is formed to have a predetermined shape. Here, the first conductive film 19 is a Ti—Cu two-layer film formed by the stack of a Ti subfilm and a Cu subfilm. On the first conductive film 19, a patterned second conductive film 20 is formed to have the same shape as the first conductive film 19. Here, the second conductive film 20 is a single-layer Cu film. Since the first and second conductive films 19 and 20 have the light-blocking property, light does not pass through the area where these two films 19 and 20 are present. Each part of the patterned stacked films 19 and 20 constitute a wiring line formed on the back 10b.

In the first embodiment, the stack of the first and second conductive films 19 and 20 (i.e., the three-layer film formed by the Ti—Cu two-layer film and the Cu film) corresponds to the metal film for moisture entry prevention.

The second conductive film 20 (i.e., Cu film) is additionally formed on the first conductive film 19 (i.e., Ti—Cu two-layer film) because the thickness of the first conductive film 19 is insufficient for the above-described wiring lines in the first embodiment. Therefore, if the thickness of the first conductive film 19 is sufficient for the above-described wiring lines, the second conductive film 20 may be omitted. In this case, the first conductive film 19 corresponds to the metal film for moisture entry prevention.

Solder bumps 23, which serve as external electrodes, are formed on the stack of the patterned first and second conductive films 19 and 20 (i.e., the wiring lines). In the vicinity of each penetrating hole 14, the stack of the first and second conductive films 19 and 20 enters the inside of the hole 14 to reach the position near the top of the said hole 14. The part of the first conductive film 19 existing in the said hole 14 is in contact with the back of the corresponding surface electrode 15. In this way, each solder bump 23 is electrically connected to the corresponding surface electrode 15.

Furthermore, the stack of the first and second conductive films 19 and 20 is extended upward from the outer edge of the back 10b to the outer side faces of the image pickup element 10 in the whole periphery of the back 10b. The stack of the first and second conductive films 19 and 20 reaches the outer side faces in the bottom end of the glass cover 40 beyond the outer side faces of the element 10 and those of the adhesive film 30. Therefore, this stack covers the region that includes (i) all the outer side faces of the element 10 (which are approximately perpendicular to the back 10b), (ii) all the outer side faces of the adhesive film 30 (which are approximately perpendicular to the back 10b also), (iii) the interface between the adhesive film 30 and the element 10, (iv) the interface between the adhesive film 30 and the cover 40, and (v) the outer side faces in the bottom end of the cover 40. This is to prevent the moisture existing in the air from entering the cavity C by way of the adhesive film 30 itself or the interfaces between the adhesive film 30 and the members adjacent thereto (i.e., the image pickup element 10 and the glass cover 40), thereby suppressing the performance degradation and/or reliability degradation of the image pickup device 1 due to the moisture thus entered.

In this way, the metal film for moisture entry prevention has the three-layer structure formed by the Cu film as the second conductive film 20 and the Ti—Cu two-layer film as the first conductive film 19 stacked thereon in the first embodiment.

As the first conductive film 19, a two-layer conductive film formed by a Cr subfilm and a Cu subfilm (i.e., a Cr—Cu two-layer film), a two-layer conductive film formed by a Ta subfilm and a Cu subfilm (i.e., a Ta—Cu two-layer film), or a two-layer conductive film formed by a W subfilm and a Cu subfilm (i.e., a W—Cu two-layer film) may be used. Any two-layer film formed by the combination of other metals that are not shown here may be used as the first conductive film 19.

A single-layer metal film may be used as the first conductive film 19. For example, a Cu film, a Ti film, a Cr film, a Ta film, or a W film may be used for this purpose. Any other single-layer film not shown here may be used as the first conductive film 19.

Furthermore, a three-layer conductive film formed by a metal subfilm, a metallic compound subfilm, and a metal subfilm may be used as the first conductive film 19. For example, a three-layer conductive film formed by a Ti subfilm, a TiN subfilm, and a Cu subfilm (i.e., a Ti—TiN—Cu three-layer film), a three-layer film formed by a Ta subfilm, a TaN subfilm, and a Cu subfilm (i.e., a Ta—TaN—Cu three-layer film), or a three-layer film formed by a W subfilm, a WN subfilm, and a Cu subfilm (i.e., a W—WN—Cu three-layer film) may be used. Any three-layer film formed by the combination of other metals and a metallic compound that are not shown here may be used as the first conductive film 19.

A four- or more-layer conductive film may be used as the first conductive film 19.

The part of the first conductive film 19, which covers the outer side faces of the image pickup element 10, is in contact with the outer side faces of the silicon substrate 11. Therefore, the electric potential of the wiring lines that includes the said part is equal to the electric potential of the substrate 11 (i.e., the electric potential of the ground). As a result, an electromagnetic shielding effect against the electromagnetic waves in the neighborhood of the image pickup device 1 can be derived.

The back 10b of the image pickup element 10 is entirely covered with a solder resist film 22 except for the parts on which the solder bumps 23 are formed. Therefore, only the solder bumps 23 are protruded on the back 10b. Since the first and second conductive films 19 and 20 and the $SiO_2$ film 16a are covered with the solder resist film 22, they are not exposed to the outside of the image pickup device 1. The parts of the stacked first and second conductive films 19 and 20 located on the outer side faces of the image pickup element 10 are covered with the solder resist film 22 except for their ends located on the outer side faces of the glass cover 40.

The parts of the stacked first and second conductive films 19 and 20 located in the penetrating holes 14 constitute "buried interconnection lines" for electrically connecting the surface electrodes 15 located on the surface side of the silicon substrate 11 (i.e., the image pickup element 10) to the solder bumps 23 located on the back side thereof by way of the substrate 11.

All the outer side faces of the stacked structure comprising the glass cover 40 and the image pickup element 10 fixed by the adhesive film 30 are covered with an insulating synthetic resin (which has a light-blocking property, not shown) that constitutes a part of the CSP. However, they may not be covered with the insulating synthetic resin. Needless to say, the surface side of the stacked structure is kept exposed to the outside for receiving external light, and the back side thereof is also kept exposed to the outside for electrical interconnection with external circuitry.

With the solid-state image pickup device 1 according to the first embodiment having the above-described structure, external light is introduced into the cavity C through the glass cover 40 and then, the light in the cavity C passes through the microlens array 18 and the micro color filters 17 to be incident on the light-receiving region 21. The incident light thus generated is converted optoelectronically by the respective light-receiving elements formed in the light-receiving region 21, generating electric signals according to the intensity of the incident light. These electric signals are amplified by the amplification elements (not shown) provided adjacent to the respective light-receiving elements and thereafter, sent to the surface electrodes 15 by way of the wiring lines (not shown) for electric signal guiding. Subsequently, these electric signals are sent to the back side of the image pickup device 1 by way of the buried interconnection lines formed by the stacked first and second conductive films 19 and 20, and the solder bumps 23.

The electric power required for the operation of the image pickup device 1 is supplied from an external apparatus or system by way of predetermined ones of the solder bumps 23. Then, the electric power is sent to the light-receiving region 21 by way of the predetermined wiring lines located on the back 10b, the predetermined buried interconnection lines formed in the holes 14, and the predetermined surface electrodes 15 located on the surface 10a.

Fabrication Method of First Embodiment

Next, a method of fabricating the solid-state image pickup device 1 according to the first embodiment with the above-described structure will be explained below with reference to FIGS. 3 to 16.

Figure 17:
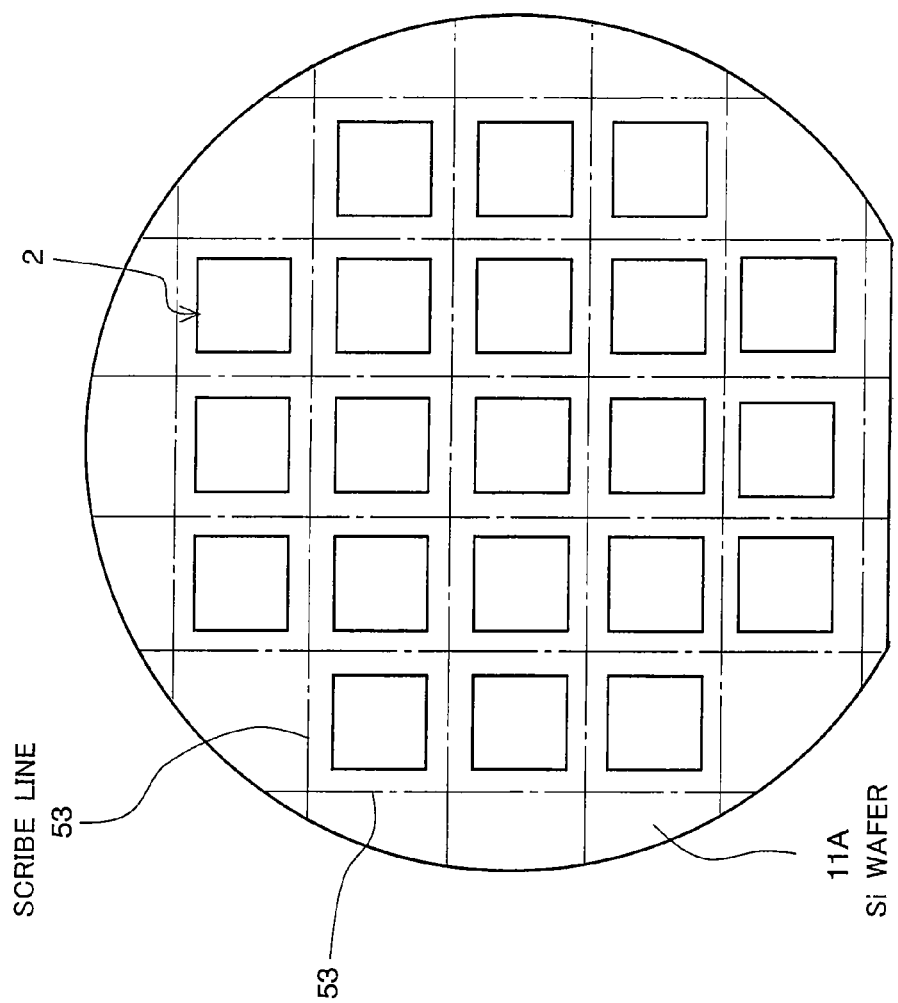
FIG. 17 is a schematic top view showing the image pickup sections arranged on the silicon wafer in the method of fabricating the semiconductor device (solid-state image pickup device) according to the first embodiment of the present invention.

The respective process steps of this fabrication method explained below are so-called wafer processes, all of which are carried out in the wafer level. Specifically, the solid-state image pickup device 1 with the above-described structure is not fabricated individually. As shown in FIG. 17, the image pickup device sections 2 (each of which is a region in which the above-described image pickup device 1 is formed) are formed on a silicon wafer 11A in a lump in such a way as to be an array and then, the wafer 11A is subject to a dicing process along the grid-shaped scribe lines 53, thereby separating the image pickup device sections 2 from each other. In this way, the solid-state image pickup devices 1 with the structure of FIG. 1 are fabricated simultaneously.

First, the silicon wafer 11A on which the solid-state image pickup elements 10 with the structure of FIG. 1 have been formed in an array is prepared. The fabrication method of the wafer 11A is optional; any standard processes may be used for this purpose. These image pickup elements 10 are respectively arranged in the image pickup device sections 2 defined on the wafer 11A. Each of the image pickup element 10 comprises the light-receiving element region 21 formed in the surface of the corresponding image pickup device section 2 of the wafer 11A, the micro color filters 17 formed on the light-receiving element region 21, and the microlens array 18 formed on the micro color filters 17.

In each image pickup device section 2, a predetermined number of the surface electrodes 15 are formed outside the light-receiving element region 21 on the surface of the wafer 11A. The surface electrodes 15 surround the light-receiving element region 21. Each surface electrode 15 is electrically connected to the predetermined electrode formed in the region 21 by way of the corresponding leading wiring lines (not shown).

All the image pickup device sections 2 have been judged as good by predetermined inspections. Only one of the sections 2 is shown for simplification in FIG. 3; however, practically, a plurality of the image pickup device sections 2 are arranged in an array on the wafer 11A, as shown in FIG. 17.

Figure 4:
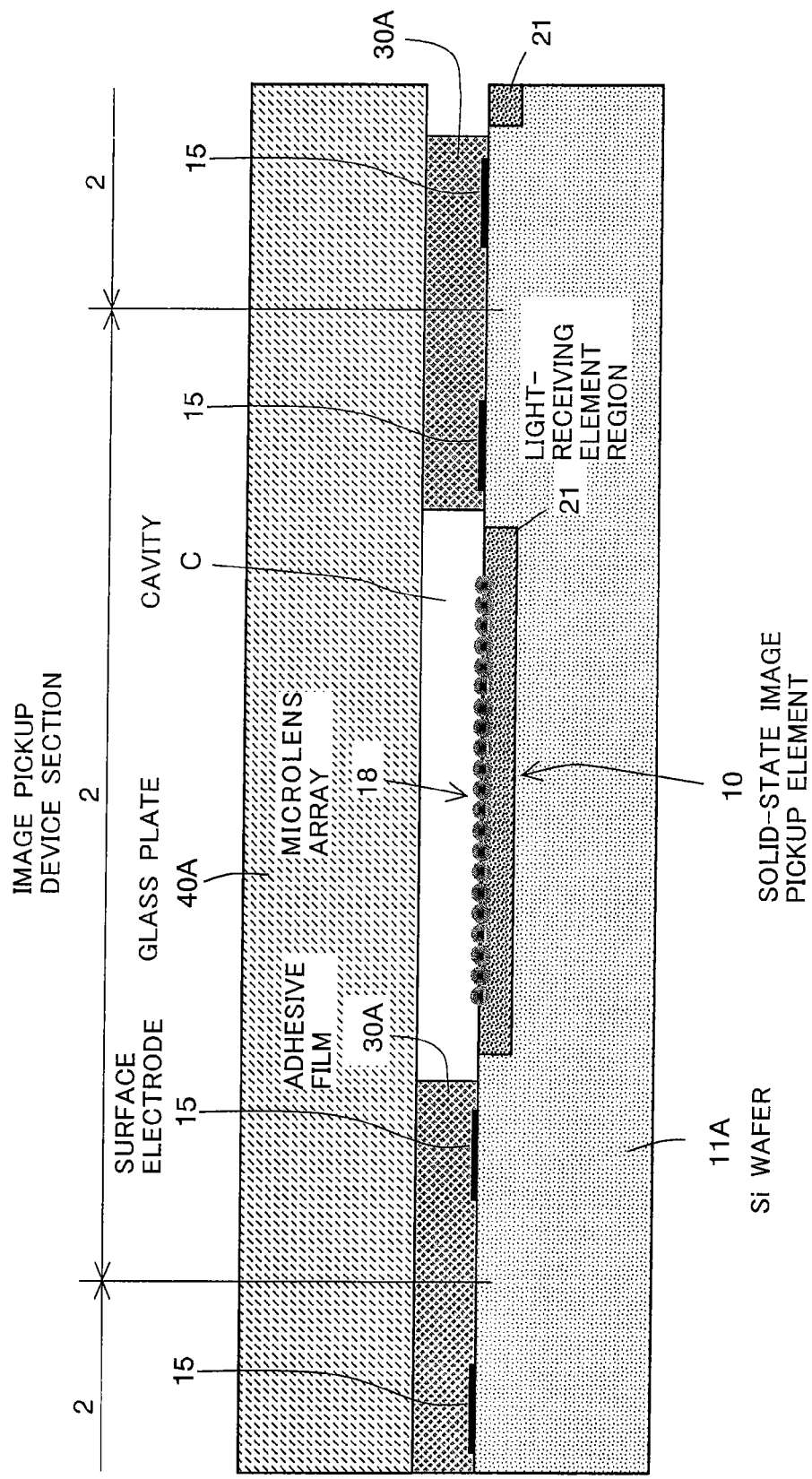
FIG. 4 is a partial cross-sectional view showing the process step of the method of fabricating the semiconductor device (solid-state image pickup device) according to the first embodiment of the present invention, which is subsequent to the step of FIG. 3.

Next, as shown in FIG. 4, an adhesive film 30A with a grid-shaped pattern is formed on the surface of the wafer 11A comprising the solid-state image pickup elements 10 and the surface electrodes 15. The adhesive film 30A covers almost all the surface of the wafer 11A except for the part for the cavity C. Subsequently, a wafer-shaped borosilicate glass plate 40A (which corresponds to a functional member wafer) having the same shape and size as the silicon wafer 11A is placed on the adhesive film 30A, thereby superposing the glass plate 40A on the wafer 11A. Thereafter, ultraviolet rays of a predetermined wavelength are irradiated to the adhesive film 30A with a predetermined intensity (e.g., 2000 mJ/cm$^2$) to thereby curing the adhesive film 30A. Thus, the glass plate 40A is joined to the wafer 11A with the adhesive film 30A thus cured. At this time, the thickness of the adhesive film 30A has a desired value and as a result, the cavities C are formed as desired between the glass plate 40A and the respective image pickup elements 10 (in other words, the respective light-receiving element regions 21) in the image pickup device sections 2. The state at this stage is shown in FIG. 4.

The formation of the adhesive film 30A is performed, for example, as follows:

First, an adhesive in a fluid or liquid state is coated on the whole surface of the wafer 11A in the air at room temperature by the spin-coating method (which may be coated by the spraying method), forming a coating of the adhesive. Next, the adhesive coating thus formed is patterned to have a grid-like shape using an appropriate mask by the known photolithography method. At this time, the image pickup elements 10 (or the light-receiving element regions 21) need to be exposed respectively from the corresponding rectangular openings of the adhesive coating. The thickness of the adhesive coating thus patterned is determined to have such a value that the microlens array 18 and the micro color filters 17 are buried therein and the post-curing thickness of the adhesive coating is equal to the desired thickness of the adhesive film 30A. As the adhesive used here, for example, an adhesive having both a thermosetting property and an ultraviolet (UV)-setting property is preferred.

In the formation step of the adhesive film 30A, instead of forming the adhesive coating from a fluid or liquid adhesive by coating and patterning the said adhesive coating by photolithography, the following methods may be used. Specifically, a photosensitive film-shaped adhesive sheet may be adhered on the whole surface of the wafer 11A and then, the said adhesive sheet may be patterned by a known photolithography method. Alternately, the grid-shaped adhesive film may be formed by the screen printing or dispense method during the coating step of the adhesive. If the patterned adhesive coating has a UV-setting property, it is cured by irradiation of UV rays. If the patterned adhesive coating has a thermosetting property, it is cured by heating.

After the joining or connecting step of the glass plate 40A (i.e., the functional member wafer) that forms the glass covers 40 is completed, the stack of the wafer 11A, the adhesive film 30A, and the glass plate 40A is attached to a handling holder (not shown) with an appropriate sticky agent. At this time, the surface on which the sticky agent is to be coated is the surface of the glass plate 40A. This is because the next is the step of processing the back of the wafer 11A. This holder may be formed by the same material as the glass cover 40; however, it may be formed by any other material. It is preferred that this holder is slightly larger in size than the wafer 11A.

Figure 5:
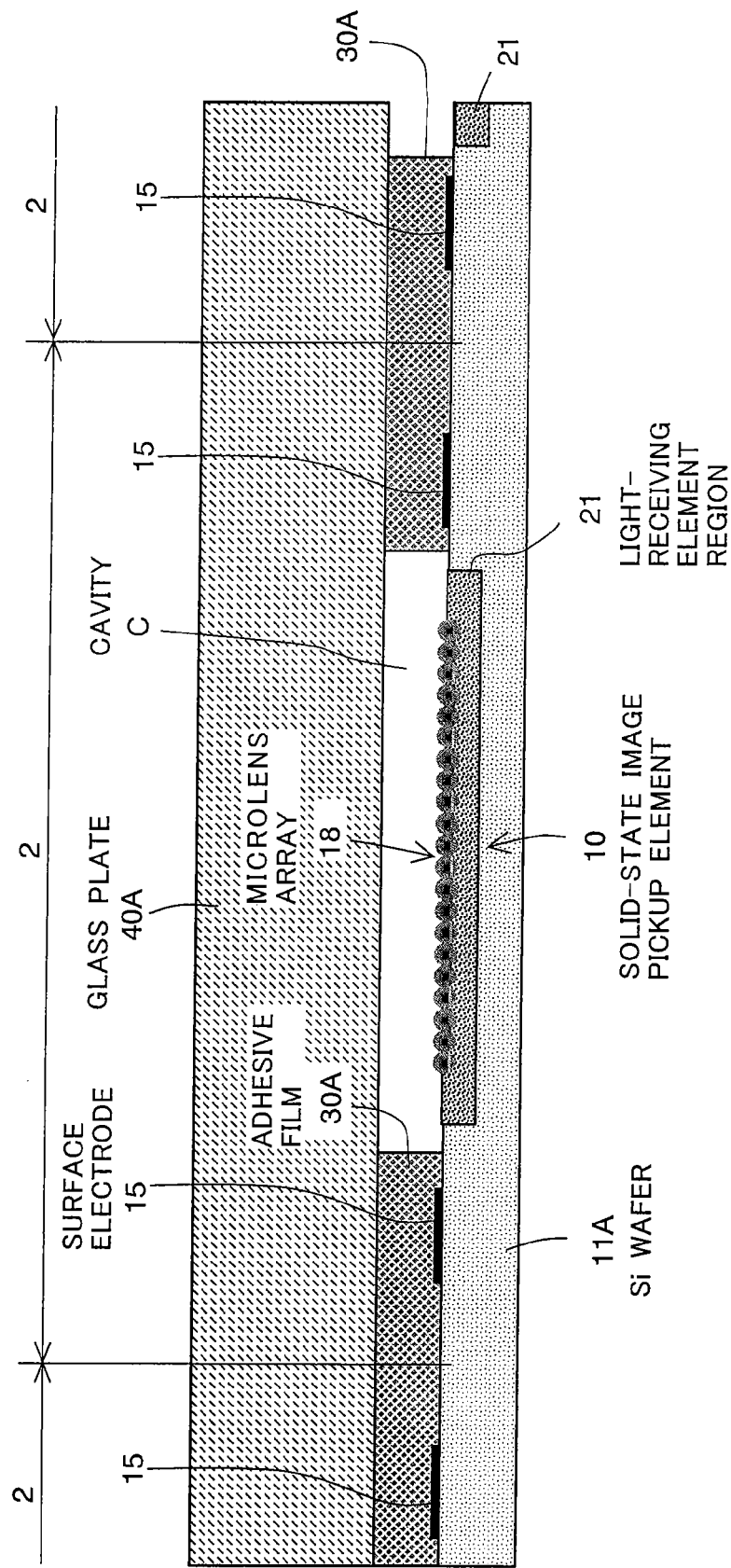
FIG. 5 is a partial cross-sectional view showing the process step of the method of fabricating the semiconductor device (solid-state image pickup device) according to the first embodiment of the present invention, which is subsequent to the step of FIG. 4.

Next, to make the whole wafer 11A thinner, the back of the wafer 11A is polished until the wafer 11A has a predetermined thickness (e.g., 100 μm to 50 μm) by the CMP (Chemical Mechanical Polishing) method. At this time, the mechanical polishing method may be used along with the CMP method. This thinning step may be carried out by the known dry or wet etching method. The state at this stage is shown in FIG. 5.

Figure 6:
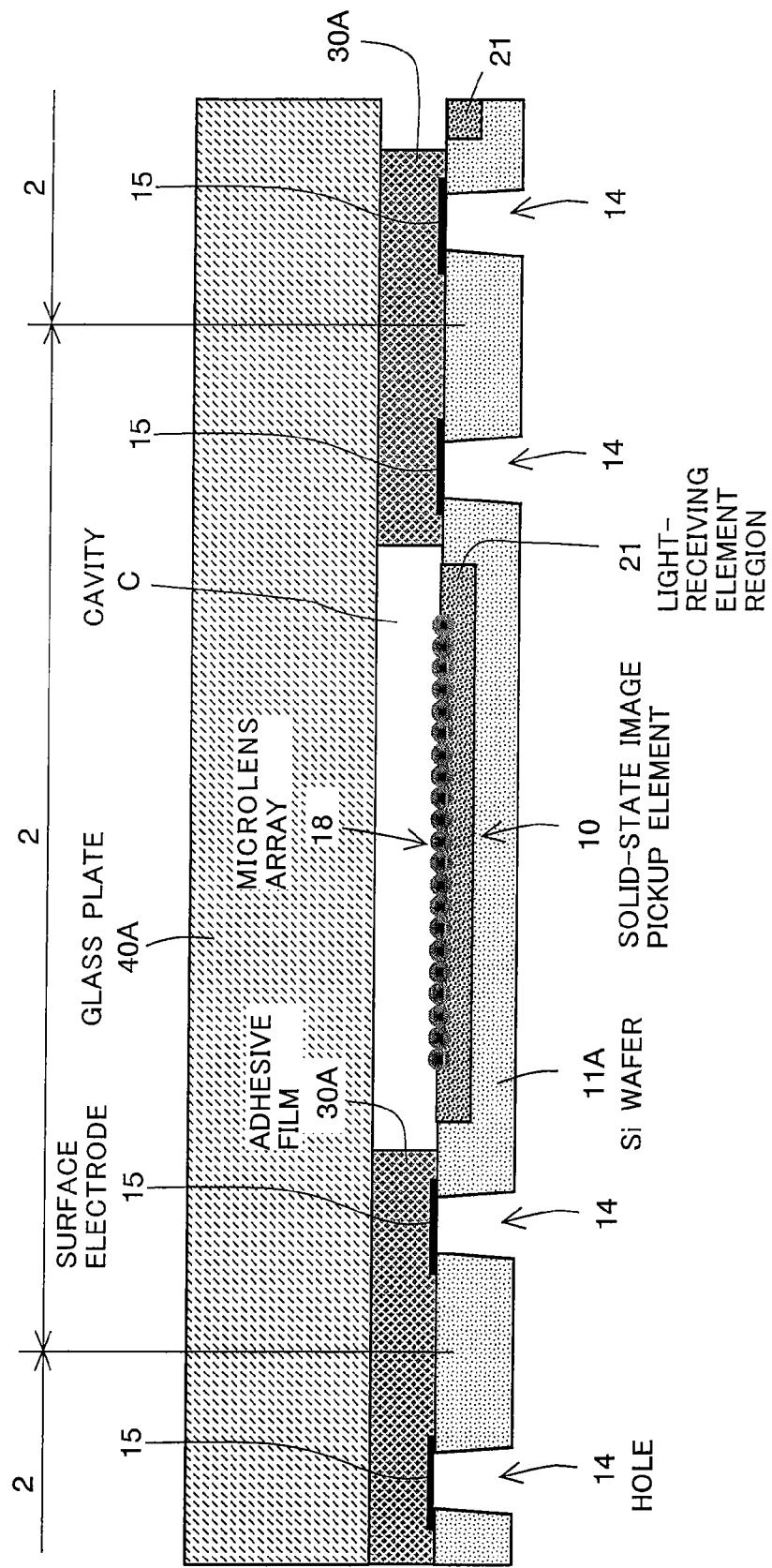
FIG. 6 is a partial cross-sectional view showing the process step of the method of fabricating the semiconductor device (solid-state image pickup device) according to the first embodiment of the present invention, which is subsequent to the step of FIG. 5.

Subsequently, a patterned resist film (not shown) is formed on the back of the wafer 11A thus thinned entirely and then, the wafer 11A is selectively etched from the back thereof using the said resist film as a mask. As a result, as shown in FIG. 6, the holes 14 penetrating though the wafer 11A are formed. These penetrating holes 14 are respectively located right under the surface electrodes 15. In other words, the holes 14 are located at the positions superposed respectively on the surface electrodes 15. The surface-side end of each hole 14 (i.e., the upper end in FIG. 6) reaches the back of the corresponding surface electrode 15. This step may be performed by any other etching method, such as the RIE (Reactive Ion Etching) method, or the ICE (Inductively Coupled Etching) method. In addition, this step may be carried out by any other method than etching, such as laser beam machining or anodic oxidation.

Figure 7:
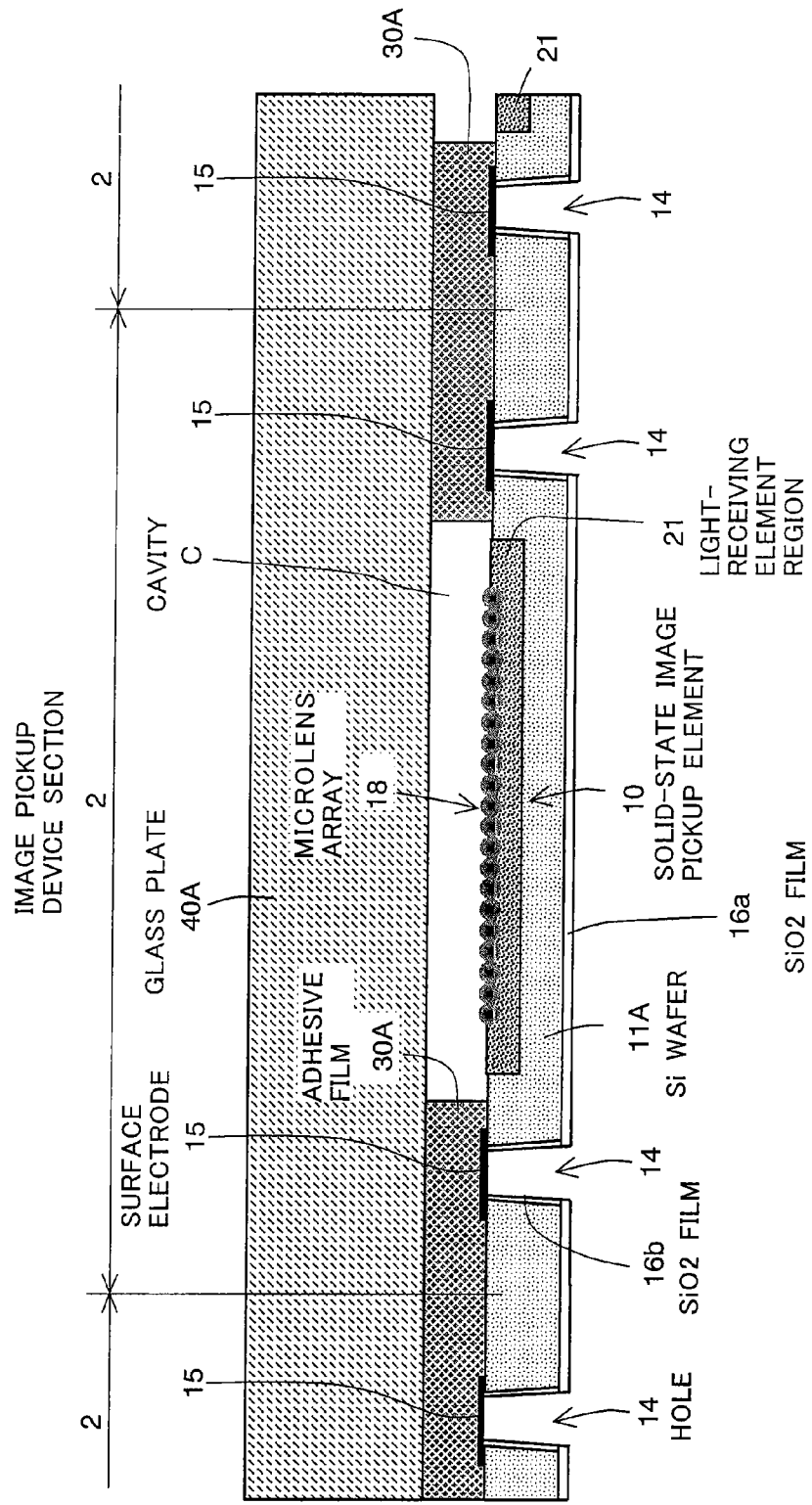
FIG. 7 is a partial cross-sectional view showing the process step of the method of fabricating the semiconductor device (solid-state image pickup device) according to the first embodiment of the present invention, which is subsequent to the step of FIG. 6.

After the mask used for the formation of the penetrating holes 14 is removed, the wafer 11A is thermally oxidized, thereby forming the $SiO_2$ films 16a and 16b on the exposed areas of the wafer 11A, as shown in FIG. 7. The $SiO_2$ film 16a covers the whole back of the wafer 11A except for the opening mouths of the holes 14. The $SiO_2$ film 16b covers the whole inner walls of the respective holes 14. Since no $SiO_2$ film exists on the back of each surface electrode 15, the back of each electrode 15 is exposed to the inside of the corresponding hole 14. Because the top end of each hole 14 is blocked by the corresponding electrode 15, the adhesive film 30A is not exposed to the inside of the respective holes 14. To form the $SiO_2$ films 16a and 16b, any other method than thermal oxidation (e.g., CVD method) may be used. If the CVD method is used for this purpose, the $SiO_2$ film is formed on the backs of the electrodes 15 also. Therefore, the $SiO_2$ film needs to be selectively removed after the formation of the $SiO_2$ film. Any other insulating film (e.g., $Si_3N_4$ film) may be used instead of the $SiO_2$ film. A stack of plural insulating films may be used for this purpose.

Figure 8:
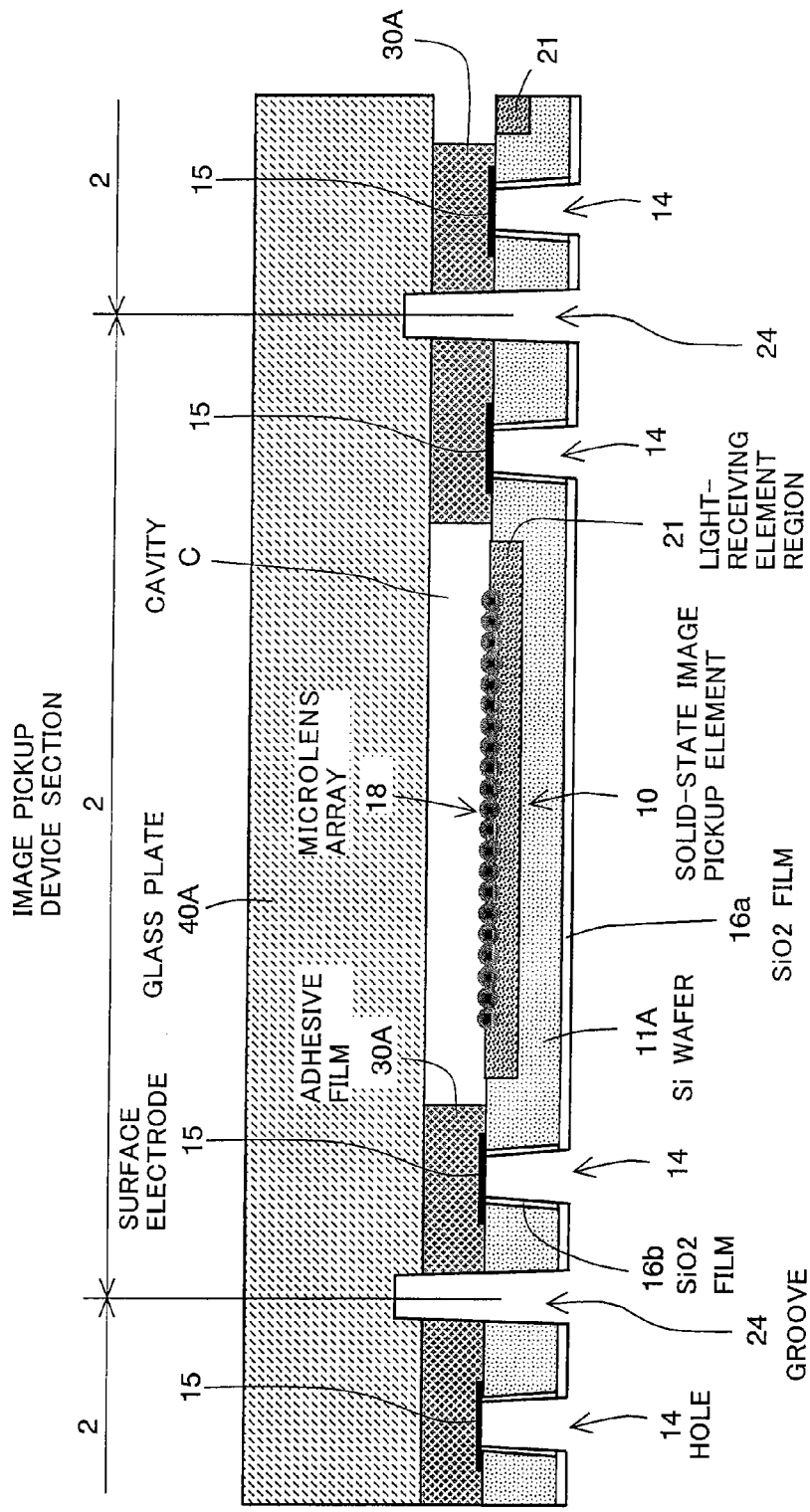
FIG. 8 is a partial cross-sectional view showing the process step of the method of fabricating the semiconductor device (solid-state image pickup device) according to the first embodiment of the present invention, which is subsequent to the step of FIG. 7.

Following this, a patterned resist film (not shown) is formed on the back of the wafer 11A where the penetrating holes 14 have been formed. Then, using the resist film as a mask, the wafer 11A is selectively etched from the back thereof, thereby forming the grooves 24 as shown in FIG. 8. The groves 24, each of which is located at the boundary between the two adjoining image pickup device sections 2, have the same grid-shaped pattern as the scribe lines 53. Therefore, the grooves 24 are not overlapped with the holes 14. The grooves 24 penetrate through the wafer 11A and the adhesive film 30A, reaching the inside of the glass plate 40A. This step may be performed by any etching method, such as the RIE or ICE method, similar to the above-described step of forming the penetrating holes 14. However, any other method than etching such as laser beam machining or anodic oxidation may be used for this purpose.

Figure 9:
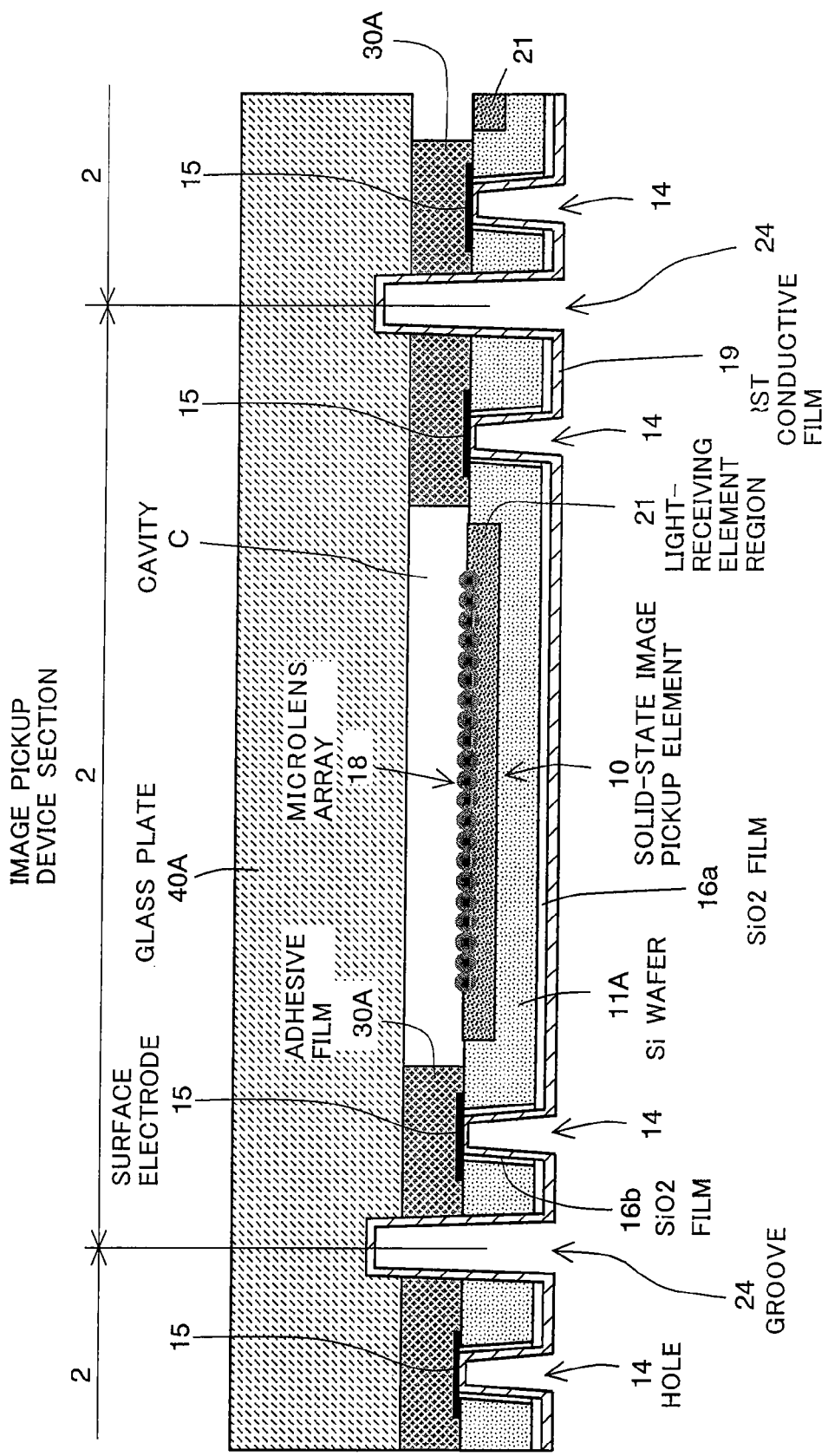
FIG. 9 is a partial cross-sectional view showing the process step of the method of fabricating the semiconductor device (solid-state image pickup device) according to the first embodiment of the present invention, which is subsequent to the step of FIG. 8.

Next, the first conductive film 19 is formed on the $SiO_2$ films 16a and 16b by the sputtering method, as shown in FIG. 9. The first conductive film 19 is present not only on the whole back of the wafer 11A but also on all the inner walls of the holes 14, all the backs of the surface electrodes 15 exposed to the insides of the holes 14, and all the inner walls of the grooves 24. Therefore, the first conductive film 19 is in contact with the $SiO_2$ film 16b and the surface electrodes 15 in the respective holes 14 and at the same time, the film 19 is in contact with the wafer 11A, the adhesive film 30A, and the glass plate 40A in the respective grooves 24. Such the first conductive film 19 as described here may be easily realized by forming an appropriate conductive film on the $SiO_2$ films 16a and 16b by the sputtering method from the back of the wafer 11A.

Here, as the first conductive film 19, a Ti—Cu two-layer film, which is formed by the stack of a Ti subfilm and a Cu subfilm, is used. The first conductive film 19 having such the structure may be realized easily as follows. Specifically, a Ti subfilm is formed on the $SiO_2$ films 16a and 16b by sputtering as the barrier material and thereafter, a Cu subfilm is formed on the Ti subfilm by sputtering as the conductive material.

However, the following two-layer conductive films may be used as the first conductive film 19 instead of the Ti—Cu two-layer film. Specifically, (i) a Cr—Cu two-layer film formed by a Cr subfilm as the barrier material and a Cu subfilm as the conductive material stacked thereon, (ii) a Ta—Cu two-layer film formed by a Ta subfilm as the barrier material and a Cu subfilm as the conductive material stacked thereon, or (iii) a W—Cu two-layer film formed by a W subfilm as the barrier material and a Cu subfilm as the conductive material stacked thereon, may be used as the first conductive film 19.

A single-layer metal film may be used as the first conductive film 19. For example, a Cu, Ti, Cr, Ta, or W film may be formed on the $SiO_2$ films 16a and 16b as the conductive material and then, the Cu, Ti, Cr, Ta, or W film thus formed may be used as the first conductive film 19. Any other single-layer metal film than those shown here may be used for this purpose.

A three-layer conductive film comprising a metal subfilm, a metallic compound subfilm, and another metal subfilm may be used as the first conductive film 19. For example, (i) a Ti subfilm is formed on the $SiO_2$ films 16a and 16b as the barrier material, a TiN subfilm is formed on the Ti subfilm as a conductive material, and a Cu subfilm is formed on the TiN subfilm as another conductive material, forming a Ti—TiN—Cu three-layer film as the first conductive film 19. (ii) A Ta subfilm is formed on the $SiO_2$ films 16a and 16b as the barrier material, a TaN subfilm is formed on the Ta subfilm as a conductive material, and a Cu subfilm is formed on the TaN subfilm as a another conductive material, forming a Ta—TaN—Cu three-layer film as the first conductive film 19. (iii) A W subfilm is formed on the $SiO_2$ films 16a and 16b as the barrier material, a WN subfilm is formed on the W subfilm as a conductive material, and a Cu subfilm is formed on the WN subfilm as another conductive material, forming a W—WN—Cu three-layer film as the first conductive film 19. Any other three-layer metal/metallic compound film than those shown here may be used for this purpose. A four- or more-layer film may be used as the first conductive film 19.

In the step of forming the first conductive film 19, any plating method or the like may be used instead of sputtering.

Figure 10:
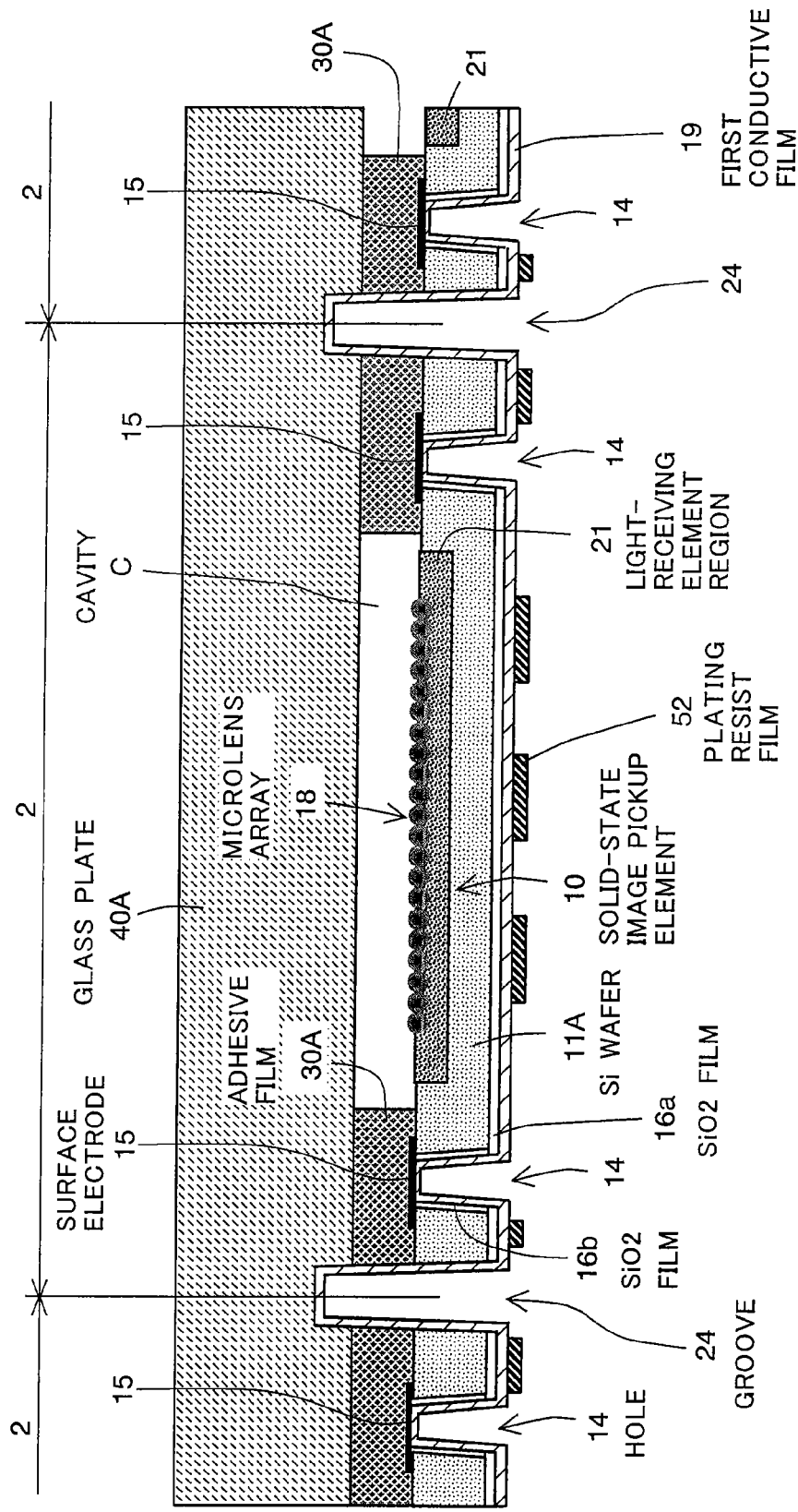
FIG. 10 is a partial cross-sectional view showing the process step of the method of fabricating the semiconductor device (solid-state image pickup device) according to the first embodiment of the present invention, which is subsequent to the step of FIG. 9.

Subsequently, a resist film 52 for plating (i.e., a plating resist film) is formed on the first conductive film 19 and then, is patterned to have a shape for desired wiring lines. As shown in FIG. 10, the resist film 52 exists on only the back of the wafer 11A; the resist film 52 does not exist in the holes 14 and the grooves 24. This is to ensure the formation of the second conductive film 20 on the first conductive film 19 even in the holes 14 and the grooves 24.

Figure 11:
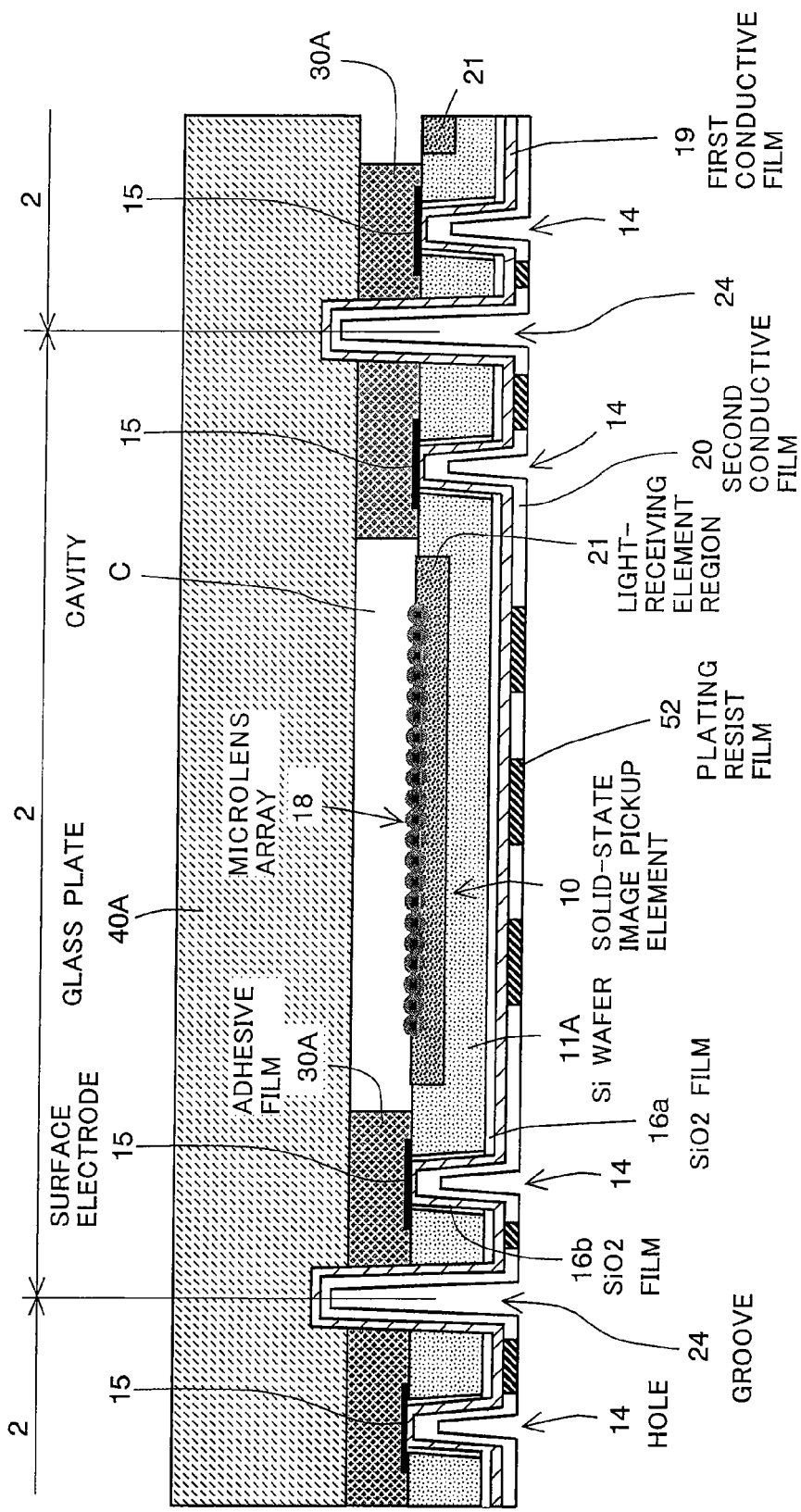
FIG. 11 is a partial cross-sectional view showing the process step of the method of fabricating the semiconductor device (solid-state image pickup device) according to the first embodiment of the present invention, which is subsequent to the step of FIG. 10.
Figure 12:
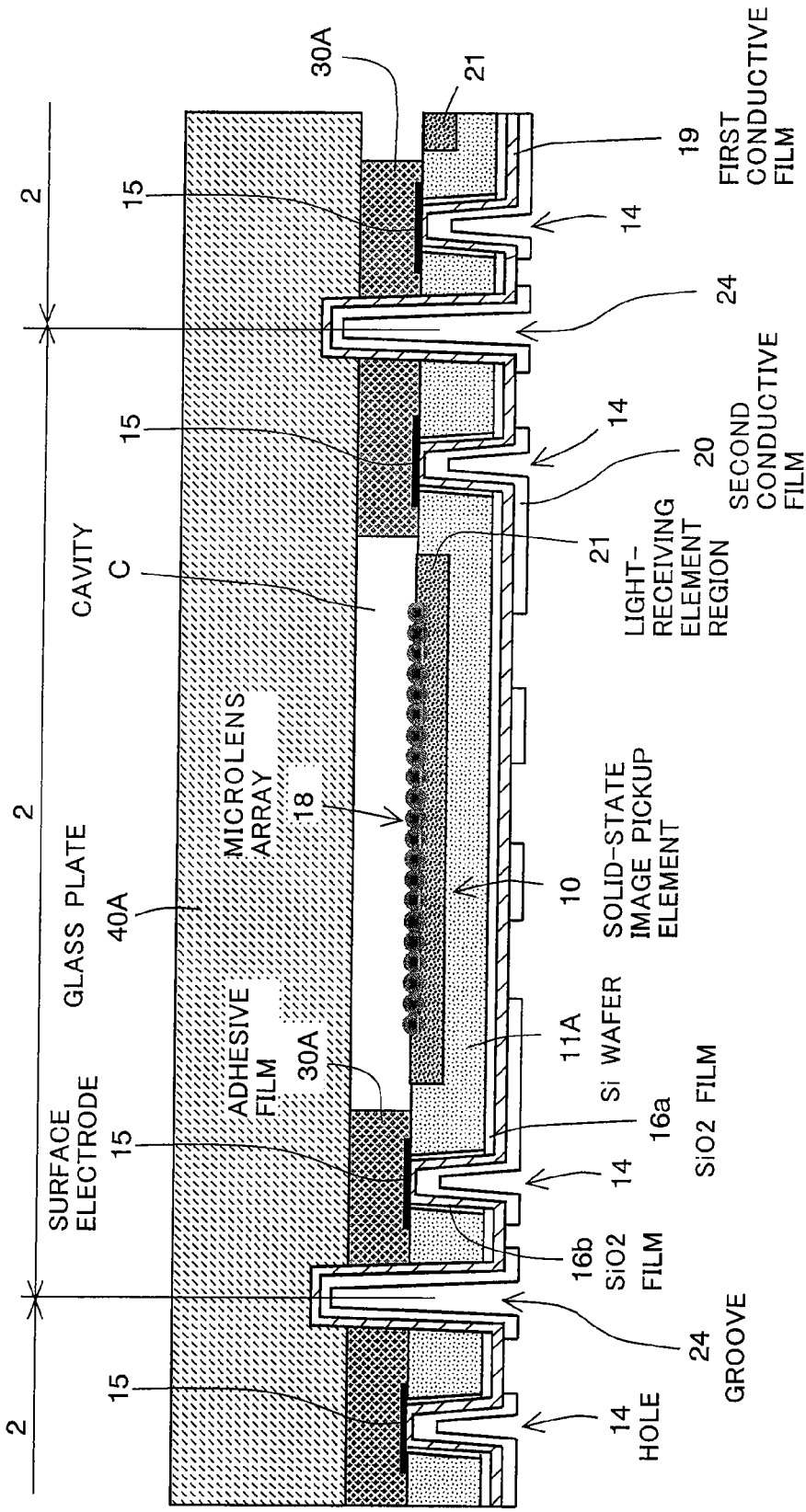
FIG. 12 is a partial cross-sectional view showing the process step of the method of fabricating the semiconductor device (solid-state image pickup device) according to the first embodiment of the present invention, which is subsequent to the step of FIG. 11.

Using the patterned resist film 52 as a mask, the second conductive film 20 is selectively formed on the first conductive film 19, as shown in FIG. 11. Since the second conductive film 20 is formed on the areas where the resist film 52 does not exist, the second conductive film 20 is present not only on the back of the wafer 11A but also in the holes 14 and the grooves 24. The thickness of the second conductive film 20 is approximately the same as that of the resist film 52. This step can be preferably performed by, for example, the electroplating method of Cu using the Cu subfilm included in the first conductive film 19 as a seed metal. In this case, the second conductive film 20 is the Cu film thus formed by plating. Thereafter, the resist film 52 is removed and as a result, the structure shown in FIG. 12 is formed. Instead of the electroplating method, the electroless plating method may be used.

Since the second conductive film 20 is formed to cover or remedy the thickness deficiency of the first conductive film (here, the Ti—Cu two-layer film) 19, the second conductive film 20 is not limited to a Cu film. Any other metal film with a desired conductivity than the Cu film may be used as the second conductive film 20.

Figure 13:
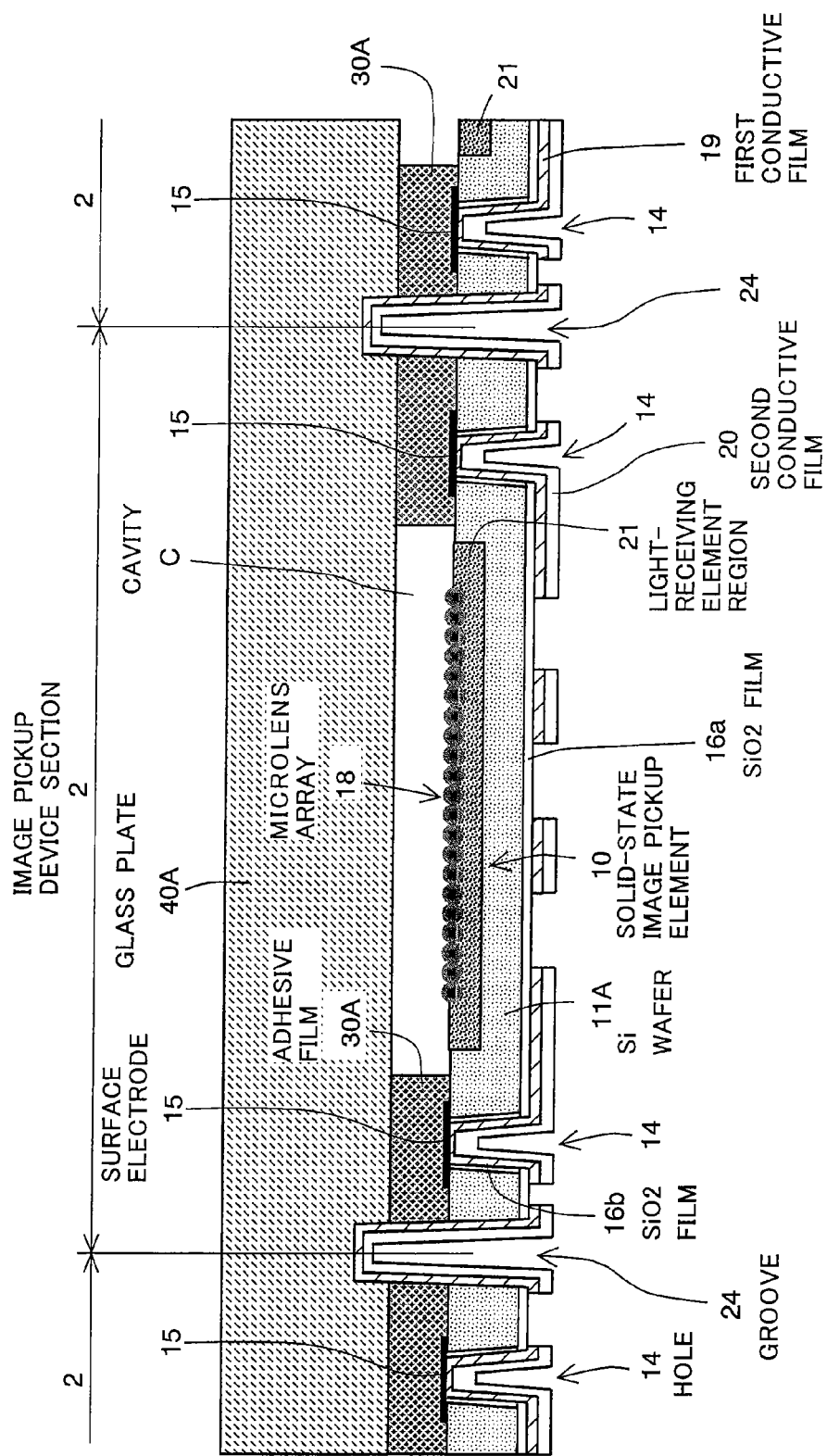
FIG. 13 is a partial cross-sectional view showing the process step of the method of fabricating the semiconductor device (solid-state image pickup device) according to the first embodiment of the present invention, which is subsequent to the step of FIG. 12.

Next, the first conductive film 19 (here, the Ti—Cu two-layer film) is selectively removed by etching using the second conductive film 20 as a mask. As a result, the exposed parts of the first conductive film 19 from the second conductive film 20 are removed, thereby exposing the $SiO_2$ film 16a. At this time, as shown in FIG. 13, the first conductive film 19 has the same shape (pattern) as the second conductive film (here, the Cu film) 20. In this way, the wiring lines are formed on the back of the wafer 11A by the stack of the patterned first and second conductive films 19 and 20. In this state, all the inner walls of the penetrating holes 14 and the grooves 24 are covered with the stack of the patterned first and second conductive films 19 and 20.

Figure 14:
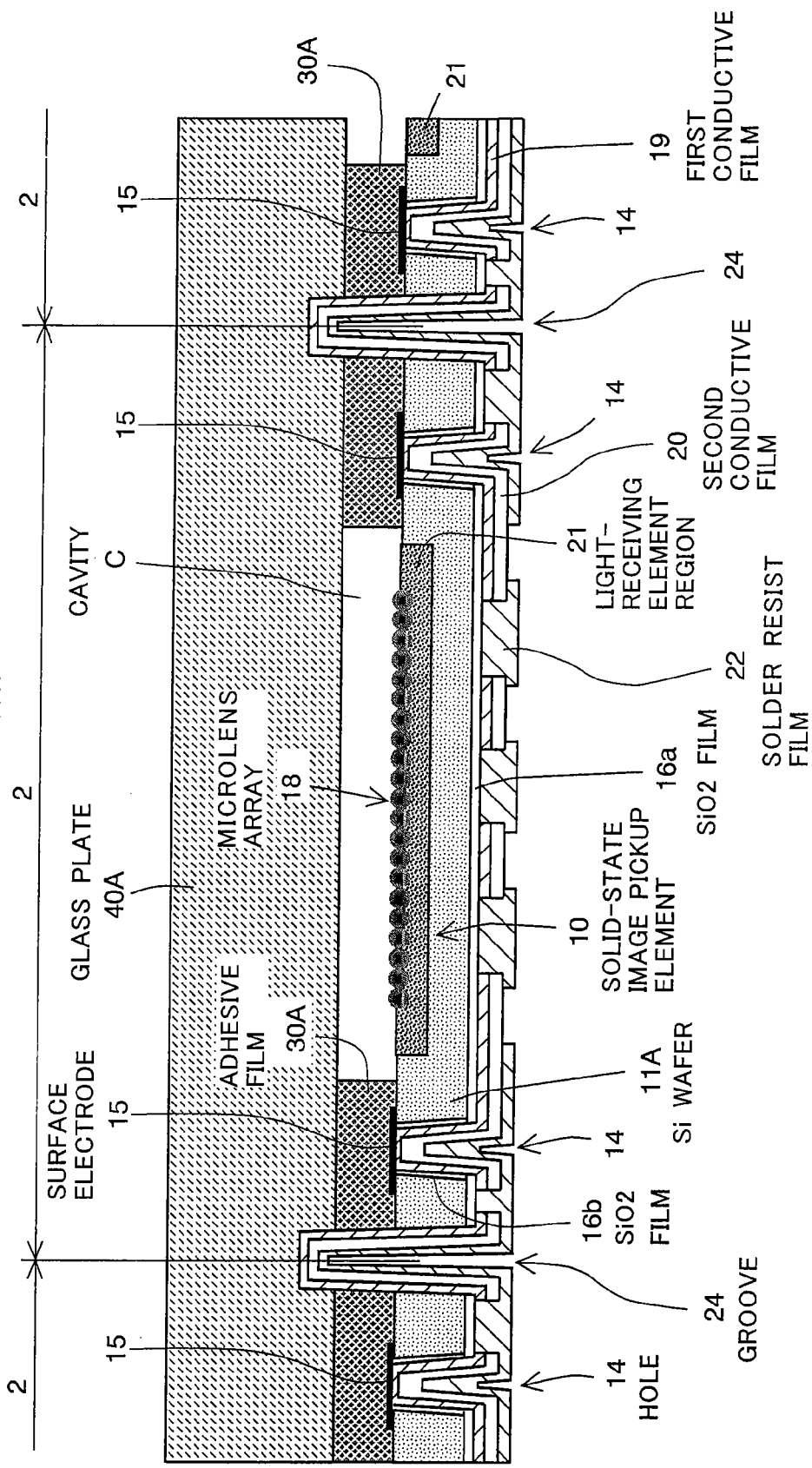
FIG. 14 is a partial cross-sectional view showing the process step of the method of fabricating the semiconductor device (solid-state image pickup device) according to the first embodiment of the present invention, which is subsequent to the step of FIG. 13.

Thereafter, the insulative solder resist film 22 is formed on the back side of the wafer 11A by the coating method, thereby covering the remaining stacked structure of the first and second conductive films 19 and 20 (i.e., the wiring lines) and the exposed parts of the $SiO_2$ film 16a with the solder resist film 22. Moreover, the solder resist film 22 is patterned by the known photolithography using an appropriate mask, thereby forming openings only at the positions where the solder bumps 23 are to be formed, as shown in FIG. 14. The remaining second conductive film 20 is exposed through the openings thus formed. At this time, the back of the wafer 11A is covered with the solder resist film 22 except for the positions where the solder bumps 23 are to be formed. Even in the holes 14 and the grooves 24, the second conductive film 20 is covered with the solder resist film 22.

Figure 15:
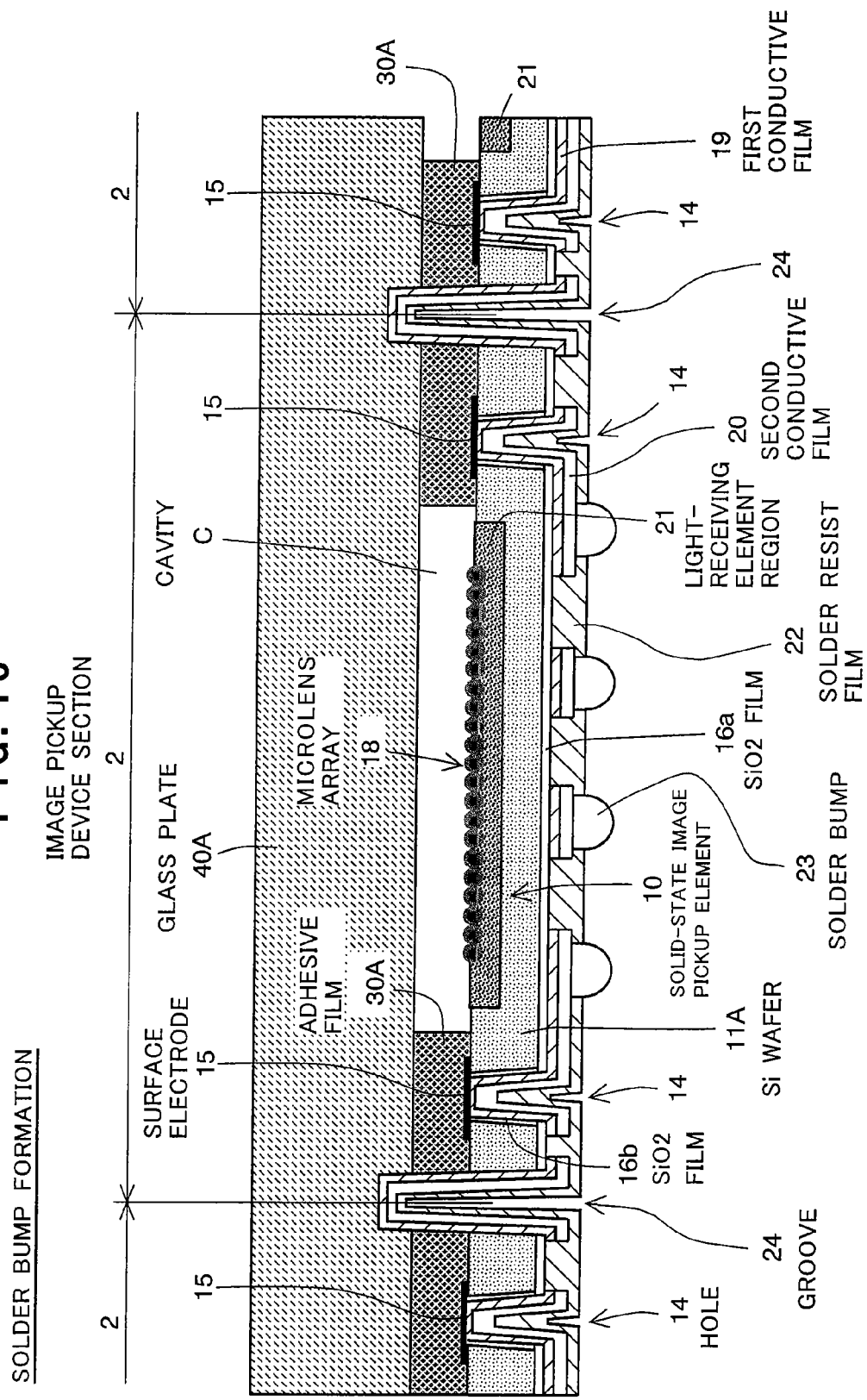
FIG. 15 is a partial cross-sectional view showing the process step of the method of fabricating the semiconductor device (solid-state image pickup device) according to the first embodiment of the present invention, which is subsequent to the step of FIG. 14.

Subsequently, the back side of the structure of FIG. 14 (i.e., the back side of the wafer 11A) is dipped into a melted solder by heating (i.e., a molten solder) and then, it is lifted therefrom after a predetermined time passes. At this time, the molten solder is selectively attached to the exposed positions of the back of the wafer 11A from the solder resist film 22. Then, the wafer 11A is cooled to room temperature and as a result, the molten solder attached to the said positions hardens in the form of bumps. In this way, the solder bumps 23 are formed at the said positions. The state at this stage is shown in FIG. 15. Through these process steps described here, a plurality of the image pickup device sections 2 having the structure of FIG. 1 are completed on the wafer 11A.

The following method may be used to form the solder bumps 23. Specifically, a solder paste is selectively printed on the positions of the back of the wafer 11A that have not been covered with the solder resist film 22 (where the second conductive film 20 is exposed) using a metal mask. Thereafter, the solder paste thus printed is melted by heating using the reflow process, thereby forming the solder bumps 23.

When the image pickup device sections 2 are completed on the wafer 11A in this way, dicing is applied to the wafer 11A along the scribe lines 53 (see FIG. 17) using an appropriate dicing blade. The grid-shaped or checkered scribe lines 53 are located at the positions superposed on the grid-shaped grooves 24, in other words, each scribe line 53 is formed to extend along the corresponding groove 24. At this time, a known dicing tape (not shown) is adhered to the back of the wafer 11A or the surface of the glass plate 40A in order that the image pickup device sections 2 may not be dispersed after their separation. By repeating the dicing operation predetermined times, the glass plate 40A, the adhesive film 30A, and the wafer 11A (in which the solid-state image pickup elements 10 have been formed) are cut into chip-shaped parts along the scribe lines 53. As a result, the image pickup device sections 2 formed on the wafer 11A are separated from each other.

Through the series of the above-described process steps, a plurality of the solid-state image pickup devices 1 with the structure of FIGS. 1 and 2 according to the first embodiment are fabricated in a lump. If all the side faces of each image pickup device 1 need not be covered with the insulative synthetic resin (not shown) that constitutes the part of the CSP, the fabrication process sequence is finished. If all the side faces of each image pickup device 1 need to be covered with the said insulative synthetic resin, the fabrication process sequence is finished after the step of covering the side faces of each device 1 with the said insulative synthetic resin is carried out. In this way, the solid-state image pickup device 1 equipped with the CSP is obtained.

With the solid-state image pickup device 1 according to the first embodiment of the present invention, as described above, the chip-shaped image pickup element 10, and the chip-shaped glass cover 40 as the functional member fixed on the surface side of the element 10 with the adhesive film 30 are provided. Moreover, the region including at least all the outer side faces of the element 10, all the outer side faces of the adhesive film 30, the interface between the adhesive film 30 and the element 10, and the interface between the adhesive film 30 and the cover 40 is covered with the metal film for moisture entry prevention, i.e., the stack of the patterned first conductive film 19 (here, the TiCu two layer film) and the patterned second conductive film 20 (here, the Cu film). The stack of the patterned first and second conductive films 19 and 20 are used as the wiring lines formed on the back 10b of the element 10 and the buried interconnection lines formed in the holes 14 also.

Therefore, the possibility that moisture existing in the air enters the cavity C by way of the adhesive film 30 itself or the interfaces between the adhesive film 30 and the members adjacent thereto (i.e., the image pickup element 10 and the glass cover 40) is eliminated. This means that the performance or reliability degradation of the solid-state image pickup device 1 due to the moisture thus entered can be suppressed.

Moreover, to realize the moisture entry prevention, it is sufficient for the image pickup device 1 to include the metal film for moisture entry prevention (i.e., the stack of the patterned first and second conductive films 19 and 20) that is formed in such a way as to cover the region including at least all the outer side faces of the image pickup element 10, all the outer side faces of the adhesive film 30, the interface between the adhesive film 30 and the element 10, and the interface between the adhesive film 30 and the glass cover 40. Therefore, the structure of the device 1 is not complicated, in other words, this device 1 has a simple structure.

Regarding the fabrication process steps, first, the grooves 24 are formed in the silicon wafer 11A on which the image pickup devices 1 have been formed from the back of the wafer 11A in such a way as to reach the inside of the glass cover 40 and to be superposed on the scribe lines 53. Thereafter, the Ti—Cu two-layer film as the first conductive film 19 and the Cu film as the second conductive film 20 are formed on the backs 10b of the image pickup elements 10 to extend the insides of the grooves 24 and the penetrating holes 14, thereby forming the metal film for moisture entry prevention. For this reason, the image pickup device 1 can be fabricated by changing the mask pattern (shape) for the first conductive film 19 (i.e., the Ti—Cu two-layer film) and the second conductive film 20 (i.e., the Cu film) for the wiring lines/electrodes only. Accordingly, it is unnecessary to newly add the process step of forming the metal film for moisture entry prevention (i.e., the three layer film formed by the Ti—Cu two layer subfilm and the Cu subfilm) and to change the materials and processes used for fabricating a solid-state image pickup device of this type.

Accordingly, in the image pickup device 1 comprising the chip-shaped image pickup element 10 and the chip-shaped glass cover 40 fixed thereto with the adhesive film 30, the performance or reliability degradation due to the moisture entered by way of the adhesive film 30 itself or the interfaces between the adhesive film 30 and the members adjacent thereto (i.e., the element 10 and the cover 40) can be suppressed with a simple structure. Moreover, the image pickup device 1 can be fabricated in such a way that almost no process step is added to the conventional fabrication process steps of a semiconductor device of this type in the wafer level and almost no change is applied thereto.

Furthermore, with the above-described fabrication method of the solid-state image pickup device 1 according to the first embodiment, a plurality of the image pickup devices 1 can be fabricated through the wafer-level fabrication process steps in a lump.

In addition, the device 1 may comprises a solid-state image pickup element with a different structure from the above-described one. The microlenses 18a and the micro color filters 17 may be omitted.

Any other type of electrodes than the solder bumps 23 may be used as the external electrodes.

Second Embodiment

FIGS. 20 to 23 show a semiconductor device according to the second embodiment of the invention. With the second embodiment also, the semiconductor device is configured as a solid-state image pickup device 1A, similar to the first embodiment.

Figure 20:
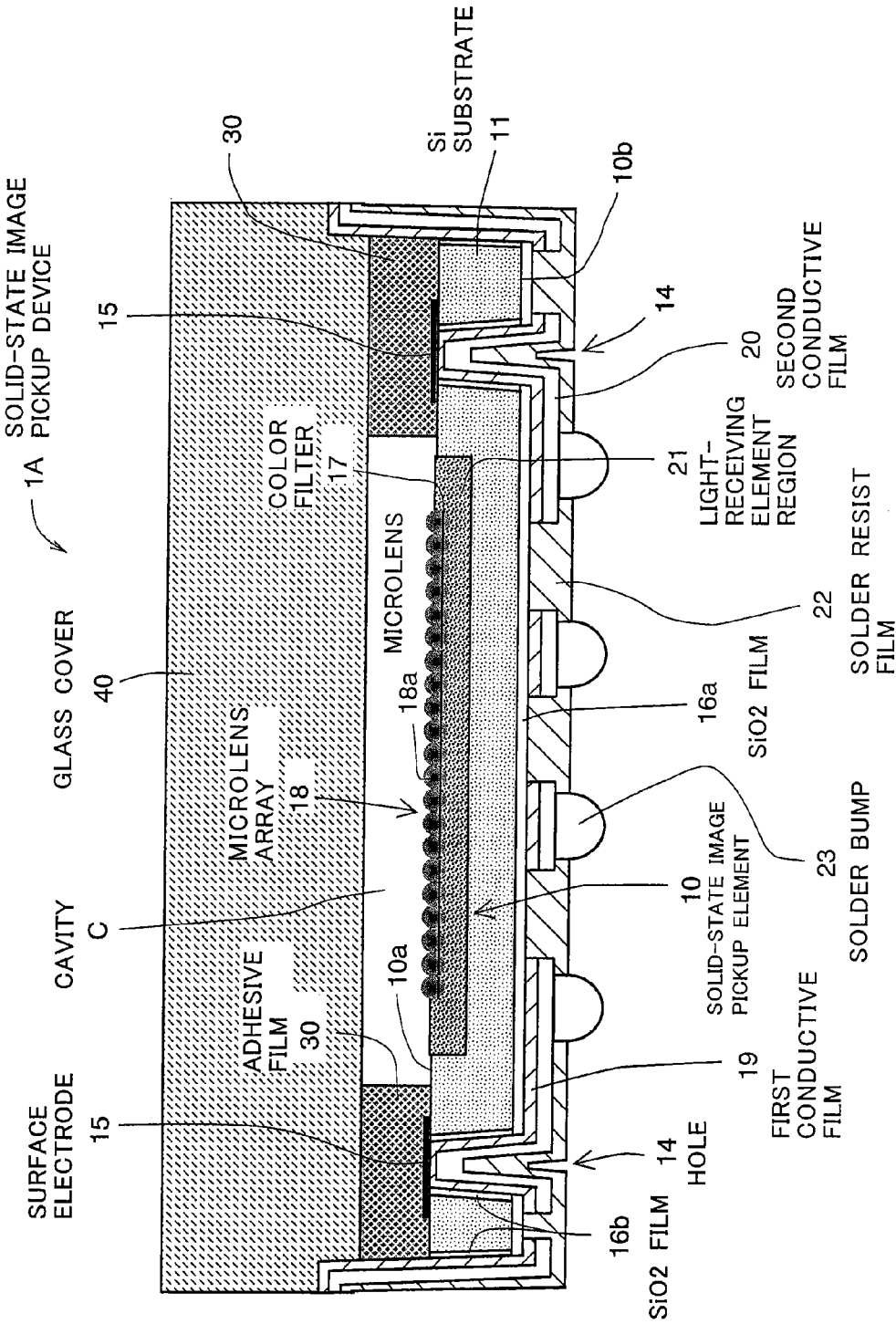
FIG. 20 is a cross-sectional view showing the schematic structure of a semiconductor device (which is configured as a solid-state image pickup device) according to the second embodiment of the present invention.
Figure 21:
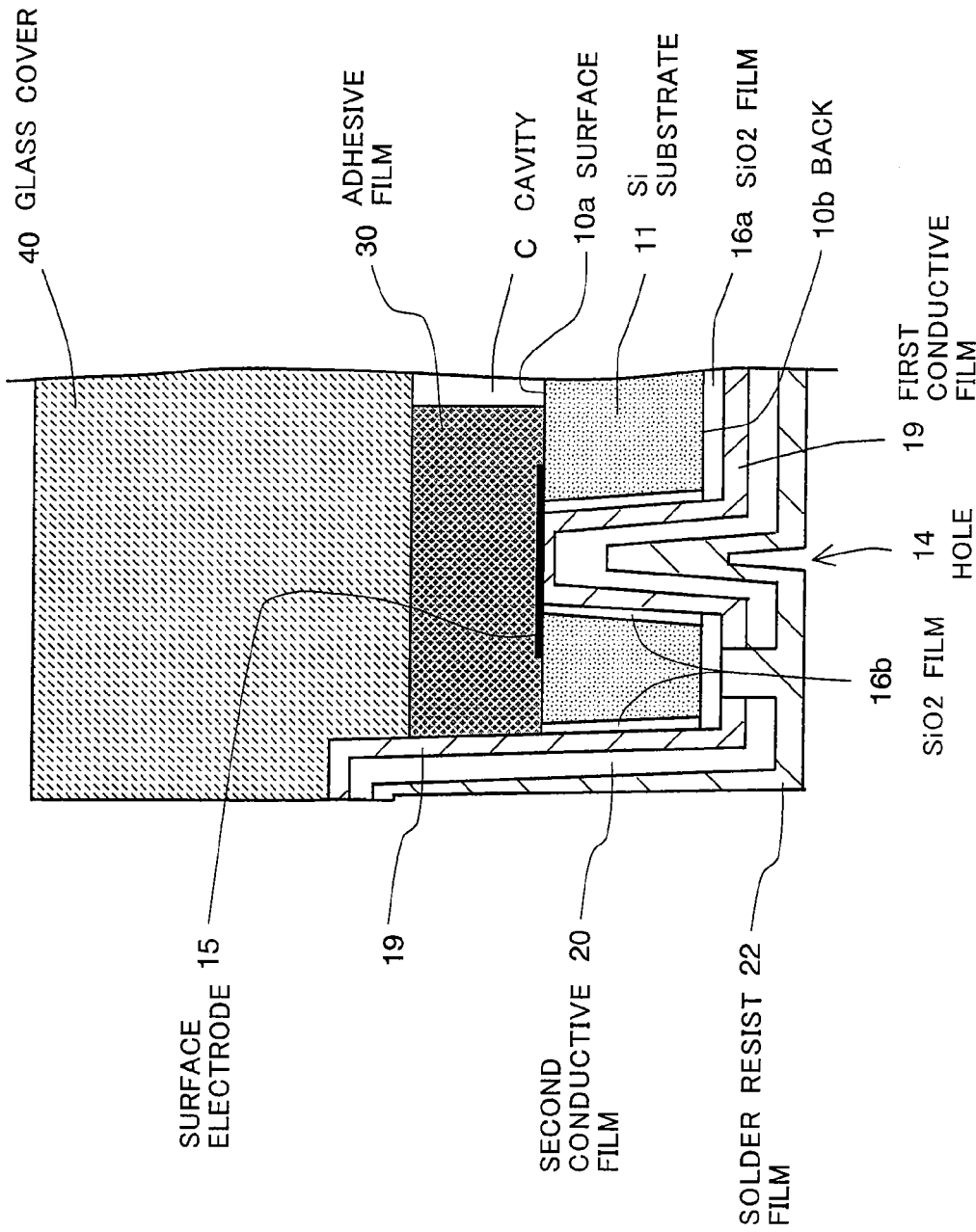
FIG. 21 is a partial, enlarged cross-sectional view of an end of the semiconductor device (solid-state image pickup device) according to the second embodiment of the present invention.
Figure 22:
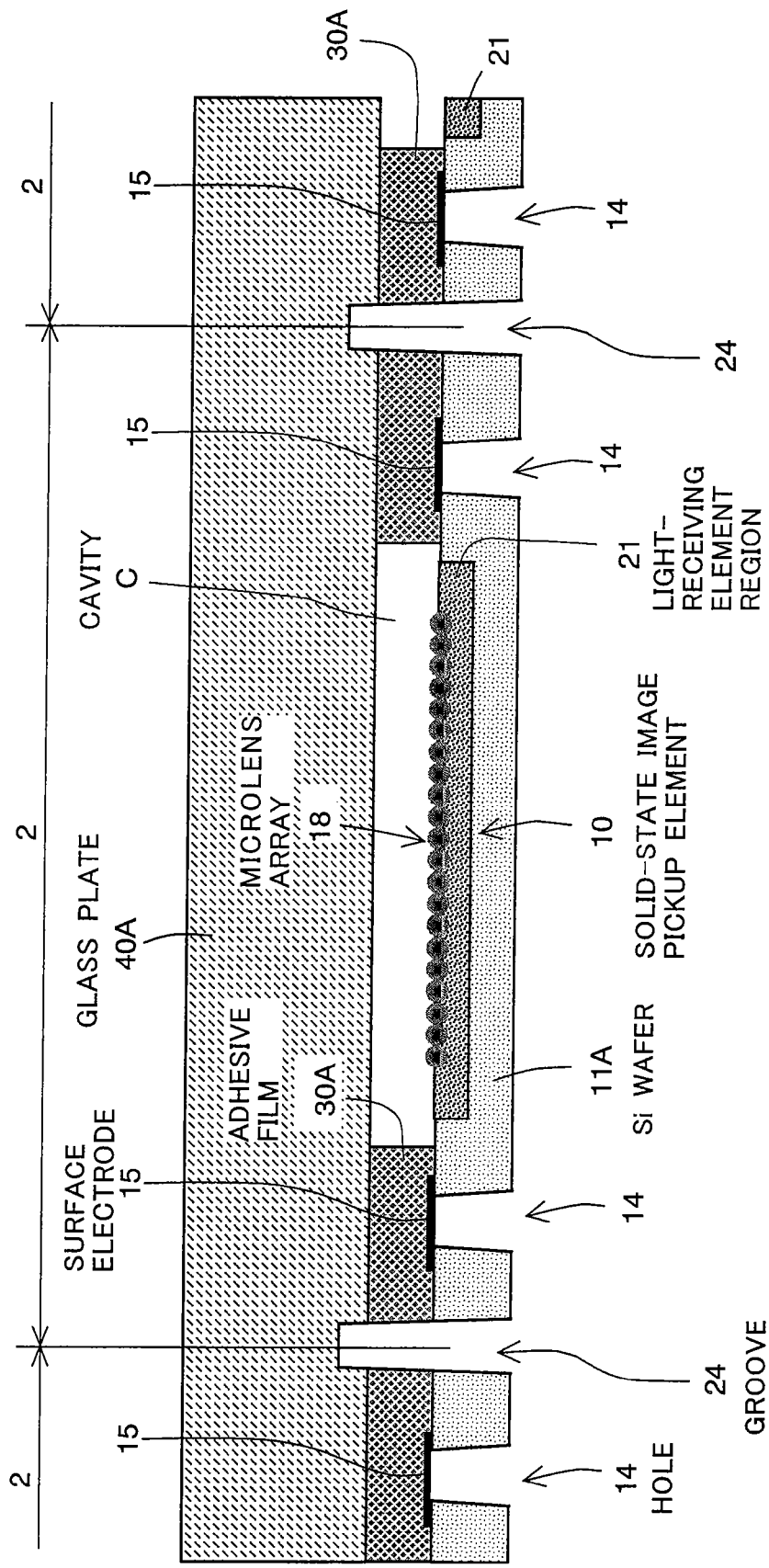
FIG. 22 is a partial cross-sectional view showing the process step of a method of fabricating the semiconductor device (solid-state image pickup device) according to the second embodiment of the present invention.
Figure 23:
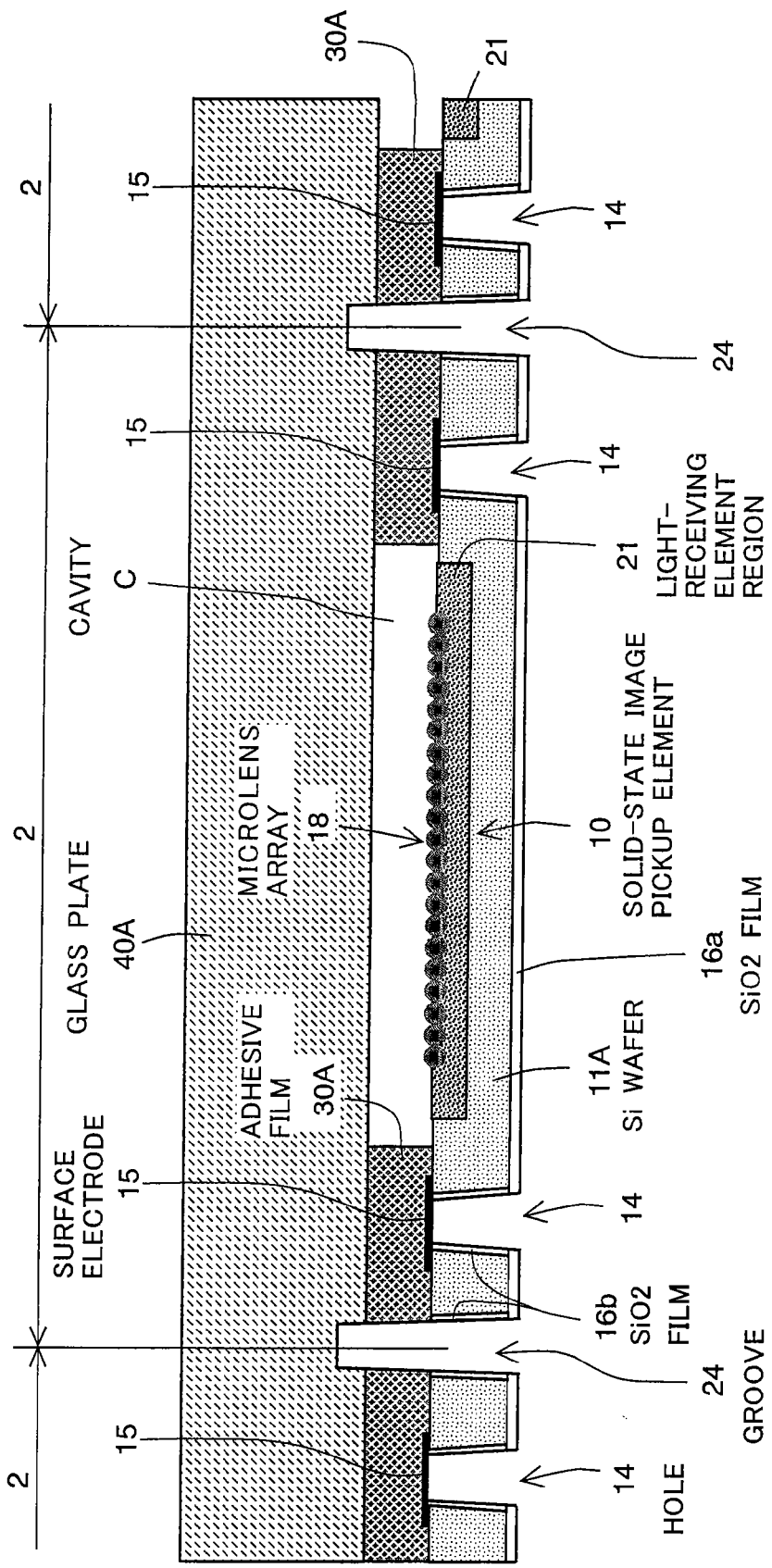
FIG. 23 is a partial cross-sectional view showing the process step of the method of fabricating the semiconductor device (solid-state image pickup device) according to the second embodiment of the present invention, which is subsequent to the step of FIG. 22.
Figure 24:
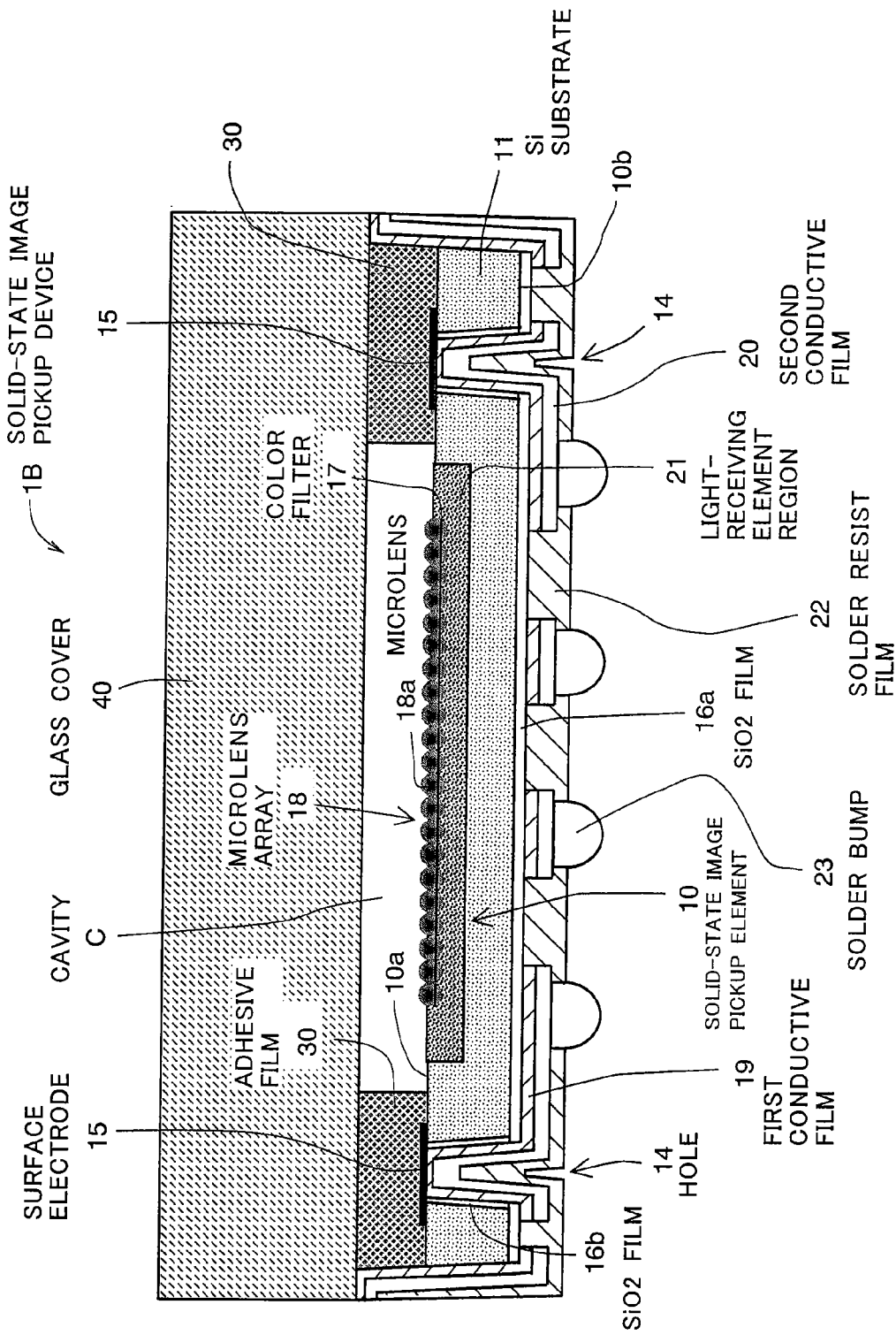
FIG. 24 is a cross-sectional view showing the schematic structure of a semiconductor device (which is configured as a solid-state image pickup device) according to the third embodiment of the present invention.

FIG. 20 shows the schematic structure of the solid-state image pickup device 1A according to the second embodiment, FIG. 21 shows an end of the device 1A under magnification, and FIGS. 22 to 24 show the process steps of a method of fabricating the device 1A, respectively.

As shown in FIGS. 20 and 21, the solid-state image pickup device 1A has the same structure as the above-described solid-state image pickup device 1 of the first embodiment except that (a) all the outer side faces of the chip-shaped solid-state image pickup element 10 (in other words, the silicon substrate 11) are covered with the $SiO_2$ film 16b, and (b) the stack of the first and second conductive films 19 and 20, which is formed on the $SiO_2$ film 16b, is electrically insulated from the silicon substrate 11. Therefore, the explanation for the same structural parts will be omitted here by attaching the same reference numerals as used in the first embodiment to the same elements.

The fabrication method of the image pickup device 1A of the second embodiment is the same as that of the device 1 of the first embodiment except that the step (see FIG. 8) of forming the grooves 24 in the silicon wafer 11A from its back side is performed before the step (see FIG. 7) of forming the $SiO_2$ films 16a and 16b on the wafer 11A from its back side, as shown in FIGS. 22 and 23.

Figure 16:
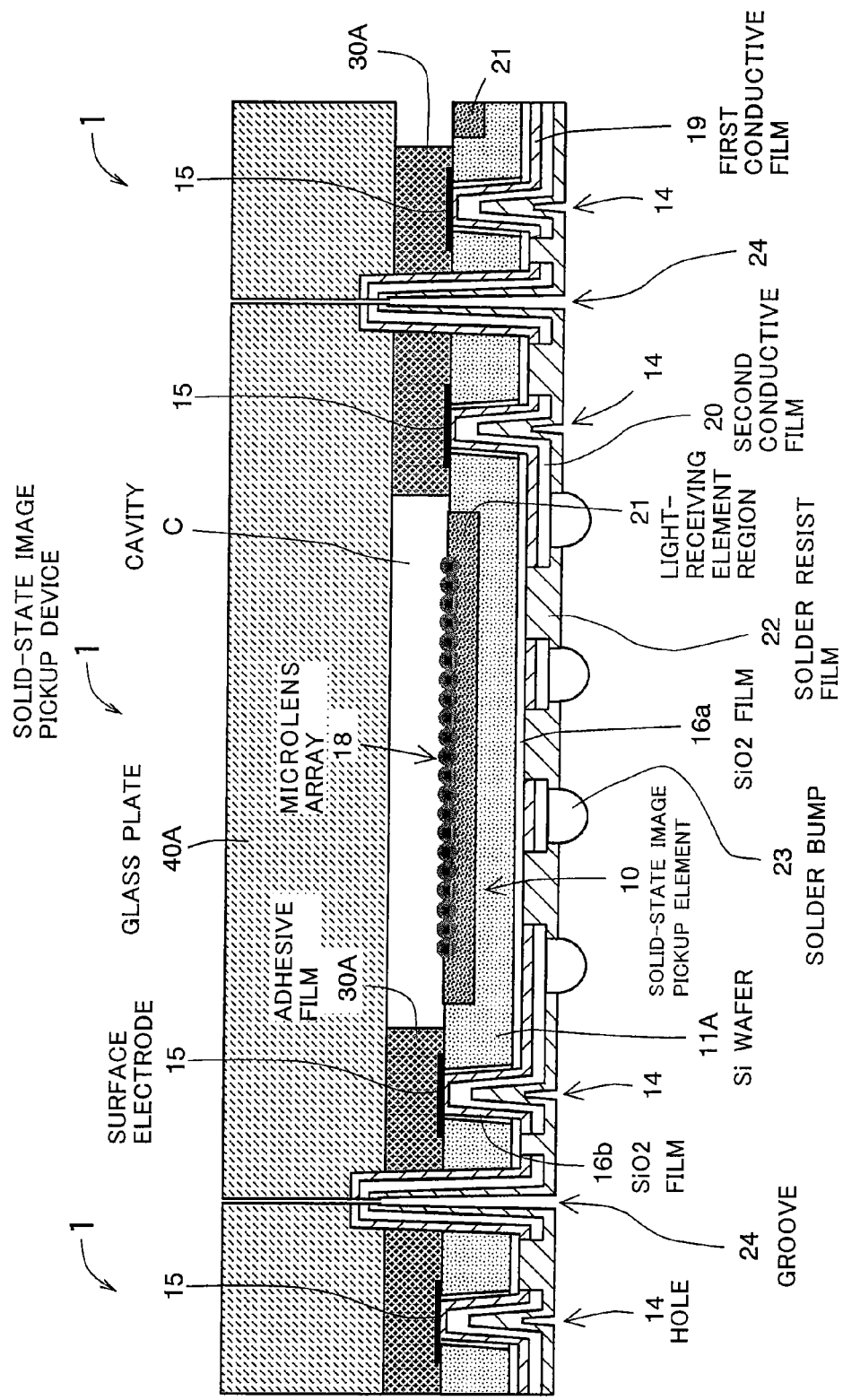
FIG. 16 is a partial cross-sectional view showing the process step of the method of fabricating the semiconductor device (solid-state image pickup device) according to the first embodiment of the present invention, which is subsequent to the step of FIG. 15.

Specifically, after the steps of FIGS. 3 to 6 in the first embodiment are carried out, the grooves 24 are formed in the silicon wafer 11A from its back side, as shown in FIG. 22. Next, as shown in FIG. 23, the $SiO_2$ films 16a and 16b are formed on the wafer 11A from its back side. As a result, the $SiO_2$ film 16b is formed not only on the inner walls of the holes 14 but also on the inner walls of the grooves 24. In this state, the step of forming the first conductive film 19 shown in FIG. 9, the step of forming the resist film 52 for plating shown in FIG. 10, the step of electroplating shown in FIG. 11, the step of removing the resist film 52 shown in FIG. 12, the step of selectively removing the first conductive film 19 shown in FIG. 13, the step of forming the solder resist film 2 shown in FIG. 14, the step of forming the solder bumps 23 shown in FIG. 15, and the step of dicing shown in FIG. 16 are carried out successively. As a result, a plurality of the image pickup devices 1A of the second embodiment is fabricated in a lump.

With the image pickup devices 1A of the second embodiment, the same structure as the above-described solid-state image pickup device 1 of the first embodiment is provided except that (a) all the outer side faces of the silicon substrate 11 of the image pickup element 10 are covered with the $SiO_2$ film 16b, and (b) the stack of the first and second conductive films 19 and 20 is formed on the $SiO_2$ film 16b. Therefore, it is apparent that the same advantages as those of the first embodiment are obtained except that the electromagnetic shielding effect of the first embodiment is not obtained due to electrical insulation between the stack of the first and second conductive films 19 and 20 and the silicon substrate 11.

Third Embodiment

FIG. 24 shows the schematic structure of a semiconductor device according to the third embodiment of the invention. With the third embodiment also, the semiconductor device is configured as a solid-state image pickup device 1B, similar to the first embodiment.

As shown in FIG. 24, the solid-state image pickup device 1B of the third embodiment has the same structure as the above-described solid-state image pickup device 1 of the first embodiment except that the end (the upper end in FIG. 24) of the first conductive film 19 that covers all the side faces of the silicon substrate 11 of the image pickup element 10 is located on the inner surface of the glass cover 40, and the said end does not enter the inside of the cover 40. Therefore, the explanation for the same structural parts will be omitted here by attaching the same reference numerals as used in the first embodiment to the same elements.

As shown in FIG. 24, the stack of the first and second conductive films 19 and 20 is extended upward on the whole circumference of the back 11b from the outer edge or fringe of the back 11b of the image pickup element 10, reaching the inner surface of the cover 40 across the outer side faces of the element 10 and the outer side faces of the adhesive film 30. For this reason, this stack covers the region including all the outer side faces of the element 10 (which are approximately perpendicular to the back 10b), all the outer side faces of the adhesive film 30 (which are approximately perpendicular to the back 10b also), the interface between the adhesive film 30 and the element 10, and the interface between the adhesive film 30 and the cover 40.

In the step (see FIG. 8) of forming the grooves 24 that penetrate through the silicon substrate 11 of the element 10 and the adhesive film 30, the bottoms of the grooves 24 (the upper ends in FIG. 8) are positioned in such a way as to be located on the inner surface of the cover 40 and not to enter the inside of the cover 40. Thus, the image pickup device 1B of the third embodiment can be easily fabricated in the same manner as the above-described first embodiment.

With the image pickup devices 1B of the third embodiment, the same structure as the above-described solid-state image pickup device 1 of the first embodiment is provided except that the end of the first conductive film 19 is located on the inner surface of the cover 40 and does not enter the inside of the cover 40. Therefore, it is apparent that the same advantages as those of the first embodiment are obtained.

In addition, similar to the image pickup device 1A of the second embodiment (see FIGS. 20 and 21), all the outer side faces of the silicon substrate 11 of the image pickup element 10 may be covered with the $SiO_2$ film 16b, and the stack of the first and second conductive films 19 and 20 may be formed on the $SiO_2$ film 16b in the third embodiment.

Fourth Embodiment

Figure 25:
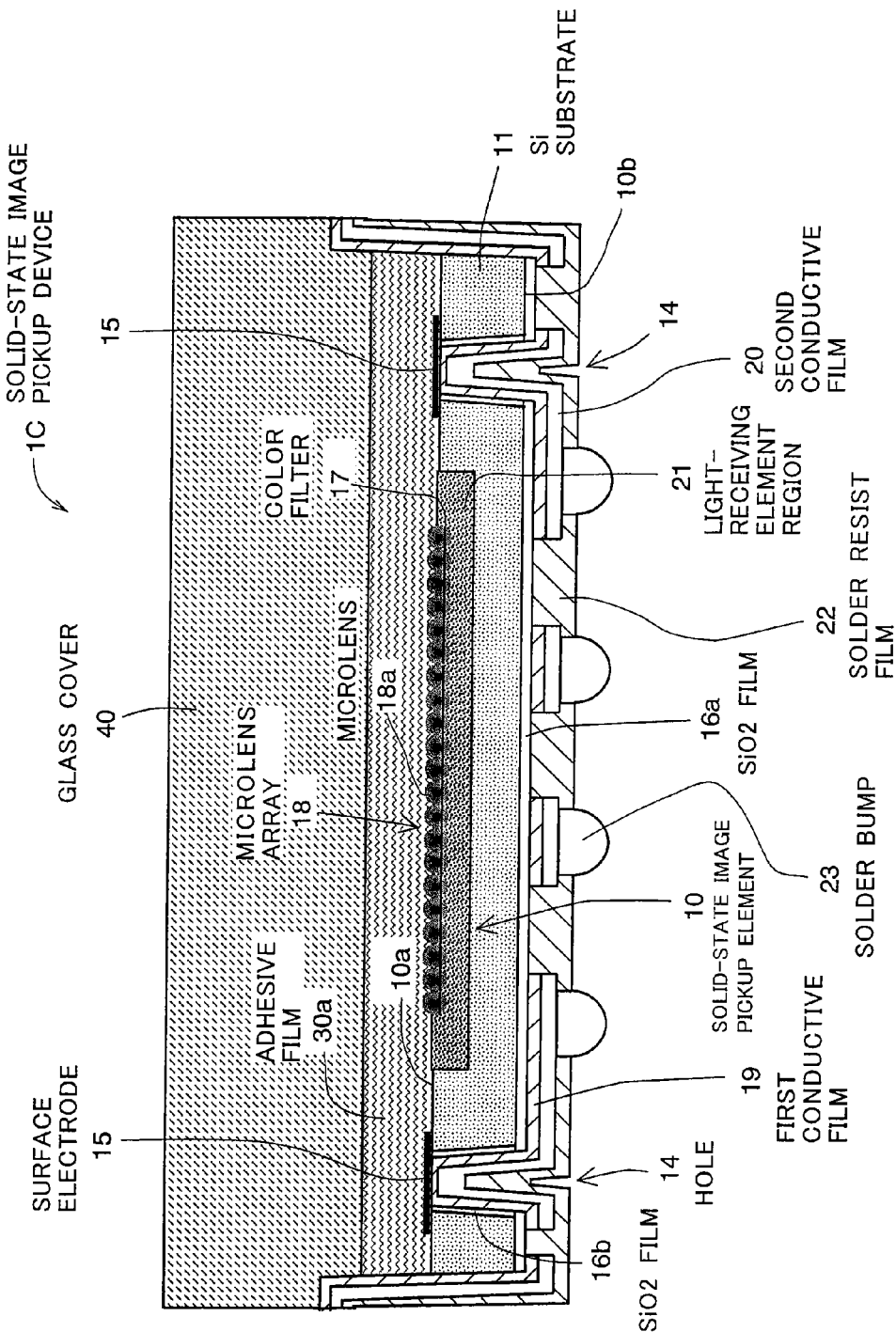
FIG. 25 is a cross-sectional view showing the schematic structure of a semiconductor device (which is configured as a solid-state image pickup device) according to the fourth embodiment of the present invention.

FIG. 25 shows the schematic structure of a semiconductor device according to the fourth embodiment of the invention. With the fourth embodiment also, the semiconductor device is configured as a solid-state image pickup device 1C, similar to the first embodiment.

As shown in FIG. 25, the solid-state image pickup device 1C of the fourth embodiment has the same structure as the above-described solid-state image pickup device 1 of the first embodiment except that (a) an adhesive film 30a that adheres the glass cover 40 to the image pickup element 10 covers the whole surface 10a of the element 10, and (b) the cavity C is not present between the element 10 and the cover 40. Therefore, the explanation for the same structural parts will be omitted here by attaching the same reference numerals as used in the first embodiment to the same elements.

The adhesive film 30a is formed to cover the whole surface of the image pickup element 10. Thus, the adhesive film 30a needs to be formed by using an adhesive with the following properties:

(i) The adhesive is transparent to incident light.

(ii) The adhesive has such a refractive index as to minimize the effects applied to the image pickup operation, e.g., a refractive index close to the value (=1) of the air.

(iii) The adhesive has a small thermal expansion coefficient difference with respect to the element 10 and the cover 40.

In the step (see FIG. 4) of joining the glass plate 40A to the silicon wafer 11A, the adhesive is coated to cover the whole surface of the wafer 11A and then, the glass plate 40A is attached thereto. Thus, the image pickup device 1C of the fourth embodiment can be easily fabricated in the same manner as the above-described first embodiment.

With the image pickup devices 1C of the fourth embodiment, the same structure as the above-described solid-state image pickup device 1 of the first embodiment is provided except that (a) the adhesive film 30a covers the whole surface 10a of the image pickup element 10 and (b) the cavity C is not present between the element 10 and the cover 40. Therefore, it is apparent that the same advantages as those of the first embodiment are obtained.

Specifically, even if the cavity C is not present, there is a possibility that the moisture enters the inside of the image pickup device 1C by way of the interface between the adhesive film 30a and the image pickup element 10 and/or the interface between the adhesive film 30a and the glass cover 40, resulting in reliability degradation. With the image pickup device 1C of the fourth embodiment, however, the region including at least all the outer side faces of the image pickup element 10, all the outer side faces of the adhesive film 30a, the interface between the adhesive film 30a and the element 10, and the interface between the adhesive film 30a and the cover 40 is covered with the stack of the first and second conductive films 19 and 20 (which corresponds to the metal film for moisture entry prevention). Accordingly, the reliability degradation of the image pickup device 1C caused by the moisture existing in the air can be suppressed with a simple structure.

Moreover, the image pickup device 1C can be fabricated in such a way that almost no process step is added to the conventional fabrication process steps of a semiconductor device of this type in the wafer level and almost no change is applied thereto.

In addition, with the image pickup devices 1C of the fourth embodiment, similar to the above-described image pickup devices 1A of the second embodiment (see FIGS. 20 and 21), all the outer side faces of the silicon substrate 11 of the image pickup element 10 may be covered with the $SiO_2$ film 16b, and the stack of the first and second conductive films 19 and 20 may be formed on the $SiO_2$ film 16b. Furthermore, similar to the above-described image pickup devices 1B of the third embodiment (see FIG. 24), the end of the first conductive film 19 may be located on the inner surface of the glass cover 40 in such a way as not to enter the inside of the cover 40.

Fifth Embodiment

Figure 26:
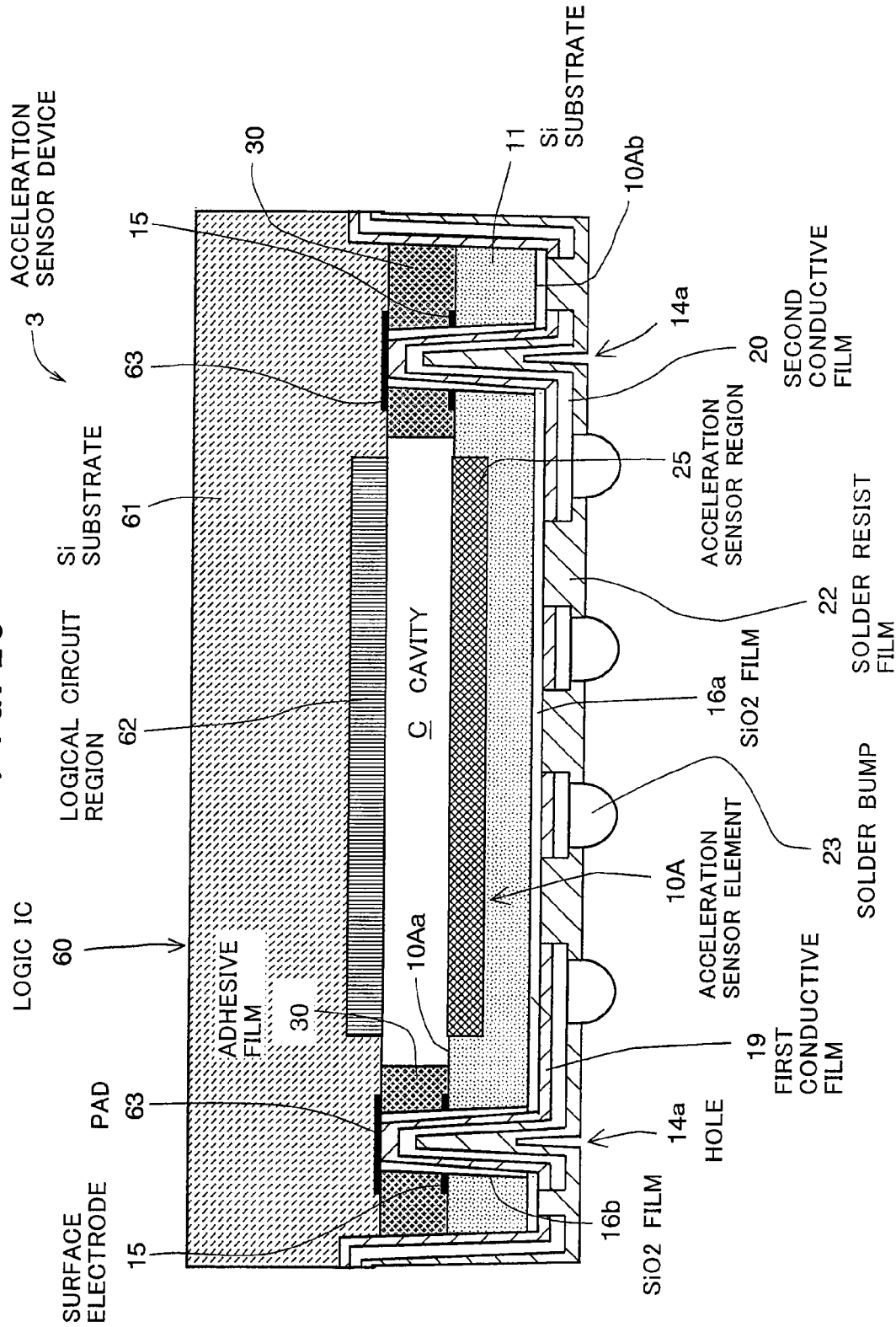
FIG. 26 is a cross-sectional view showing the schematic structure of a semiconductor device (which is configured as an acceleration sensor device) according to the fifth embodiment of the present invention.
Figure 27:
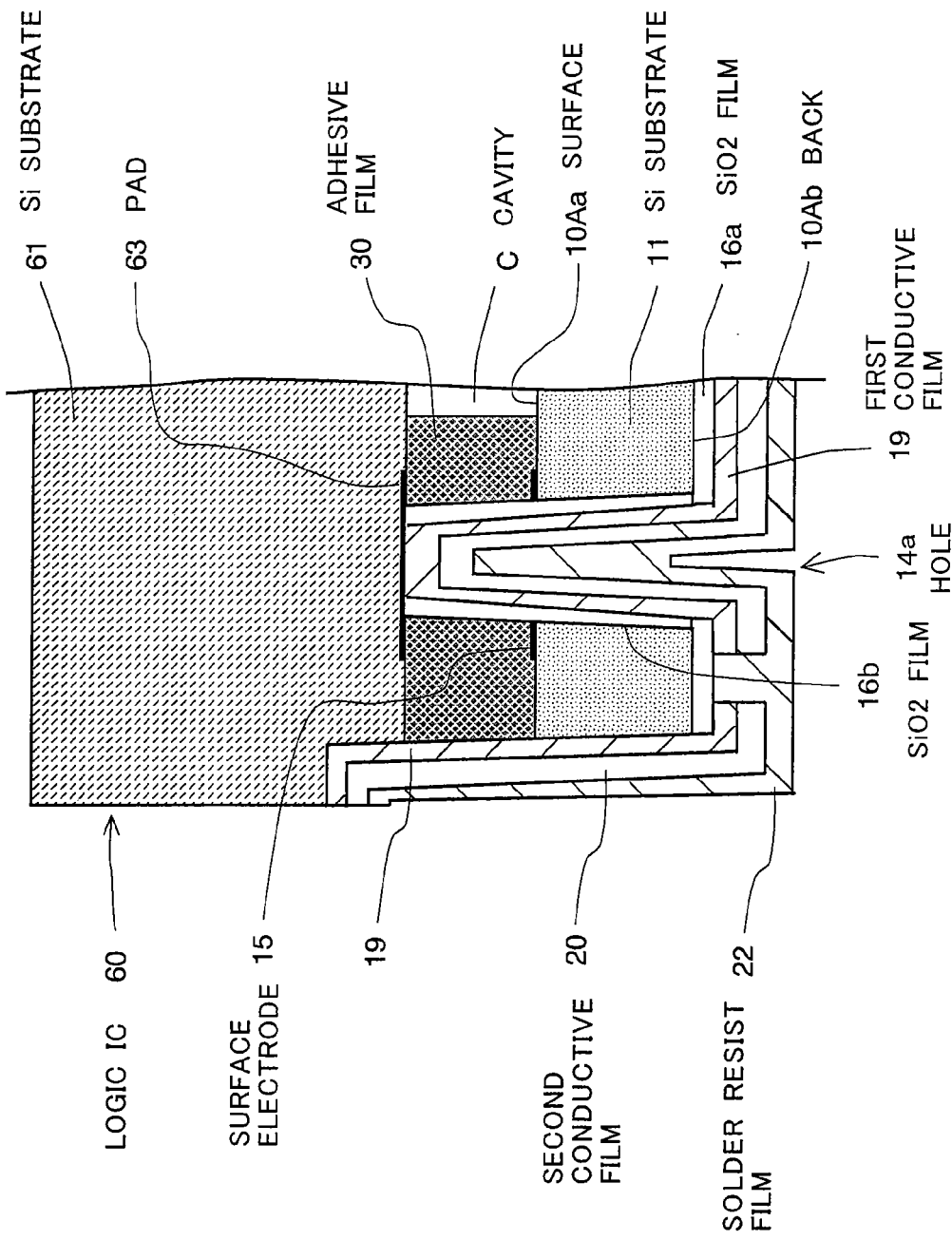
FIG. 27 is a partial, enlarged cross-sectional view of an end of the semiconductor device (acceleration sensor device) according to the fifth embodiment of the present invention.

FIG. 26 shows the schematic structure of a semiconductor device according to the fifth embodiment of the present invention, and FIG. 27 shows the end portion thereof under magnification. In this embodiment, the semiconductor device is configured as an acceleration sensor device.

Structure of Fifth Embodiment

As shown in FIG. 26, an acceleration sensor device 3 according to the fifth embodiment of the invention comprises a structure that a chip-shaped logic Integrated Circuit (IC) (in other words, a set of logic circuit elements) 60 as a functional member is stacked on an acceleration sensor element 10A as a chip-shaped semiconductor element having an acceleration sensor function and fixed thereto. This means that the chip-shaped semiconductor element with the different function from the acceleration sensor element 10A is used as the functional member. The acceleration sensor element 10A is approximately rectangular plate-shaped. The logic IC 60 also is approximately rectangular plate-shaped, which is approximately equal in size to the acceleration sensor element 10A. The logic IC 60 has the structure that a logical circuit region 62 is formed in a single-crystal silicon substrate 11, where a predetermined logical operation or operations is/are applied to the electric signals outputted from the acceleration sensor element 10A, and the resultant electric signals are outputted to the outside.

Accordingly, it may be said that the acceleration sensor device 3 of the fifth embodiment is a semiconductor device with a chip-on-chip structure configured by stacking the chip-shaped logic IC 60 on the chip-shaped acceleration sensor element 10A.

It is needless to say that a piece (or chip) of such a glass plate as used in the above-described first embodiment, a piece (or chip) of a mere semiconductor substrate (where no integrated circuit is built in), or the like may be used as the functional member. (In these two cases, the functional member serves a function as the cover of a semiconductor element.) However, with the semiconductor device of the present invention, a desired circuit function may be incorporated into the functional member, as seen from the fifth embodiment. In this case, other function or functions may be added to (or combined with) the function of the chip-shaped semiconductor element (here, the acceleration sensor element 10A) and therefore, the functions performed by the said semiconductor device are increased. As a result, there arises an additional advantage that an apparatus or system to which the said semiconductor device is incorporated can be miniaturized furthermore.

A rectangular acceleration sensor region (an active region) 25 is formed in the approximately central part of the surface 10Aa of the acceleration sensor element 10A (in other words, the silicon substrate 11), as shown in FIGS. 26 and 27. An adhesive film 30, which has an approximately rectangular frame-like shape, is formed on the outside area of the acceleration sensor region 25 so as to surround the same region 25. (See FIGS. 18 and 19.) The logic IC 60 is adhered to the surface 10Aa of the acceleration sensor element 10A with the adhesive film 30. A hermetically sealed cavity (in other words, an air gap) C is formed between the acceleration sensor region 25 and the logic IC 60. The inside of the cavity C is usually filled with the air; however it may be filled with nitrogen gas or an inert gas (e.g., argon gas).

Any adhesive may be used for the adhesive film 30 if the logic IC 60 can be adhered to the acceleration sensor element 10A with it. It is preferred that the adhesive has such a property that the moisture in the air is difficult to penetrate. In this case, it is more preferred that the adhesive has water repellency. Preferably, the adhesive has such a property that light is difficult to pass through, in other words, the adhesive has a low transmittance of light.

The acceleration sensor element 10A comprises a single-crystal silicon substrate 11, the surface of which corresponds to the surface 10Aa of the element 10A. The acceleration sensor region 25 is formed on the surface of the substrate 11. Acceleration sensor structures (not shown) each having an acceleration sensing function are formed in the acceleration sensor region 25. The total number of the acceleration sensor structures is determined according to the necessity; therefore the total number of the acceleration sensor structures may be unity or plural. Here, it is supposed that three acceleration sensor structures for detecting (or measuring) respectively the accelerations along the X-, Y-, and Z-axes intersecting at right angles are provided. The peripheral area of the acceleration sensor region 25 is exposed in the cavity C.

As the acceleration sensor structures formed in the acceleration sensor region 25, a MEMS (Micro-Electrical-Mechanical System) type acceleration sensor structure may be optionally used. The MEMS type acceleration sensor structure, which measures the acceleration of a target body, is configured by an electrical-mechanical system formed by free use of the micromachining technology in the semiconductor device field. For example, the "piezoresistance type", "capacitance type", "thermal detection type" and so on are known, any of which may be used for the fifth embodiment of the invention.

With the acceleration sensor structure of the "piezoresistance type", a weight is mechanically supported by a holding member with plural beams in such a way that the position of the weight is relatively changed due to applied acceleration with respect to the holding member. The stresses of the respective beams generated by the displacements of the weight are respectively converted to electrical resistance changes and derived for measuring the acceleration.

With the acceleration sensor structure of the "capacitance type", a weight is provided near a fixing part (i.e., an anchor) in such a way that the position of the weight is relatively changed due to applied acceleration with respect to the fixing part. The capacitance change between the weight and the fixing part generated by the displacements of the weight is derived for measuring the acceleration.

With the acceleration sensor structure of the "thermal detection type", it is structured that the air confined in a closed space is heated with a heater in such a way that the heated air is relatively displaced in the space due to applied acceleration. The displacement of the heated part (i.e., high temperature part) generated by the displacement of the air is detected for measuring the acceleration.

As shown in FIG. 26, the acceleration sensor region 25 is illustrated in such a way as to be exposed from the surface 10Aa of the substrate 11 in the cavity C in the fifth embodiment; however, the present invention is not limited to this. The acceleration sensor region 25 may be covered with an additional film or films (e.g., an insulating film). Moreover, the surface 10Aa of the acceleration sensor element 10A formed outside the region 25 is also exposed similarly, and the adhesive film 30 is directly adhered onto the surfaced 10Aa in the fifth embodiment; however, the present invention is not limited to this. The surface 10Aa located outside the region 25 may be covered with an additional film or films (e.g., an interlayer insulating film, and/or a SOG film). In this case, the adhesive film 30 is adhered onto the additional film or films.

The distance between the surface of the acceleration sensor region 25 and the inner surface of the logic circuit region 62 is approximately equal to the thickness of the adhesive film 30.

The logic IC 60 is adhered to the surface 10Aa of the acceleration sensor element 10A with the adhesive film 30 and as a result, the logic IC 60 is united with the element 10A. The logic IC 60 is formed by a cut piece (i.e., a chip) of the single-crystal silicon wafer into which a plurality of the logic circuit regions (active regions) 62 have been incorporated. However, it is needless to say that a cut piece or chip of the other semiconductor wafer than single-crystal silicon may be used.

The logic circuit region 62 is formed in the approximately central part of the surface (the lower surface in FIG. 26) of the logic IC 60. Since the internal structure of the region 62 is well known, the explanation about it is omitted here. Pads (or electrodes) 63 are formed in the outside area of the region 62 (which is overlapped with the adhesive film 30) to surround the same region 62. The pads 63 are formed by patterning an appropriate conductive film (e.g., an aluminum film). The pads 63 are arranged at predetermined intervals in almost all the outside area with a rectangular frame-like shape. Each of the pads 63 is electrically connected to a corresponding one of the logic circuits in the region 62 by way of a corresponding one of the leading lines (not shown) formed on the surface of the logic IC 60. All the pads 63 are superposed on the adhesive film 30.

Penetrating holes 14a, which penetrate through the acceleration sensor element 10A (the silicon substrate 11) and the adhesive film 30, are formed just below the respective pads 63, as shown in FIGS. 26 and 27. These holes 14a are provided for electrical connection between the respective pads 63 and the wiring lines or electrodes formed on the back 10Ab of the element 10A. The inner wall of each hole 14a is covered with a $SiO_2$ film 16b. Since the $SiO_2$ film 16b does not exist on the back of each pad 63 in the hole 14a, the back of each pad 63 is exposed. For this reason, the patterned first conductive film 19, which is formed on the back side of the acceleration sensor element 10A, is in contact with the respective pads 63. This means that the first conductive film 19 is electrically connected to the respective pads 63. The second conductive film 20 is formed on the first conductive film 19. The parts of the stack of the first and second conductive films 19 and 20 existing in the holes 14a constitute buried interconnection lines. Needless to say, any other insulating film than a $SiO_2$ film, for example, a $SiN_x$ film, may be used for this purpose.

On the surface 10Aa of the acceleration sensor element 10A, the surface electrodes 15 are formed to surround the acceleration sensor region 25 in the area superposed on the adhesive film 30, similar to the above-described first embodiment. The surface electrodes 15 are formed by patterning an appropriate conductive film (e.g., an aluminum film). The surface electrodes 15, which are located on the positions superposed on the corresponding pads 63, are arranged at predetermined intervals in almost all the outside area with a rectangular frame-like shape. Each of the holes 14a is formed to penetrate through a corresponding one of the surface electrodes 15.

Although not shown in FIGS. 26 and 27, in the superposed area of the surface 10Aa of the acceleration sensor element 10A on the adhesive film 30, the surface electrodes 15 are additionally formed at the positions that are not superposed on the pads 63. Similar to the above-described first embodiment, the penetrating holes 14 penetrating through the acceleration sensor element 10A only are formed in addition to the holes 14a. The input and output terminals (not shown) of the acceleration sensor region 25 are electrically connected to the wiring lines formed on the back 10Ab of the element 10A by way of the surface electrodes 15 and the buried interconnection lines (which are formed by the stack of the first and second conductive films 19 and 20) in the holes 14 in the same way as that of the first embodiment.

The back 10Ab of the acceleration sensor element 10A is covered with the $SiO_2$ film 16a except for the opening mouths of the penetrating holes 14 and 14a. Needless to say, any other insulating film than a $SiO_2$ film (e.g., a $SiN_x$ film) may be used for this purpose.

On the $SiO_2$ film 16a located on the back 10Ab of the acceleration sensor element 10A, the patterned first conductive film 19 (Here, a Ti—Cu two-layer film formed by a stack of a Ti subfilm and Cu subfilm) with a predetermined shape is formed, similar to the first embodiment. On the first conductive film 19, the patterned second conductive film 20 (here, a single-layer Cu film) is formed to have the same shape as the first conductive film 19. Each part of the patterned stacked films 19 and 20 constitute the wiring line formed on the back 10Ab.

Similar to the first embodiment, the stack of the first and second conductive films 19 and 20 (i.e., the three-layer film formed by the Ti—Cu two-layer film and the Cu film) corresponds to the metal film for moisture entry prevention in the fifth embodiment also.

The second conductive film 20 (i.e., Cu film) is additionally formed on the first conductive film 19 (i.e., Ti—Cu two layer film) because the thickness of the first conductive film 19 is insufficient for the above-described wiring lines. Therefore, if the thickness of the first conductive film 19 is sufficient for the above-described wiring lines, the second conductive film 20 may be omitted. In this case, the first conductive film 19 corresponds to the metal film for moisture entry prevention. This point is the same as the first embodiment.

The solder bumps 23, which serve as the external electrodes, are formed at the predetermined positions on the patterned stack of the first and second conductive films 19 and 20 (i.e., the wiring lines). In the vicinity of each penetrating hole 14a, the stack of the first and second conductive films 19 and 20 enters the inside of the hole 14a to reach the position near the top of the said hole 14a. The part of the first conductive film 19 existing in the said hole 14a is in contact with the back of the corresponding surface electrode 15. In this way, each solder bump 23 is electrically connected to the corresponding pad 63.

Furthermore, the stack of the first and second conductive films 19 and 20 is extended upward in the whole periphery of the back 10Ab of the acceleration sensor element 10A from the outer edge of the back 10Ab along the outer side faces of the element 10A. The stack of the first and second conductive films 19 and 20 reaches the outer side faces of the logic IC 60 in the bottom end thereof beyond the outer side faces of the element 10A and those of the adhesive film 30. Therefore, this stack covers the region that includes (i) all the outer side faces of the element 10A (which are approximately perpendicular to the back 10Ab), (ii) all the outer side faces of the adhesive film 30 (which are approximately perpendicular to the back 10Ab also), (iii) the interface between the adhesive film 30 and the element 10A, (iv) the interface between the adhesive film 30 and the IC 60, and (v) the outer side faces of the IC 60 in the bottom end thereof. This is to prevent the moisture existing in the air from entering the cavity C by way of the adhesive film 30 itself and/or the interfaces between the adhesive film 30 and the members adjacent thereto (i.e., the acceleration sensor element 10A and the logic IC 60), thereby suppressing the performance degradation and/or reliability degradation of the acceleration sensor device 3 due to the moisture thus entered.

In this way, the metal film for moisture entry prevention in the fifth embodiment has the three-layer structure formed by the Cu film as the second conductive film 20 and the Ti—Cu two-layer film as the first conductive film 19 stacked thereon, similar to the first embodiment.

The part of the first conductive film 19, which covers the outer side faces of the acceleration sensor element 10A, is in contact with the outer side faces of the silicon substrate 11. Therefore, the electric potential of the wiring lines that includes the said part is equal to the electric potential of the substrate 11 (i.e., the electric potential of the ground). As a result, an electromagnetic shielding effect against the electromagnetic waves in the neighborhood of the acceleration sensor device 3 is derived.

The back 10Ab of the acceleration sensor element 10A is entirely covered with the solder resist film 22 except for the parts on which the solder bumps 23 are formed. Therefore, only the solder bumps 23 are protruded on the back 10Ab. The first and second conductive films 19 and 20 and the SiO$_2$ film 16a, which are covered with the solder resist film 22, are not exposed to the outside of the acceleration sensor device 3. The parts of the stacked first and second conductive films 19 and 20 located on the outer side faces of the acceleration sensor element 10A are covered with the solder resist film 22 except for their ends located on the outer side faces of the logic IC 60.

The parts of the stacked first and second conductive films 19 and 20 located in the penetrating holes 14a constitute "buried interconnection lines" for electrically connecting the pads 63 located on the inner surface side of the logic IC 60 to the solder bumps 23 located on the back side of the acceleration sensor element 10A by way of the substrate 11 (i.e., the element 10A) and the adhesive film 30. Moreover, the parts of the stacked first and second conductive films 19 and 20 located in the penetrating holes 14 also constitute "buried interconnection lines" for electrically connecting the surface electrodes 15 located on the surface side of the silicon substrate 11 to the solder bumps 23 located on the back side thereof by way of the substrate 11.

All the outer side faces of the stacked structure comprising the logic IC 60 and the acceleration sensor element 10A fixed by the adhesive film 30 are covered with an insulating synthetic resin (which has a light-blocking property, not shown) that constitutes a part of the CSP. However, they may not be covered with the insulating synthetic resin.

The part of the first conductive film 19, which covers the outer side faces of the acceleration sensor element 10A, is in contact with the outer side faces of the silicon substrate 11. Therefore, the electric potential of the wiring lines that includes the said part is equal to the electric potential of the substrate 11 (i.e., the electric potential of the ground). As a result, an electromagnetic shielding effect against the electromagnetic waves in the neighborhood of the acceleration sensor device 3 is derived.

The back 10Ab of the acceleration sensor element 10A is entirely covered with the solder resist film 22 except for the parts on which the solder bumps 23 are formed. Therefore, only the solder bumps 23 are protruded on the back 10Ab of the element 10A. The first and second conductive films 19 and 20 and the SiO$_2$ film 16a, which are covered with the solder resist film 22, are not exposed to the outside of the acceleration sensor device 3. The parts of the stacked first and second conductive films 19 and 20 located on the outer side faces of the element 10A are covered with the solder resist film 22 except for their ends located on the outer side faces of the IC 60.

With the acceleration sensor device 3 according to the fifth embodiment with the above-described structure, the acceleration of the target body to which the acceleration sensor device 3 has been attached is sensed by the acceleration sensor structures formed in the acceleration sensor region 25 of the acceleration sensor element 10A. In response to this, the output electric signals are outputted from the acceleration sensor structures. These output electric signals are then sent to the predetermined wiring lines (which are formed by the patterned stack of the first and second conductive films 19 and 20) located on the back 10Ab of the element 10A by way of the surface electrodes 15 located at the non-overlapped positions with the pads 63, and the buried interconnection lines existing in the holes 14. Subsequently, the output electric signals are sent to the logical circuits in the logic circuit region 62 of the logic IC 60 by way of the buried interconnection lines existing in the predetermined holes 14a and the corresponding pads 63 thereto, and are subjected to a process or processes according to the predetermined logic in the logical circuits. The output electric signals of the said logical circuits thus generated are lead to the corresponding solder bumps 23 by way of the predetermined pads 63, the buried interconnection lines existing in the corresponding holes 14a, and the predetermined wiring lines (which are formed by the patterned stack of the first and second conductive films 19 and 20) located on the back 10Ab and thereafter, outputted toward an external apparatus or system from the said solder bumps 23.

The input signals and the electric power required for the operation of the acceleration sensor device 3 are supplied from the external apparatus or system by way of the predetermined solder bumps 23. Then, the input signals and the electric power are sent to the logical circuit region 62 by way of the predetermined wiring lines located on the back 10Ab, the predetermined buried interconnection lines existing in the holes 14a, and the predetermined pads 63. Alternately, the input signals and the electric power are sent to the acceleration sensor region 25 by way of the predetermined wiring lines located on the back 10Ab, the predetermined buried interconnection lines existing in the holes 14, and the predetermined surface electrodes 15.

Fabrication Method of Fifth Embodiment

Next, a method of fabricating the acceleration sensor device 3 according to the fifth embodiment having the above-described structure will be explained below with reference to FIGS. 28 to 41.

Figure 28:
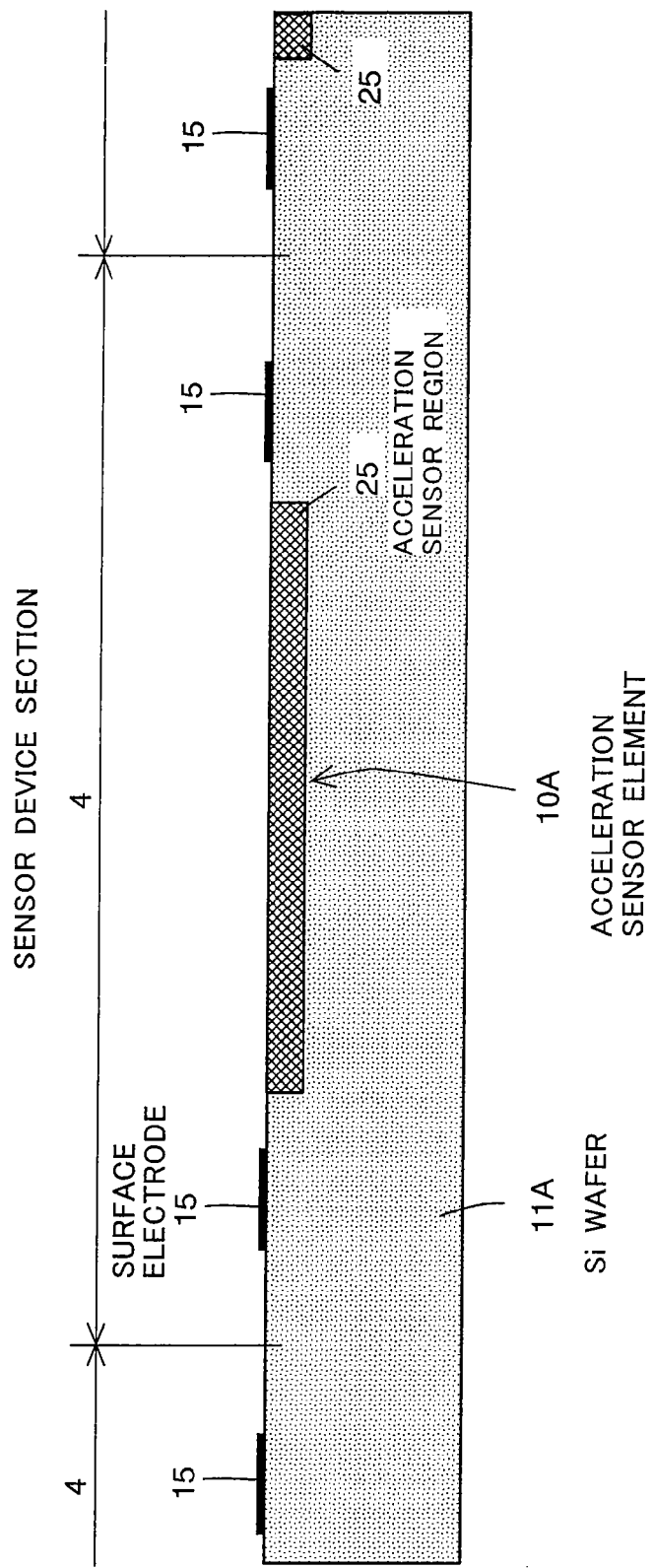
FIG. 28 is a partial cross-sectional view showing the process step of a method of fabricating the semiconductor device (acceleration sensor device) according to the fifth embodiment of the present invention.

Similar to the above-described first embodiment, the respective process steps of this fabrication method explained below are so-called wafer processes, which are carried out in the wafer level. Specifically, the acceleration sensor device 3 with the structure of FIG. 26 is not fabricated individually. As shown in FIG. 28, the sensor device sections 4 (each of which is a region in which the above-described acceleration sensor device 3 is formed) are formed on the silicon wafer 11A in a lump in such a way as to be an array and then, the wafer 11A is subject to a dicing process along the grid-shaped scribe lines 53, thereby separating the sensor device sections 4 from each other. In this way, a plurality of the acceleration sensor devices 3 with the structure of FIG. 26 is fabricated simultaneously.

First, the silicon wafer 11A on which the acceleration sensor elements 10A with the structure of FIG. 28 have been formed in an array is prepared. The fabrication method of the wafer 11A is optional; any standard processes may be used for this purpose. These acceleration sensor elements 10A are respectively arranged in the sensor device sections 4 defined on the wafer 11A. Each of the acceleration sensor elements 10A comprises the acceleration sensor region 25 formed in the surface of the corresponding sensor device section 4 of the wafer 11A.

In each sensor device section 4, a predetermined number of the surface electrodes 15 are formed outside the acceleration sensor region 25 in the surface of the wafer 11A. The surface electrodes 15 surround the acceleration sensor region 25. Each surface electrode 15 is electrically connected to the predetermined electrode formed in the region 25 by way of the corresponding leading wiring lines (not shown).

All the sensor device sections 4 have been judged as good by predetermined inspections. Only one of the sections 4 is shown for simplification in FIG. 28; however, similar to the first embodiment (see FIG. 17), a plurality of the sensor device sections 4 is arranged in an array on the wafer 11A.

Figure 29:
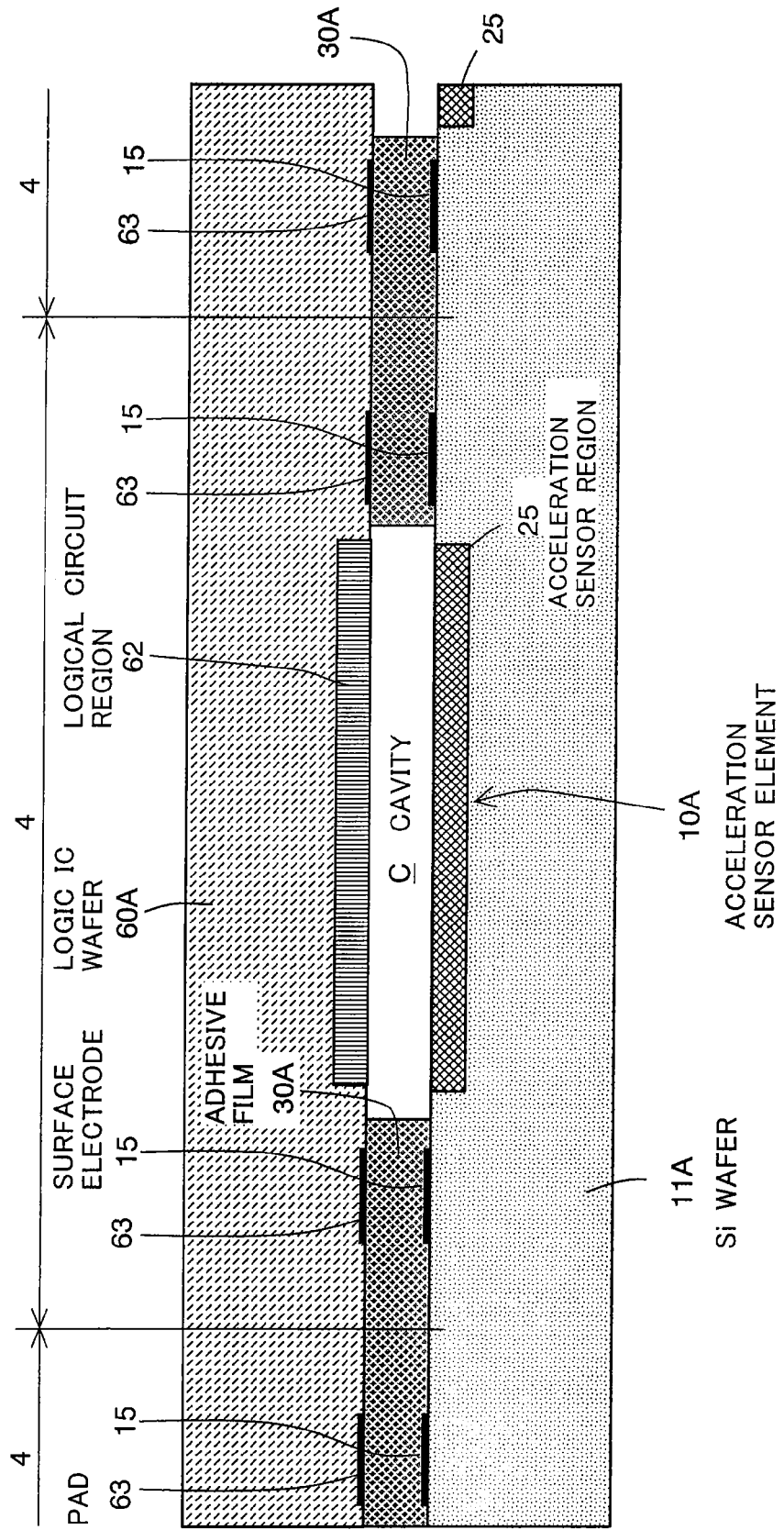
FIG. 29 is a partial cross-sectional view showing the process step of the method of fabricating the semiconductor device (acceleration sensor device) according to the fifth embodiment of the present invention, which is subsequent to the step of FIG. 28.

Next, as shown in FIG. 29, an adhesive film 30A with a grid-shaped pattern is formed on the surface of the wafer 11A comprising the acceleration sensor elements 10A and the surface electrodes 15. The adhesive film 30A covers almost all the surface of the wafer 11A except for the part for the cavity C. Subsequently, a logic IC wafer 60A (which corresponds to a functional member wafer) having the same shape and size as the silicon wafer 11A is turned upside down and placed on the adhesive film 30A, thereby superposing the logic IC wafer 60A on the wafer 11A. At this time, the respective logical circuit regions 62 on the surface of the wafer 60A are opposed to the corresponding acceleration sensor regions 25. Thereafter, ultraviolet rays of a predetermined wavelength are irradiated to the adhesive film 30A with a predetermined intensity (e.g., 2000 mJ/cm$^2$) to thereby curing the adhesive film 30A. Thus, the logic IC wafer 60A is joined to the silicon wafer 11A with the adhesive film 30A thus cured. At this time, the thickness of the adhesive film 30A has a desired value and as a result, the cavities C are formed as desired between the logical circuit regions 62 and the corresponding acceleration sensor regions 25. The state at this stage is shown in FIG. 29.

The formation of the adhesive film 30A is performed, for example, as follows:

First, an adhesive in a fluid or liquid state is coated on the whole surface of the silicon wafer 11A in the air at room temperature by the spin-coating method (which may be coated by the spraying method), forming a coating of the adhesive. Next, the adhesive coating thus formed is patterned to have a grid-like shape using an appropriate mask by the known photolithography method. At this time, the acceleration sensor elements 10A (i.e., the acceleration sensor regions 25) need to be exposed respectively from the corresponding rectangular openings of the adhesive coating in the sensor device sections 4. The thickness of the adhesive coating thus patterned is determined to have such a value that the post-curing thickness of the adhesive coating is equal to the desired thickness of the adhesive film 30A. As the adhesive used here, for example, an adhesive with both a thermosetting property and an UV-setting property is preferably used.

After the joining step of the logic IC wafer 60A is completed in the above-described manner, the stack of the silicon wafer 11A, the adhesive film 30A, and the logic IC wafer 60A is attached to a handling holder (not shown) with an appropriate sticky agent. The surface on which the sticky agent is coated is the back (i.e., the upper surface in FIG. 29) of the logic IC wafer 60A. This is because the next is the step of processing the back of the wafer 11A. The holder may be formed by the same material as the logic IC wafer 60A; however, it may be formed by any other material. It is preferred that the holder is slightly larger in size than the wafer 11A.

Figure 30:
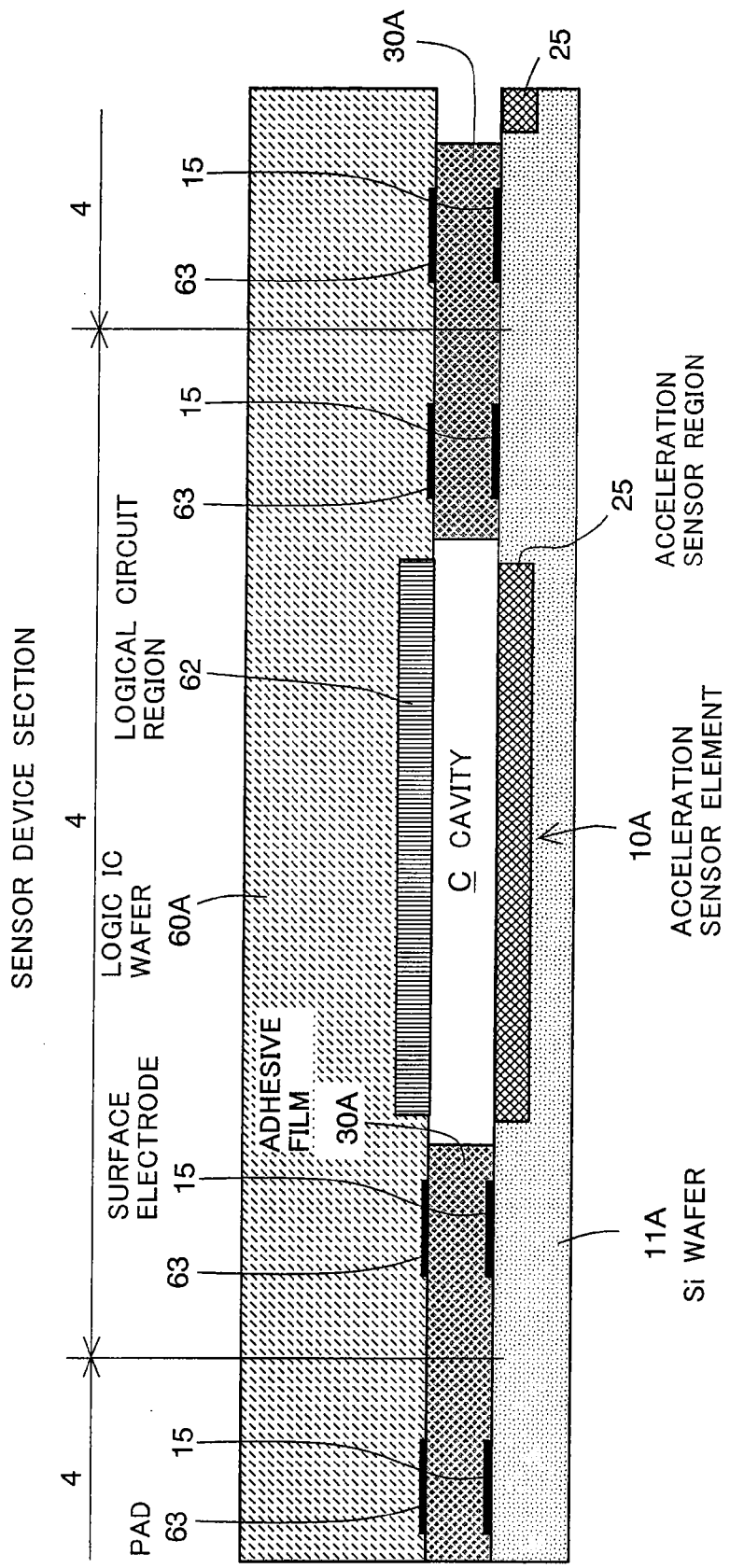
FIG. 30 is a partial cross-sectional view showing the process step of the method of fabricating the semiconductor device (acceleration sensor device) according to the fifth embodiment of the present invention, which is subsequent to the step of FIG. 29.

Next, to make the whole silicon wafer 11A thinner, the back of the wafer 11A is polished until the wafer 11A has a predetermined thickness (e.g., 100 μm to 50 μm) by the CMP method. At this time, the mechanical polishing method may be used along with the CMP method. This thinning step may be carried out by the known dry or wet etching method. The state at this stage time is shown in FIG. 30.

Figure 31:
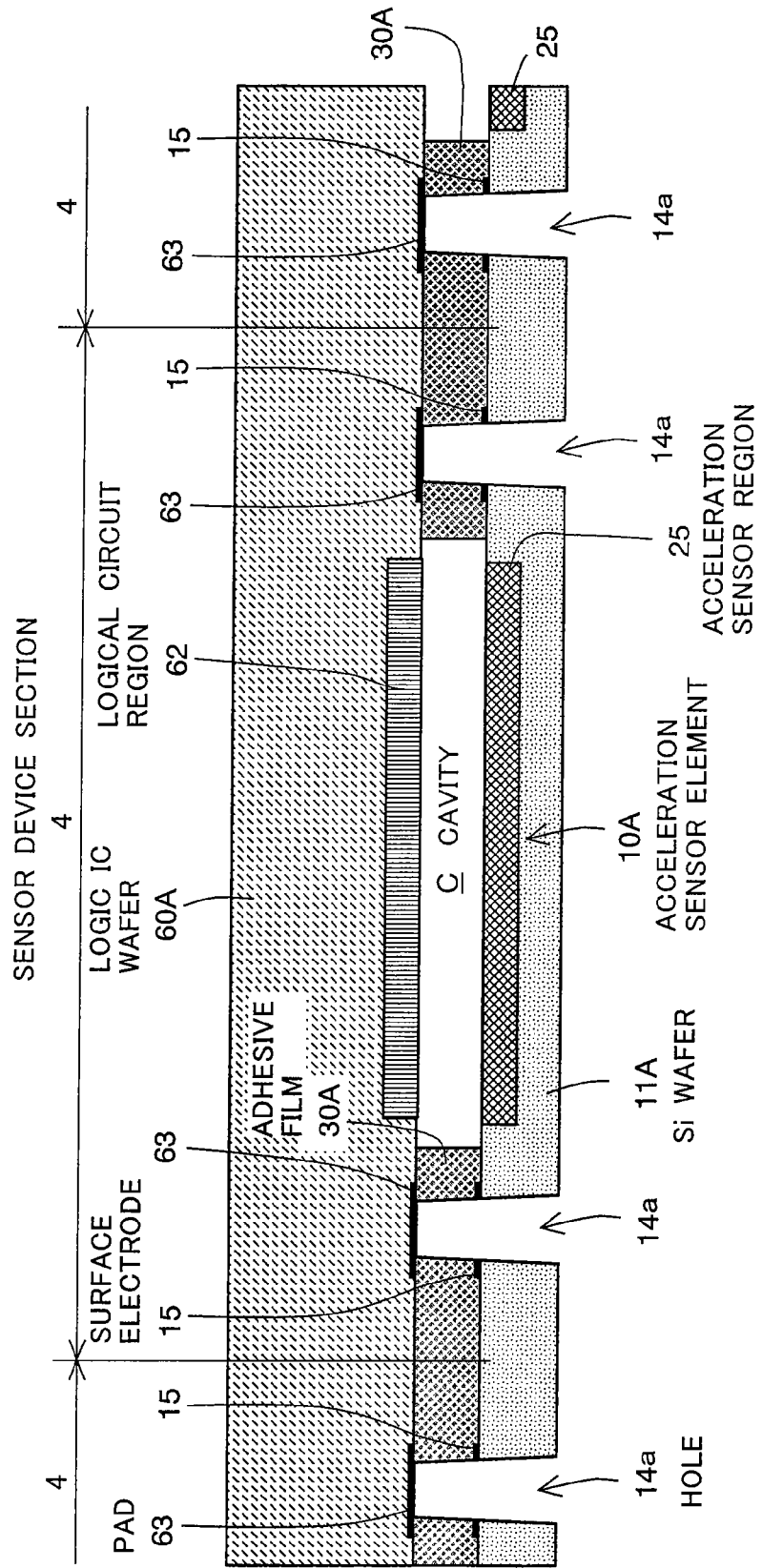
FIG. 31 is a partial cross-sectional view showing the process step of the method of fabricating the semiconductor device (acceleration sensor device) according to the fifth embodiment of the present invention, which is subsequent to the step of FIG. 30.

Subsequently, a patterned resist film (not shown) is formed on the back of the wafer 11A thus thinned entirely and then, the wafer 11A is selectively etched from its back using the said resist film as a mask. As a result, as shown in FIG. 31, the holes 14a penetrating though the wafer 11A, the surface electrodes 15, and the adhesive film 30A are formed. These penetrating holes 14a are respectively located just under the pads 63. The surface-side end of each hole 14a (i.e., the upper end in FIG. 6) reaches the back of the corresponding pads 63. This step may be performed by any other etching method, such as the RIE or ICE method. In addition, this step may be carried out by any other method than etching, such as laser beam machining or anodic oxidation.

After the mask used for the formation of the penetrating holes 14a is removed, a mask for the penetrating holes 14 (not shown) is formed. The wafer 11A is selectively etched from its back in the same manner as that for the holes 14a. As a result, as shown in FIG. 6, the holes 14 penetrating through only the wafer 11A are formed. The penetrating holes 14 are located just under the pads 63 at the positions that are not superposed on the pads 63. The surface-side end of each hole 14 (i.e., the upper end in FIG. 6) reaches the back of the corresponding surface electrode 15.

The formation step of the holes 14a and the formation step of the holes 14 may be interchanged with each other. Specifically, the formation step of the holes 14 may be performed precedently and thereafter, the formation step of the holes 14a may be performed.

Figure 32:
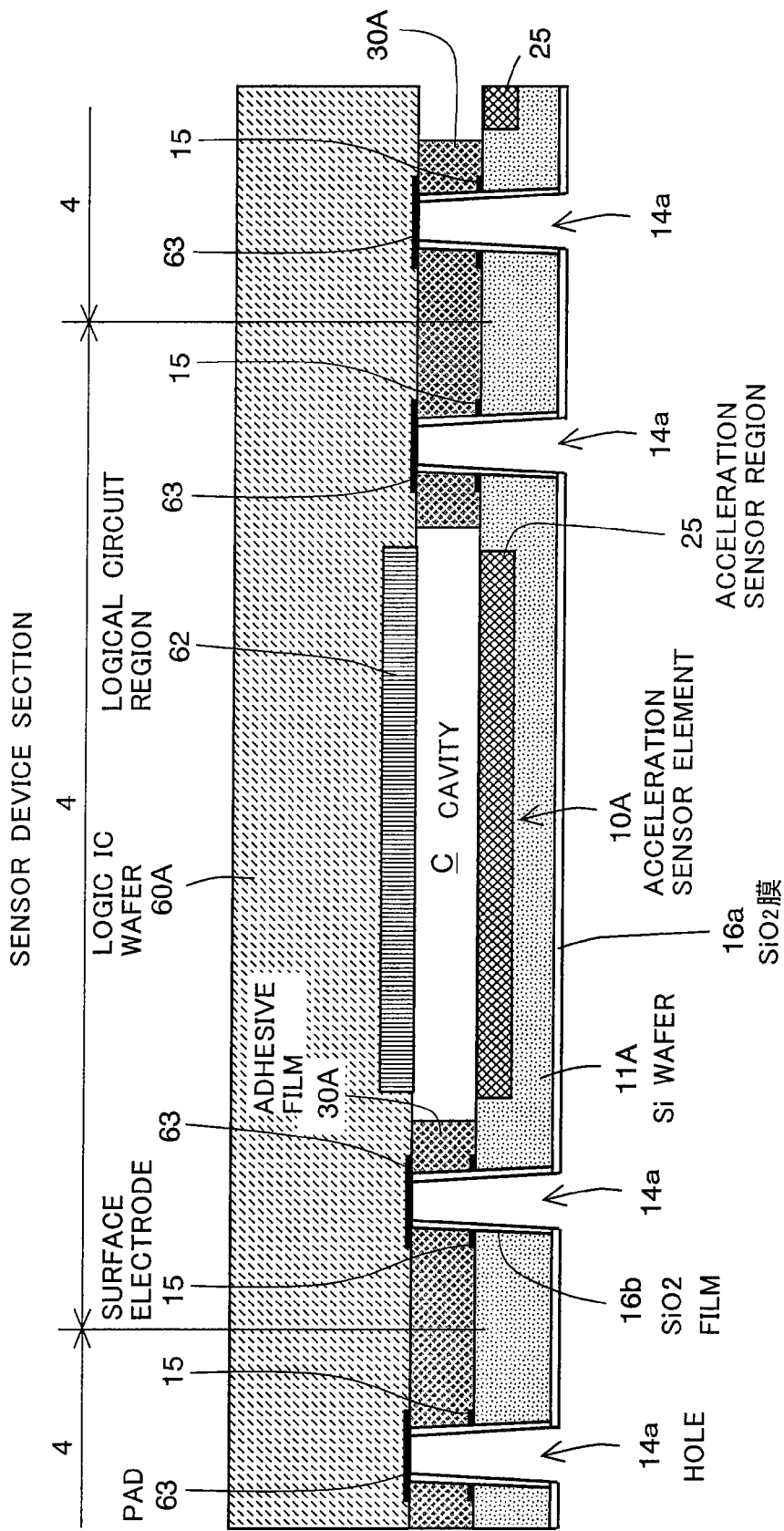
FIG. 32 is a partial cross-sectional view showing the process step of the method of fabricating the semiconductor device (acceleration sensor device) according to the fifth embodiment of the present invention, which is subsequent to the step of FIG. 31.

After the mask used for the formation of the holes 14 is removed, the silicon wafer 11A is thermally oxidized, thereby forming the SiO$_2$ films 16a and 16b on the exposed areas of the wafer 11A, as shown in FIG. 32. The SiO$_2$ film 16a covers the whole back of the wafer 11A except for the opening mouths of the holes 14 and 14a. The SiO$_2$ film 16b covers the whole inner walls of the holes 14 and 14a. Since no SiO$_2$ film exists on the back of each pad 63 corresponding to the hole 14a, the back of each pad 63 is exposed to the inside of the corresponding hole 14a. Since no SiO$_2$ film exists on the back of each surface electrode 15 corresponding to the hole 14 also, the back of each electrode 15 is exposed to the inside of the corresponding hole 14. The adhesive film 30A is not exposed to the insides of the respective holes 14 and 14a. To form the SiO$_2$ films 16a and 16b, any other method than thermal oxidation (e.g., CVD method) may be used. Any other insulating film (e.g., Si$_3$N$_4$ film) may be used instead of the SiO$_2$ film.

Figure 33:
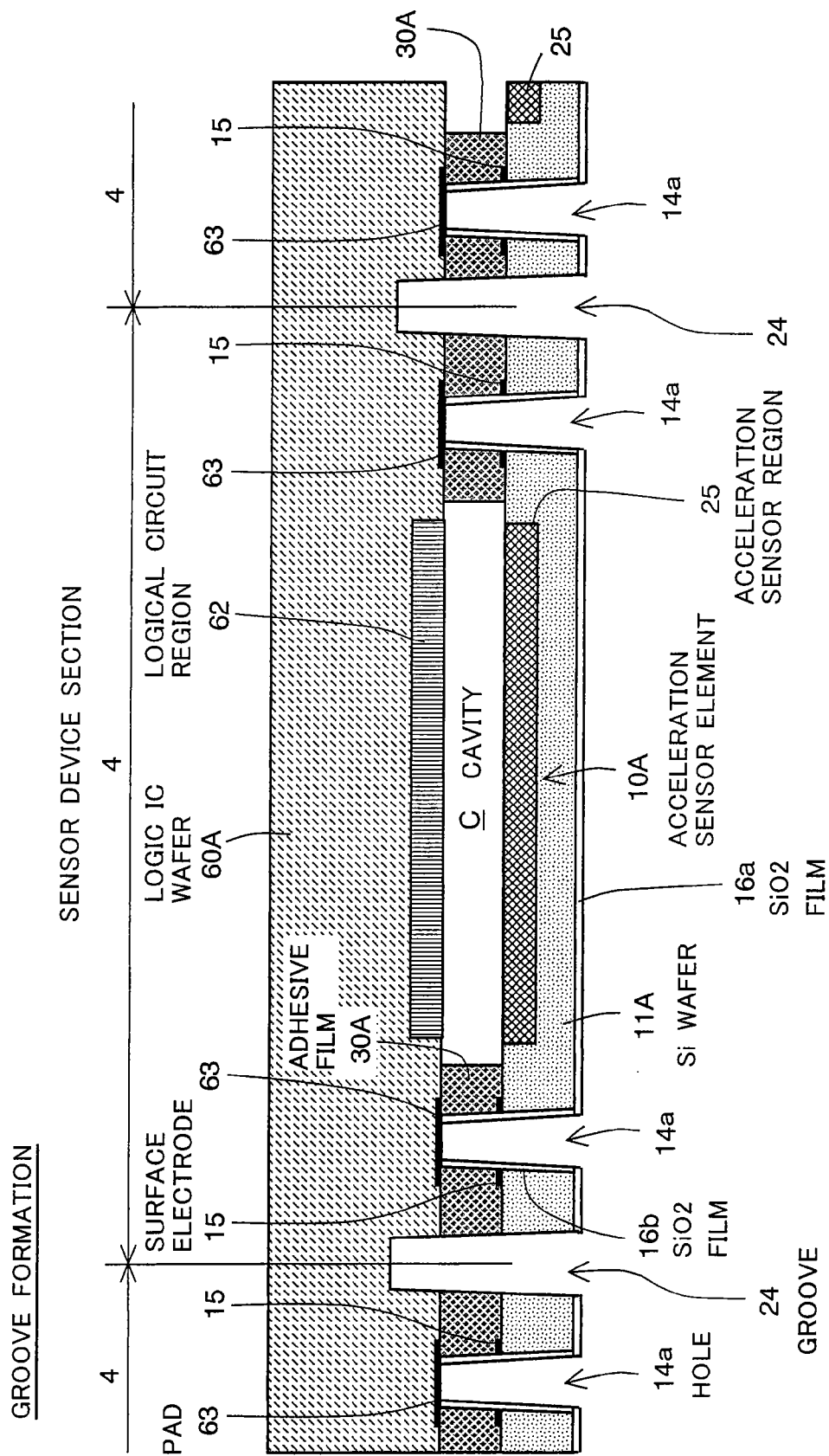
FIG. 33 is a partial cross-sectional view showing the process step of the method of fabricating the semiconductor device (acceleration sensor device) according to the fifth embodiment of the present invention, which is subsequent to the step of FIG. 32.

Following this, a patterned resist film (not shown) is formed on the back of the silicon wafer 11A where the penetrating holes 14 and 14a have been formed. Then, using the resist film as a mask, the wafer 11A is selectively etched from the back thereof, thereby forming the grooves 24, as shown in FIG. 33. The groves 24, each of which is located at the boundary between the two adjoining sensor device sections 4, have the same grid-shaped pattern as the scribe lines 53. Therefore, the grooves 24 are not overlapped with the holes 14 and 14a. The grooves 24 penetrate through the wafer 11A and the adhesive film 30A, reaching the inside of the logic IC wafer 60A. This step may be performed by any etching method, such as the RIE or ICE method, similar to the above-described step of forming the penetrating holes 14 and 14a. However, any other method than etching such as laser beam machining or anodic oxidation may be used for this purpose.

Figure 34:
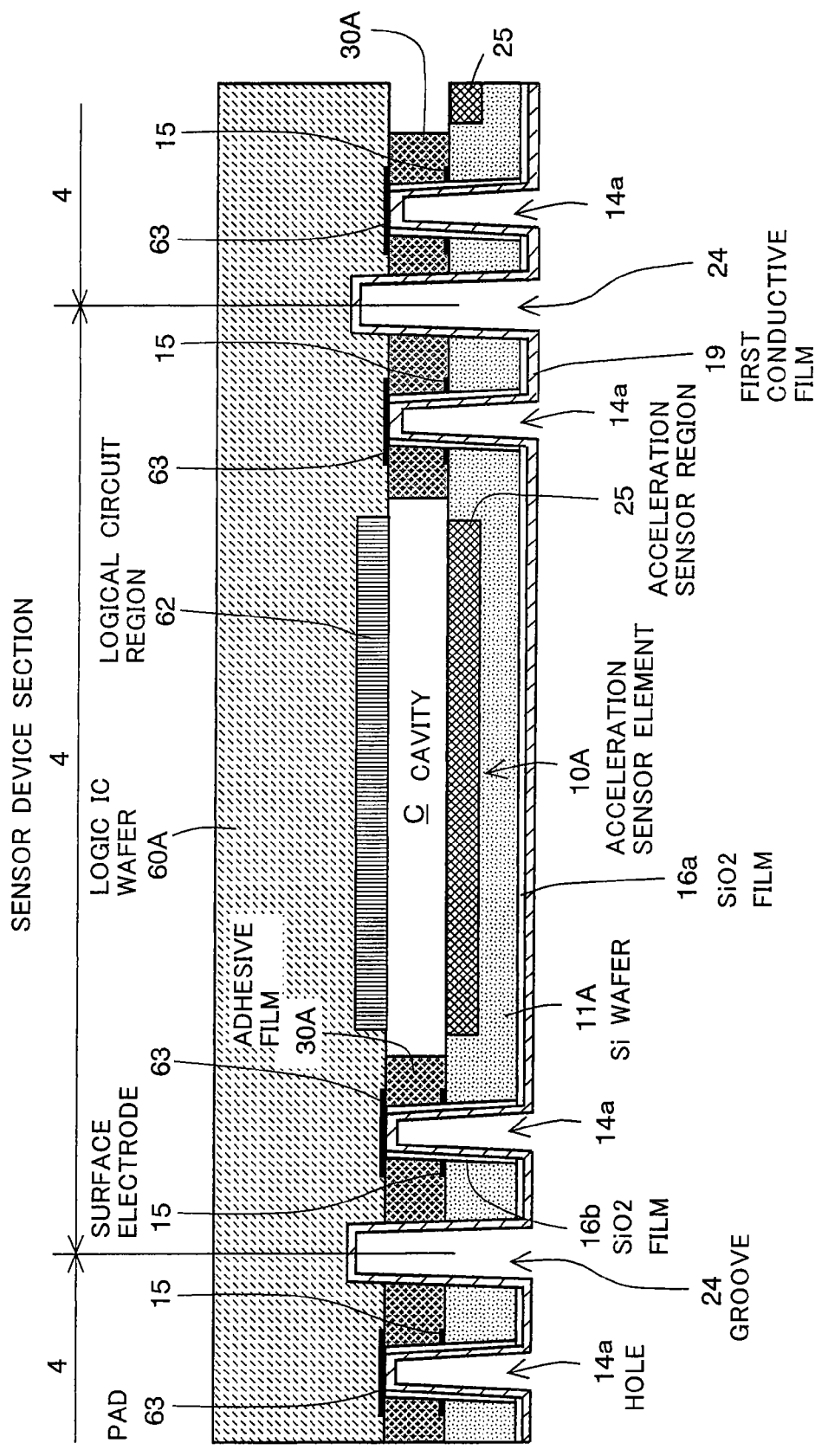
FIG. 34 is a partial cross-sectional view showing the process step of the method of fabricating the semiconductor device (acceleration sensor device) according to the fifth embodiment of the present invention, which is subsequent to the step of FIG. 33.

Next, the first conductive film 19 is formed on the $SiO_2$ films 16a and 16b by the sputtering method, as shown in FIG. 34. The first conductive film 19 is present not only on the whole back of the wafer 11A but also on all the inner walls of the holes 14 and 14a, all the inner walls of the grooves 24, all the exposed backs of the pads 63, and all the exposed backs of the surface electrodes 15. Since the first conductive film 19 is in contact with the pads 63 and the surface electrodes 15, the first conductive film 19 is electrically connected to the pads 63 and at the same time, it is electrically connected to the surface electrodes 15. The first conductive film 19 may be easily realized by forming an appropriate conductive film on the $SiO_2$ films 16a and 16b by the sputtering method from the back of the wafer 11A.

Here, as the first conductive film 19, a Ti—Cu two-layer film formed by the stack of a Ti subfilm and a Cu subfilm is used like the first embodiment. The first conductive film 19 having such the structure can be realized easily as follows in the same manner as the first embodiment. Specifically, a Ti subfilm is formed on the $SiO_2$ films 16a and 16b by sputtering as the barrier material and thereafter, a Cu subfilm is formed on the Ti subfilm by sputtering as the conductive material. However, any other structure may be used for the first conductive film 19 like the first embodiment. Any plating method or the like may be used instead of the sputtering method.

Figure 35:
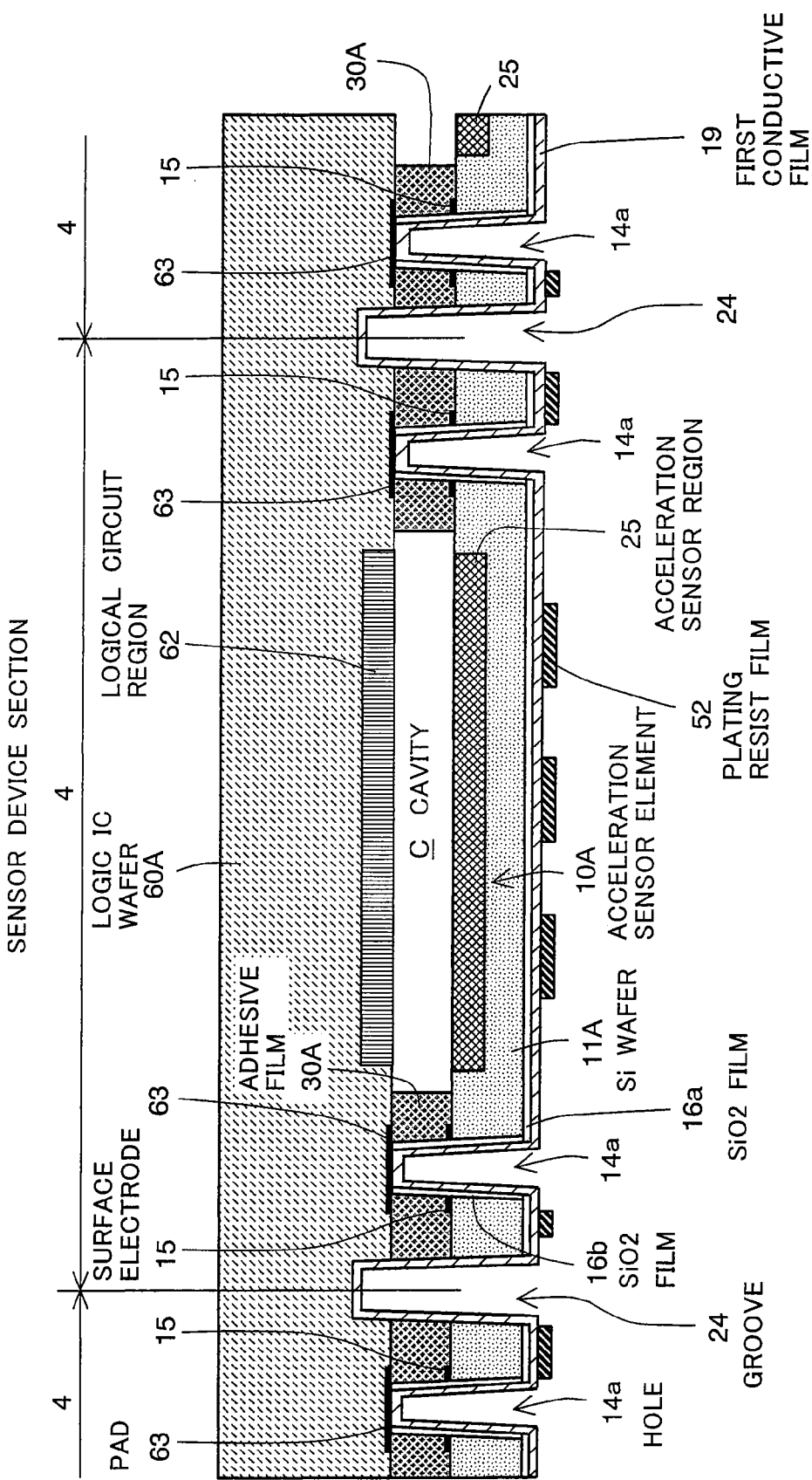
FIG. 35 is a partial cross-sectional view showing the process step of the method of fabricating the semiconductor device (acceleration sensor device) according to the fifth embodiment of the present invention, which is subsequent to the step of FIG. 34.

Subsequently, a resist film 52 for plating is formed on the first conductive film 19 and then, is patterned to have a plan shape for desired wiring lines. As shown in FIG. 35, the resist film 52 exists on only the back of the wafer 11A; the resist film 52 does not exist in the holes 14 and 14a and the grooves 24. This is to ensure the formation of the second conductive film 20 on the first conductive film 19 even in the holes 14 and 14a and the grooves 24.

Figure 36:
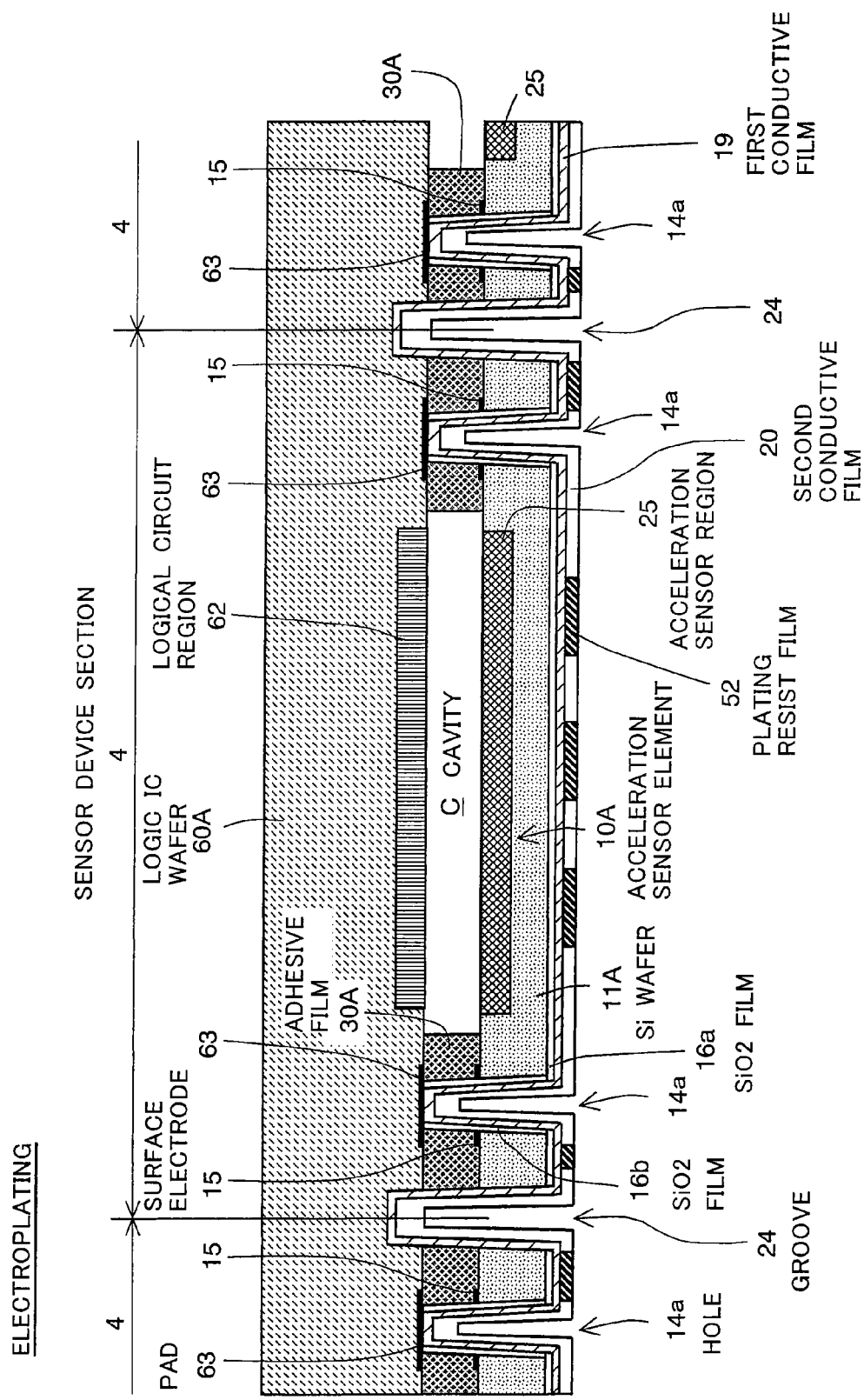
FIG. 36 is a partial cross-sectional view showing the process step of the method of fabricating the semiconductor device (acceleration sensor device) according to the fifth embodiment of the present invention, which is subsequent to the step of FIG. 35.
Figure 37:
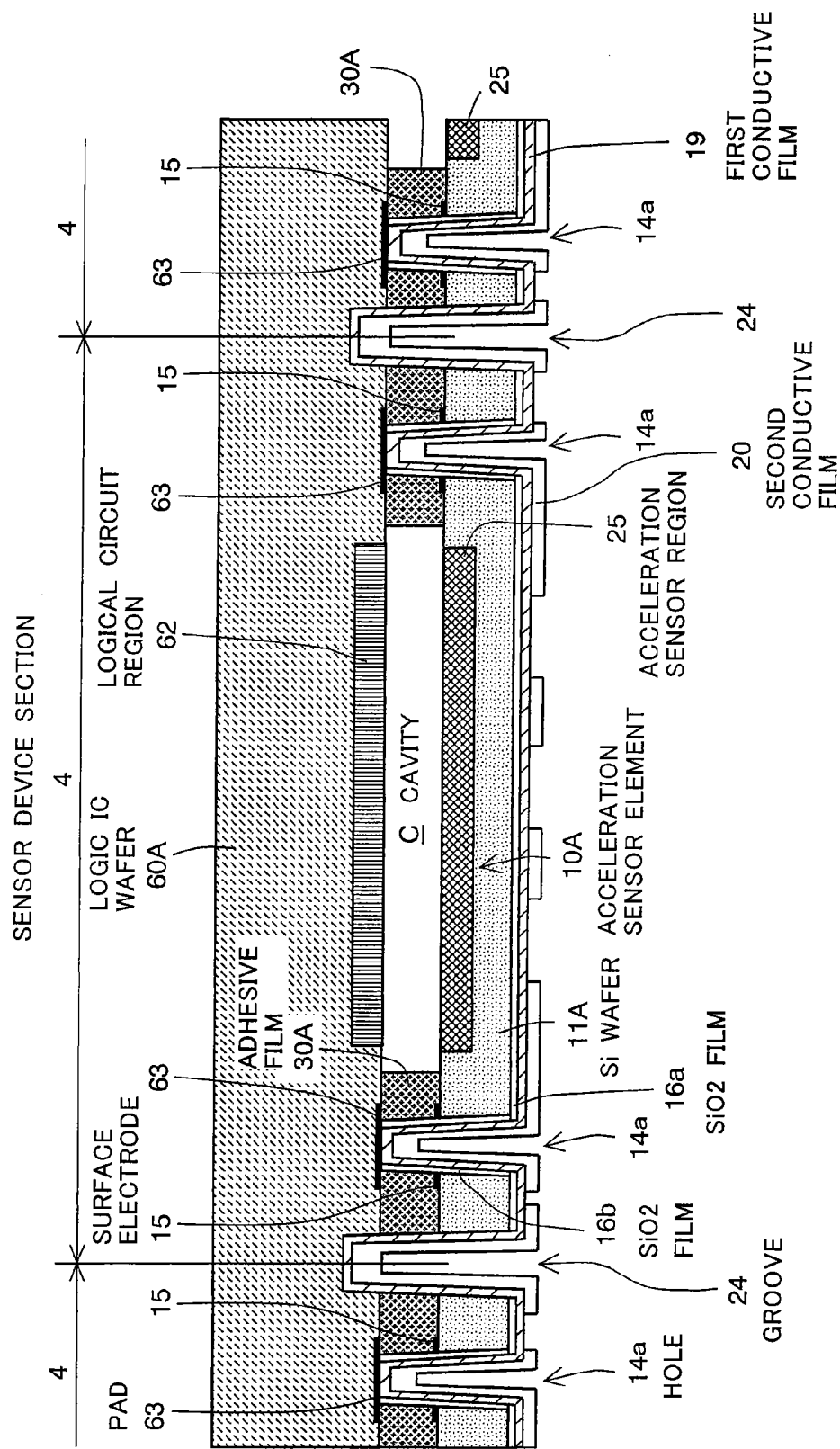
FIG. 37 is a partial cross-sectional view showing the process step of the method of fabricating the semiconductor device (acceleration sensor device) according to the fifth embodiment of the present invention, which is subsequent to the step of FIG. 36.

Using the patterned resist film 52 as a mask, the second conductive film 20 is selectively formed on the first conductive film 19, as shown in FIG. 36. Since the second conductive film 20 is formed on the areas where the resist film 52 does not exist, the second conductive film 20 is present not only on the back of the wafer 11A but also in the holes 14 and 14a and the grooves 24. The thickness of the second conductive film 20 is approximately the same as that of the resist film 52. This step can be preferably performed by, for example, the electroplating method of Cu using the Cu subfilm included in the first conductive film 19 as a seed metal. In this case, the second conductive film 20 is the Cu film thus formed by plating. Thereafter, the resist film 52 is removed and as a result, the structure shown in FIG. 37 is formed. Instead of the electroplating method, the electroless plating method may be used.

Since the second conductive film 20 is formed to cover or remedy the thickness deficiency of the first conductive film (here, the Ti—Cu two-layer film) 19, the second conductive film 20 is not limited to a Cu film. Any other metal film with a desired conductivity than the Cu film may be used as the second conductive film 20.

Figure 38:
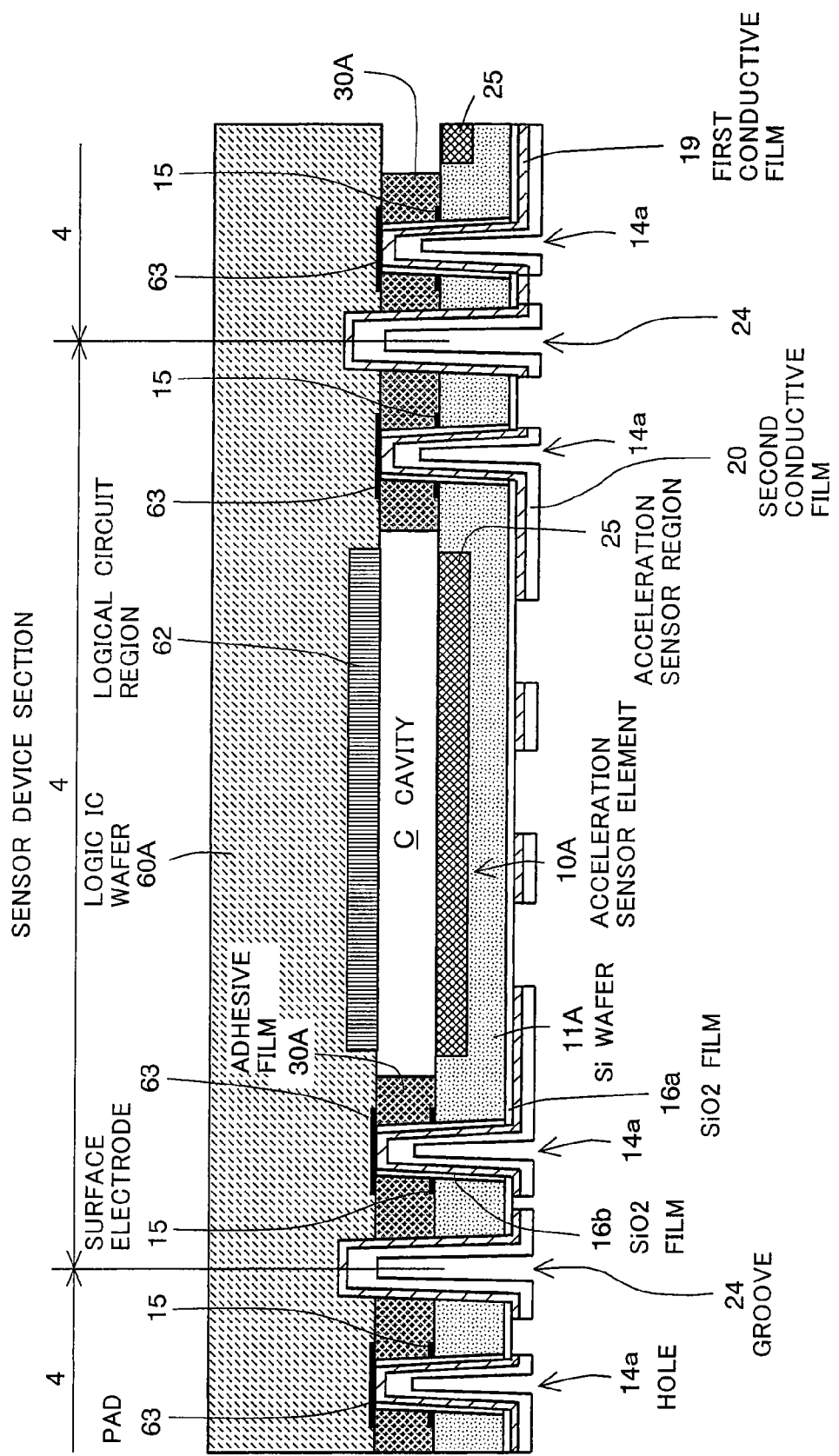
FIG. 38 is a partial cross-sectional view showing the process step of the method of fabricating the semiconductor device (acceleration sensor device) according to the fifth embodiment of the present invention, which is subsequent to the step of FIG. 37.

Next, the first conductive film 19 (here, the Ti—Cu two-layer film) is selectively removed by etching using the second conductive film 20 as a mask. As a result, the exposed parts of the first conductive film 19 from the second conductive film 20 are removed, thereby exposing the $SiO_2$ film 16a. At this time, as shown in FIG. 38, the first conductive film 19 has the same shape (pattern) as the second conductive film (here, the Cu film) 20. In this way, the wiring lines are formed on the back of the wafer 11A by the stack of the patterned first and second conductive films 19 and 20. In this state, all the inner walls of the penetrating holes 14 and 14a and the grooves 24 are covered with the stack of the patterned first and second conductive films 19 and 20.

Figure 39:
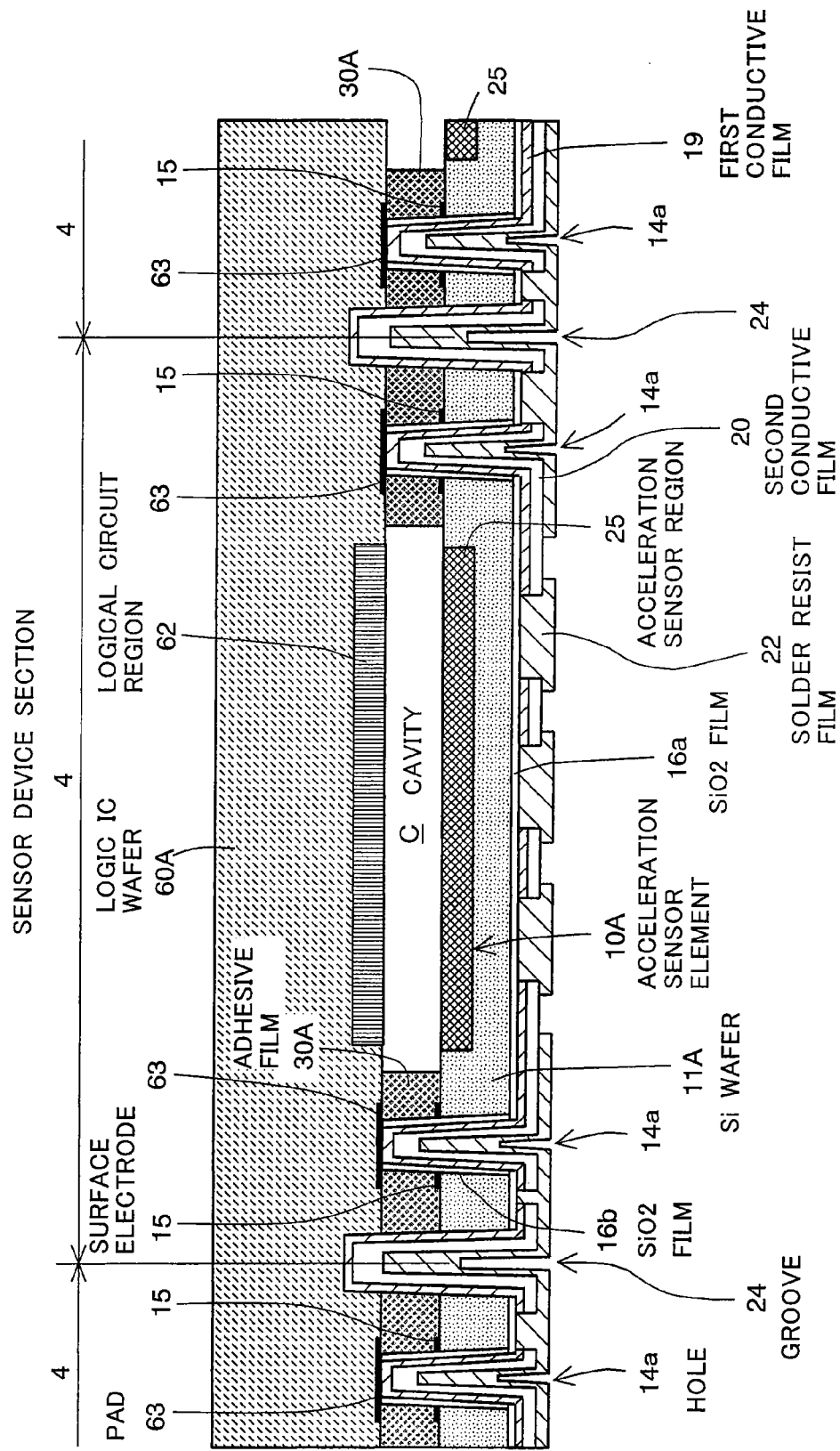
FIG. 39 is a partial cross-sectional view showing the process step of the method of fabricating the semiconductor device (acceleration sensor device) according to the fifth embodiment of the present invention, which is subsequent to the step of FIG. 38.

Thereafter, the insulative solder resist film 22 is formed on the back side of the wafer 11A by the coating method, thereby covering the remaining stacked structure of the first and second conductive films 19 and 20 (i.e., the wiring lines) and the exposed parts of the $SiO_2$ film 16a with the solder resist film 22. Moreover, the solder resist film 22 is patterned by the known photolithography using an appropriate mask, thereby forming openings only at the positions where the solder bumps 23 are to be formed, as shown in FIG. 39. The remaining second conductive film 20 is exposed through the openings thus formed. At this time, the back of the wafer 11A is covered with the solder resist film 22 except for the positions where the solder bumps 23 are to be formed. Even in the holes 14 and 14a and the grooves 24, the second conductive film 20 is covered with the solder resist film 22.

Figure 40:
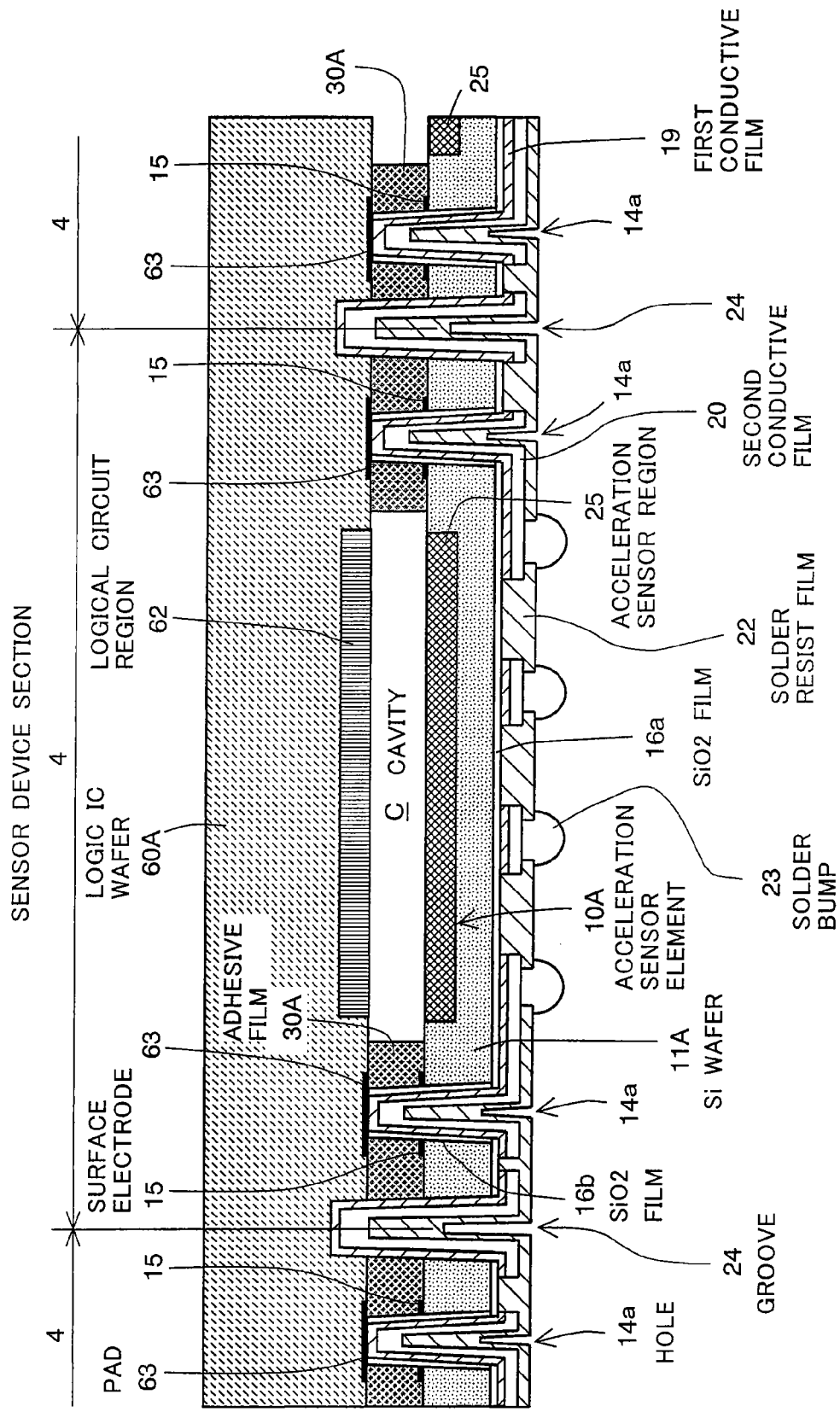
FIG. 40 is a partial cross-sectional view showing the process step of the method of fabricating the semiconductor device (acceleration sensor device) according to the fifth embodiment of the present invention, which is subsequent to the step of FIG. 39.
Figure 41:
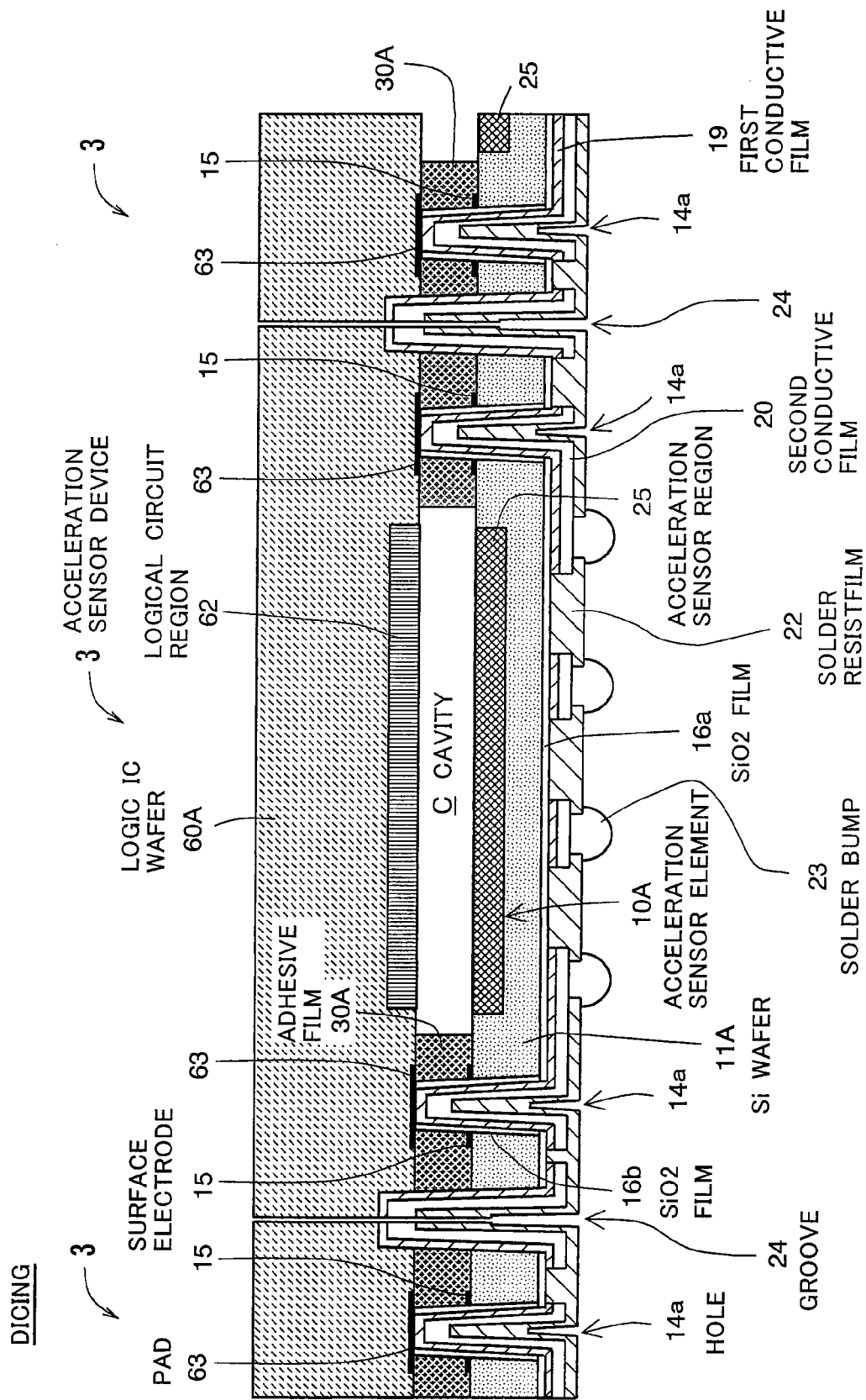
FIG. 41 is a partial cross-sectional view showing the process step of the method of fabricating the semiconductor device (acceleration sensor device) according to the fifth embodiment of the present invention, which is subsequent to the step of FIG. 40.

Subsequently, the back side of the structure of FIG. 39 (i.e., the back side of the wafer 11A) is dipped into a melted solder by heating (i.e., a molten solder) and then, it is lifted therefrom after a predetermined time passes. At this time, the molten solder is selectively attached to the exposed positions of the back of the wafer 11A from the solder resist film 22. Then, the wafer 11A is cooled to room temperature and as a result, the molten solder attached to the said positions hardens in the form of bumps. In this way, the solder bumps 23 are formed at the said positions. The state at this stage is shown in FIG. 40. Through these process steps described here, a plurality of the sensor device sections 4 having the structure of FIG. 1 are completed on the wafer 11A.

When the sensor device sections 4 are completed on the wafer 11A in this way, dicing is applied to the wafer 11A along the scribe lines 53 (see FIG. 17) using an appropriate dicing blade. The grid-shaped or checkered scribe lines 53 are located at the positions superposed on the grid-shaped grooves 24, in other words, each scribe line 53 is formed to extend along the corresponding groove 24. At this time, a known dicing tape (not shown) is adhered to the back of the wafer 11A or the surface of the logic IC wafer 60A in order that the sensor device sections 4 may not be dispersed after their separation. By repeating the dicing operation predetermined times, the logic IC wafer 60A, the adhesive film 30A, and the silicon wafer 11A (in which the sensor device sections 4 have been formed) are cut into chips-shaped parts along the scribe lines 53. As a result, the sensor device sections 4 formed on the wafer 11A are separated from each other.

Through the series of the above-described process steps, a plurality of the acceleration sensor devices 3 with the structure of FIGS. 26 and 27 according to the fifth embodiment are fabricated in a lump. If all the side faces of each acceleration sensor device 3 need not be covered with the insulative synthetic resin (not shown) that constitutes the part of the CSP, the fabrication process sequence is finished. If all the side faces of each acceleration sensor device 3 need to be covered with the said insulative synthetic resin, the fabrication process sequence is finished after the step of covering the side faces of each device 3 with the said insulative synthetic resin is carried out. In this way, the acceleration sensor device 3 equipped with the CSP is obtained.

With the acceleration sensor device 3 according to the fifth embodiment of the present invention, as described above, the chip-shaped acceleration sensor element 10A, and the chip-shaped logic IC 60 as the functional member fixed on the surface side of the element 10A with the adhesive film 30 are provided. Moreover, the region including at least all the outer side faces of the element 10A, all the outer side faces of the adhesive film 30, the interface between the adhesive film 30 and the element 10A, and the interface between the adhesive film 30 and the IC 60 is covered with the metal film for moisture entry prevention, i.e., the stack of the patterned first conductive film 19 (here, the TiCu two layer film) and the patterned second conductive film 20 (here, the Cu film). The stack of the patterned first and second conductive films 19 and 20 are used as the wiring lines formed on the back 10Ab of the element 10A and the buried interconnection lines formed in the holes 14 and 14a also.

Therefore, the possibility that moisture existing in the air enters the cavity C by way of the adhesive film 30 itself or the interfaces between the adhesive film 30 and the members adjacent thereto (i.e., the acceleration sensor element 1A and the logic IC 60) is eliminated. This means that the performance or reliability degradation of the acceleration sensor device 3 due to the moisture thus entered can be suppressed.

Moreover, to realize the moisture entry prevention, it is sufficient for the acceleration sensor device 3 to include the metal film for moisture entry prevention that is formed in such a way as to cover the region including at least all the outer side faces of the acceleration sensor element 10A, all the outer side faces of the adhesive film 30, the interface between the adhesive film 30 and the element 10A, and the interface between the adhesive film 30 and the IC 60. Therefore, the structure of the device 3 is not complicated, in other words, this device 3 has a simple structure.

Regarding the fabrication process steps, first, the grooves 24 are formed in the silicon wafer 11A, on which the acceleration sensor elements 10A have been formed, from the back of the wafer 11A in such a way as to reach the inside of the logic IC 60 and to be superposed on the scribe lines 53. Thereafter, the Ti—Cu two-layer film as the first conductive film 19 and the Cu film as the second conductive film 20 are formed on the backs 10Ab of the elements 10A to extend the insides of the grooves 24 and the penetrating holes 14 and 14a, thereby forming the metal film for moisture entry prevention. For this reason, the acceleration sensor device 3 can be fabricated by simply changing the mask pattern (shape) for the first conductive film 19 (i.e., the Ti—Cu two-layer film) and the second conductive film 20 (i.e., the Cu film) for the wiring lines/electrodes. Accordingly, it is unnecessary to newly add the process step of forming the metal film for moisture entry prevention (i.e., the three layer film formed by the Ti—Cu two layer subfilm and the Cu subfilm) and to change the materials and processes used for fabricating a acceleration sensor device of this type.

As described above, in the acceleration sensor device 3 comprising the chip-shaped acceleration sensor element 10A and the chip-shaped logic IC 60 fixed thereto with the adhesive film 30, the performance or reliability degradation due to the moisture entered by way of the adhesive film 30 itself or the interfaces between the adhesive film 30 and the members adjacent thereto (i.e., the element 10A and the IC 60) can be suppressed with a simple structure. Moreover, the acceleration sensor device 3 can be fabricated in such a way that almost no process step is added to the conventional fabrication process steps of a semiconductor device of this type in the wafer level and almost no change is applied thereto.

Furthermore, with the above-described fabrication method of the acceleration sensor device 3 according to the fifth embodiment, a plurality of the devices 3 can be fabricated through the wafer-level fabrication process steps in a lump.

In addition, in the acceleration sensor device 3 according to the fifth embodiment, similar to the solid-state image pickup device 1A of the above-described second embodiment (see FIGS. 20 and 21), all the outer side faces of the chip-shaped acceleration sensor element 10A (in other words, the silicon substrate 11) may be covered with the $SiO_2$ film 16b, and the stack of the first and second conductive films 19 and 20, which is formed on the $SiO_2$ film 16b, may be electrically insulated from the silicon substrate 11.

Similar to the solid-state image pickup device 1B of the above-described third embodiment (see FIG. 24), the end (the upper end in FIG. 24) of the first conductive film 19 that covers all the side faces of the silicon substrate 11 of the acceleration sensor element 10A may be located on the inner surface of the logic IC 60 and does not enter the inside of the IC 60.

Although the acceleration sensor element 10A is used as the semiconductor element and the logic IC 60 is used as the functional member in the acceleration sensor device 3 of the fifth embodiment, the invention is not limited this. Any other element than the acceleration sensor element 10A may be used as the semiconductor element. An IC having any other function than the logic IC 60 may be used as the functional member if it can be combined with the function of the semiconductor element.

Sixth Embodiment

FIG. 42 shows the schematic structure of a semiconductor device according to the sixth embodiment of the invention. With the sixth embodiment, the semiconductor device is configured as an acceleration sensor device 3A, similar to the fifth embodiment.

As shown in FIG. 42, the acceleration sensor device 3A of the sixth embodiment has the same structure as the above-described acceleration sensor device 3 of the fifth embodiment except that (a) an adhesive film 30a that adheres the logic IC 60 to the acceleration sensor element 10A covers the whole surface 10Aa of the element 10A, and (b) the cavity C is not present between the element 10A and the IC 60. Therefore, the explanation for the same structural parts will be omitted here by attaching the same reference numerals as used in the fifth embodiment to the same elements.

The adhesive film 30a is formed to cover the whole surface of the acceleration sensor element 10A. Thus, the adhesive film 30a needs to be formed by using an adhesive with a small thermal expansion coefficient difference with respect to the element 10A and the IC 60.

In the step (see FIG. 29) of joining the logic IC wafer 60A to the silicon wafer 11A, the adhesive is coated to cover the whole surface of the wafer 11A and then, the wafer 60A is attached thereto. Thus, the acceleration sensor device 3A of the sixth embodiment can be easily fabricated in the same manner as the above-described fifth embodiment.

With the acceleration sensor devices 3A of the sixth embodiment, the same structure as the above-described acceleration sensor device 3 of the fifth embodiment is provided except that (a) the adhesive film 30a covers the whole surface 10Aa of the element 10A, and (b) the cavity C is not present between the element 10A and the IC 60. Therefore, it is apparent that the same advantages as those of the fifth embodiment are obtained.

Specifically, even if the cavity C is not present, there is a possibility that the moisture enters the inside of the acceleration sensor device 3A by way of the interface between the adhesive film 30a and the acceleration sensor element 10A and/or the interface between the adhesive film 30a and the logic IC 60, resulting in reliability degradation. With the acceleration sensor device 3A of the sixth embodiment, however, the region including at least all the outer side faces of the element 10A, all the outer side faces of the adhesive film 30a, the interface between the adhesive film 30a and the element 10A, and the interface between the adhesive film 30a and the IC 60 is covered with the stack of the first and second conductive films 19 and 20 (i.e., the metal film for moisture entry prevention). Accordingly, the reliability degradation of the acceleration sensor device 3A caused by the moisture existing in the air can be suppressed with a simple structure.

Moreover, the acceleration sensor device 3A can be fabricated in such a way that almost no process step is added to the conventional fabrication process steps of a semiconductor device of this type in the wafer level and almost no change is applied thereto.

In addition, with the acceleration sensor device 3A of the sixth embodiment, similar to the above-described image pickup devices 1A of the second embodiment (see FIGS. 20 and 21), all the outer side faces of the silicon substrate 11 of the element 10A may be covered with the $SiO_2$ film 16b, and the stack of the first and second conductive films 19 and 20 may be formed on the $SiO_2$ film 16b. Furthermore, similar to the above-described image pickup devices 1B of the third embodiment (see FIG. 24), the end of the first conductive film 19 may be located on the inner surface of the logic IC 60 in such a way as not to enter the inside of the IC 60.

Other Embodiments

Since the above-described first to sixth embodiments are embodied examples of the present invention, it is needless to say that the present invention is not limited to these embodiments. Any other modification is applicable to these embodiments.

For example, a solid-state image pickup device or an acceleration sensor device is used as the semiconductor device in the above-described embodiments. However, the present invention is not limited to these devices. The invention is applicable to any semiconductor device comprising a semiconductor element and a functional member fixed to the surface of the semiconductor element.

For example, the function of a logic IC may be given to the semiconductor element and the function of an acceleration sensor may be given to the functional member. Moreover, the function of a logic IC may be given to the semiconductor element and the function of a Surface Acoustic Wave (SAW) element may be given to the functional member, along with a hermetic sealed structure. In this way, a variety of semiconductor devices with desired functions can be realized by changing the combination of the function of the semiconductor element and the function of the functional member.

In addition, any other metal than those disclosed in this specification may be used as the metal film for moisture entry prevention, if it has the function of moisture entry prevention into the inside of the semiconductor device.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A semiconductor device comprising:
   a semiconductor element having an active region for realizing a predetermined function, the active region being formed on a surface of the semiconductor element;
   a functional member having a predetermined function, fixed on a surface side of the semiconductor element with an adhesive film; and
   a metal film covering a region including at least all outer side faces of the semiconductor element, all outer side faces of the adhesive film, an interface between the adhesive film and the semiconductor element, and an interface between the adhesive film and the functional member.

2. The semiconductor device according to claim 1, further comprising wiring lines or electrodes formed on a back side of the semiconductor element;
   wherein the wiring lines or electrodes are electrically connected to the active region of the semiconductor element by way of buried interconnection lines formed in penetrating holes that penetrate through the semiconductor element from its surface to its back; and
   the metal film is formed by utilizing a metal film used for forming the wiring lines or electrodes.

3. The semiconductor device according to claim 1, further comprising wiring lines or electrodes formed on a back side of the semiconductor element;
   wherein the functional member comprises an active region for realizing a predetermined function;
   the wiring lines or electrodes are electrically connected to the active region of the functional member by way of buried interconnection lines formed in penetrating holes that penetrate through the semiconductor element and the adhesive film; and
   the metal film is formed by utilizing a metal film used for forming the wiring lines or electrodes.

4. The semiconductor device according to claim 1, wherein the metal film is one selected from the group consisting of a copper (Cu) film, a titanium (Ti) film, a chromium (Cr) film, a tantalum (Ta) film, and a tungsten (W) film.

5. The semiconductor device according to claim 1, wherein the metal film is one selected from the group consisting of a two-layer film formed by a titanium (Ti) subfilm and a copper (Cu) subfilm, a two-layer film formed by a chromium (Cr) subfilm and a copper (Cu) subfilm, a two-layer film formed by a tantalum (Ta) subfilm and a copper (Cu) subfilm, and a two-layer film formed by a tungsten (W) subfilm and a copper (Cu) subfilm.

6. The semiconductor device according to claim 1, wherein the metal film is one selected from the group consisting of a three-layer film formed by a titanium (Ti) subfilm, a titanium nitride (TiN) subfilm, and a copper (Cu) subfilm; a three-layer film formed by a tantalum (Ta) subfilm, a tantalum nitride (TaN) subfilm, and a copper (Cu) subfilm; and a three-layer film formed by a tungsten (W) subfilm, a tungsten nitride (WN) subfilm, and a copper (Cu) subfilm.

7. The semiconductor device according to claim 1, wherein the metal film comprises an end portion that extends along the outer side faces of the semiconductor element and the outer side faces of the adhesive film; and
   the end portion reaches an inside of the functional member.

8. The semiconductor device according to claim 1, wherein the metal film comprises an end portion that extends along the outer side faces of the semiconductor element and the outer side faces of the adhesive film; and the end portion reaches a surface of the functional member located on a side of the semiconductor element but does not reach an inside of the functional member.

9. The semiconductor device according to claim 1, wherein the metal film is in contact with a semiconductor substrate of the semiconductor element on the outer surfaces thereof.

10. The semiconductor device according to claim 1, further comprising an insulating film that covers all the outer faces of the semiconductor element;

wherein the metal film is placed on the insulating film and is apart from a semiconductor substrate of the semiconductor element on the outer surfaces thereof.

11. The semiconductor device according to claim 1, further comprising a cavity surrounded by the adhesive film between the semiconductor element and the functional member.

12. The semiconductor device according to claim 1, wherein a gap between the semiconductor element and the functional member is filled with the adhesive film.

13. The semiconductor device according to claim 1, wherein the semiconductor element is a solid-state image pickup element; and the functional member is a transparent cover.

14. The semiconductor device according to claim 1, wherein the semiconductor element is an acceleration sensor element; and the functional member is a logic Integrated Circuit (IC).

15. A semiconductor device comprising:

a semiconductor element having an active region for realizing an image pickup function, the active region being formed on a surface of the semiconductor element;

a functional member having a function as a transparent cover, fixed on a surface side of the semiconductor element with an adhesive film;

wiring lines or electrodes formed on a back side of the semiconductor element;

buried interconnection lines making electrical interconnection between the wiring lines or electrodes and the active region of the semiconductor element, the buried interconnection lines being formed in penetrating holes that penetrate through the semiconductor element from its surface to its back; and a metal film covering a region including at least all outer side faces of the semiconductor element, all outer side faces of the adhesive film, an interface between the adhesive film and the semiconductor element, and an interface between the adhesive film and the functional member;

wherein the metal film is formed by utilizing a metal film used for forming the wiring lines or electrodes.

16. The semiconductor device according to claim 15, wherein the metal film is one selected from the group consisting of a copper (Cu) film, a titanium (Ti) film, a chromium (Cr) film, a tantalum (Ta) film, and a tungsten (W) film.

17. The semiconductor device according to claim 15, wherein the metal film is one selected from the group consisting of a two-layer film formed by a titanium (Ti) subfilm and a copper (Cu) subfilm, a two-layer film formed by a chromium (Cr) subfilm and a copper (Cu) subfilm, a two-layer film formed by a tantalum (Ta) subfilm and a copper (Cu) subfilm, and a two-layer film formed by a tungsten (W) subfilm and a copper (Cu) subfilm.

18. The semiconductor device according to claim 15, wherein the metal film is one selected from the group consisting of a three-layer film formed by a titanium (Ti) subfilm, a titanium nitride (TiN) subfilm, and a copper (Cu) subfilm; a three-layer film formed by a tantalum (Ta) subfilm, a tantalum nitride (TaN) subfilm, and a copper (Cu) subfilm; and a three-layer film formed by a tungsten (W) subfilm, a tungsten nitride (WN) subfilm, and a copper (Cu) subfilm.

19. The semiconductor device according to claim 15, wherein the metal film comprises an end portion that extends along the outer side faces of the semiconductor element and the outer side faces of the adhesive film; and the end portion reaches an inside of the functional member.

20. The semiconductor device according to claim 15, wherein the metal film comprises an end portion that extends along the outer side faces of the semiconductor element and the outer side faces of the adhesive film; and the end portion reaches a surface of the functional member located on a side of the semiconductor element and does not reach an inside of the functional member.

21. The semiconductor device according to claim 15, wherein the metal film is in contact with a semiconductor substrate of the semiconductor element.

22. The semiconductor device according to claim 15, further comprising an insulating film that covers all the outer faces of the semiconductor element;

wherein the metal film is placed on the insulating film to be apart from a semiconductor substrate of the semiconductor element.

23. The semiconductor device according to claim 15, further comprising a cavity surrounded by the adhesive film between the semiconductor element and the functional member.

24. The semiconductor device according to claim 15, wherein a gap between the semiconductor element and the functional member is filled with the adhesive film.

25. A semiconductor device comprising:

a semiconductor element having an active region for realizing a predetermined function on a surface of the semiconductor element;

a functional member having an active region for realizing a predetermined circuit function, fixed on a surface side of the semiconductor element with an adhesive film;

wiring lines or electrodes formed on a back side of the semiconductor element;

buried interconnection lines making electrical interconnection between the wiring lines or electrodes and the active region of the functional member, the interconnection lines being buried in penetrating holes that penetrate through the semiconductor element and the adhesive film; and a metal film covering a region including at least all outer side faces of the semiconductor element, all outer side faces of the adhesive film, an interface between the adhesive film and the semiconductor element, and an interface between the adhesive film and the functional member;

wherein the metal film is formed by utilizing a metal film used for forming the wiring lines or electrodes.

26. The semiconductor device according to claim 25, wherein the metal film is one selected from the group consisting of a copper (Cu) film, a titanium (Ti) film, a chromium (Cr) film, a tantalum (Ta) film, and a tungsten (W) film.

27. The semiconductor device according to claim 25, wherein the metal film is one selected from the group consisting of a two-layer film formed by a titanium (Ti) subfilm and a copper (Cu) subfilm, a two-layer film formed by a chromium (Cr) subfilm and a copper (Cu) subfilm, a two-layer film formed by a tantalum (Ta) subfilm and a copper (Cu) subfilm, and a two-layer film formed by a tungsten (W) subfilm and a copper (Cu) subfilm.

28. The semiconductor device according to claim 25, wherein the metal film is one selected from the group consisting of a three-layer film formed by a titanium (Ti) subfilm, a titanium nitride (TiN) subfilm, and a copper (Cu) subfilm; a three-layer film formed by a tantalum (Ta) subfilm, a tantalum nitride (TaN) subfilm, and a copper (Cu) subfilm; and a three-layer film formed by a tungsten (W) subfilm, a tungsten nitride (WN) subfilm, and a copper (Cu) subfilm.

29. The semiconductor device according to claim 25, wherein the metal film comprises an end portion that extends along the outer side faces of the semiconductor element and the outer side faces of the adhesive film; and the end portion reaches an inside of the functional member.

30. The semiconductor device according to claim 25, wherein the metal film comprises an end portion that extends along the outer side faces of the semiconductor element and the outer side faces of the adhesive film; and the end portion reaches a surface of the functional member located on a side of the semiconductor element and does not reach an inside of the functional member.

31. The semiconductor device according to claim 25, wherein the metal film is in contact with a semiconductor substrate of the semiconductor element.

32. The semiconductor device according to claim 25, further comprising an insulating film that covers all the outer faces of the semiconductor element;

wherein the metal film is placed on the insulating film to be apart from a semiconductor substrate of the semiconductor element.

33. The semiconductor device according to claim 25, further comprising a cavity surrounded by the adhesive film between the semiconductor element and the functional member.

34. The semiconductor device according to claim 25, wherein a gap between the semiconductor element and the functional member is filled with the adhesive film.

35. The semiconductor device according to claim 25, wherein the semiconductor element is an acceleration sensor element; and the functional member is a logic Integrated Circuit (IC).

* * * * *